United States Patent
Ito et al.

(10) Patent No.: US 12,142,626 B2
(45) Date of Patent: Nov. 12, 2024

(54) IMAGE SENSOR

(71) Applicant: SONY SEMICONDUCTOR SOLUTIONS CORPORATION, Kanagawa (JP)

(72) Inventors: Tomomi Ito, Kanagawa (JP); Kazuyoshi Yamashita, Kanagawa (JP); Atsushi Masagaki, Kanagawa (JP); Shinobu Asayama, Kanagawa (JP); Shinya Itoh, Kanagawa (JP); Haruyuki Nakagawa, Kanagawa (JP); Kyohei Mizuta, Kanagawa (JP); Susumu Ooki, Kanagawa (JP); Osamu Oka, Kanagawa (JP); Kazuto Kamimura, Kumamoto (JP); Takuji Matsumoto, Kumamoto (JP); Kenju Nishikido, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 443 days.

(21) Appl. No.: 17/432,313

(22) PCT Filed: Feb. 28, 2020

(86) PCT No.: PCT/JP2020/008559
§ 371 (c)(1),
(2) Date: Aug. 19, 2021

(87) PCT Pub. No.: WO2020/175712
PCT Pub. Date: Sep. 3, 2020

(65) Prior Publication Data
US 2022/0139992 A1 May 5, 2022

(30) Foreign Application Priority Data
Feb. 28, 2019 (JP) .................. 2019-036818

(51) Int. Cl.
| | | |
|---|---|---|
| H01L 27/146 | (2006.01) | |
| H01L 23/00 | (2006.01) | |
| H04N 25/63 | (2023.01) | |

(52) U.S. Cl.
CPC ........ H01L 27/14636 (2013.01); H01L 24/09 (2013.01); H01L 24/70 (2013.01);
(Continued)

(58) Field of Classification Search
CPC ........ H01L 24/04; H01L 24/06; H01L 24/07; H01L 24/09; H01L 24/65; H01L 24/67;
(Continued)

(56) References Cited

U.S. PATENT DOCUMENTS

| | | |
|---|---|---|
| 10,157,867 B1 | 12/2018 | Chen et al. |
| 2014/0145338 A1 | 5/2014 | Fujii et al. |

(Continued)

FOREIGN PATENT DOCUMENTS

| | | |
|---|---|---|
| EP | 2717300 | 4/2014 |
| JP | 2001267547 A | 9/2001 |

(Continued)

OTHER PUBLICATIONS

International Search Report and Written Opinion prepared by the European Patent Office on Apr. 29, 2020, for International Application No. PCT/JP2020/008559.

*Primary Examiner* — Cheung Lee
(74) *Attorney, Agent, or Firm* — Sheridan Ross PC

(57) ABSTRACT

There is provided an image sensor including a first substrate including a plurality of pixels and a plurality of vertical signal lines and a plurality of first wiring layers and a second substrate including a plurality of second wiring layers. The first and second substrates are secured together between the pluralities of first and second wiring layers. First pads are provided between one of the plurality of first wiring layers (Continued)

and one of the plurality of second wiring layers and second pads are provided between another of the plurality of first wiring layers and another of the plurality of second wiring layers. First vias and second vias connect the first pads and the one of the plurality of first wiring layers and the one of the plurality of second wiring layers together.

23 Claims, 45 Drawing Sheets

(52) U.S. Cl.
CPC .. *H01L 27/14601* (2013.01); *H01L 27/14634* (2013.01); *H01L 27/14643* (2013.01); *H04N 25/63* (2023.01)

(58) Field of Classification Search
CPC ... H01L 24/68; H01L 24/70; H01L 27/14601; H01L 27/14603; H01L 27/14609; H01L 27/14618; H01L 27/14634; H01L 27/14636; H01L 27/1464; H01L 27/14643; H01L 2224/09517; H04N 25/47; H04N 25/63; H04N 25/76; H04N 25/77
See application file for complete search history.

(56) References Cited

U.S. PATENT DOCUMENTS

| | | |
|---|---|---|
| 2014/0263959 A1 | 9/2014 | Hsu et al. |
| 2016/0233261 A1 | 8/2016 | Hsu et al. |
| 2018/0096915 A1 | 4/2018 | Fujii et al. |
| 2018/0233435 A1 | 8/2018 | Fujii et al. |

FOREIGN PATENT DOCUMENTS

| | | |
|---|---|---|
| JP | 2010278232 A | 12/2010 |
| JP | 2012094720 A | 5/2012 |
| JP | 2012104654 A | 5/2012 |
| JP | 2012-164870 | 8/2012 |
| JP | 2012244101 A | 12/2012 |
| JP | 2012256736 A | 12/2012 |
| JP | 2015126114 A | 7/2015 |
| JP | 2016146376 A | 8/2016 |
| JP | 2017120939 A | 7/2017 |
| JP | 2018073967 A | 5/2018 |
| JP | 2018129412 A | 8/2018 |
| KR | 20180037620 A | 4/2018 |
| TW | 201732974 A | 9/2017 |
| WO | WO-2017111792 A1 | 6/2017 |
| WO | WO-2018194030 A1 | 10/2018 |

[Fig. 1]
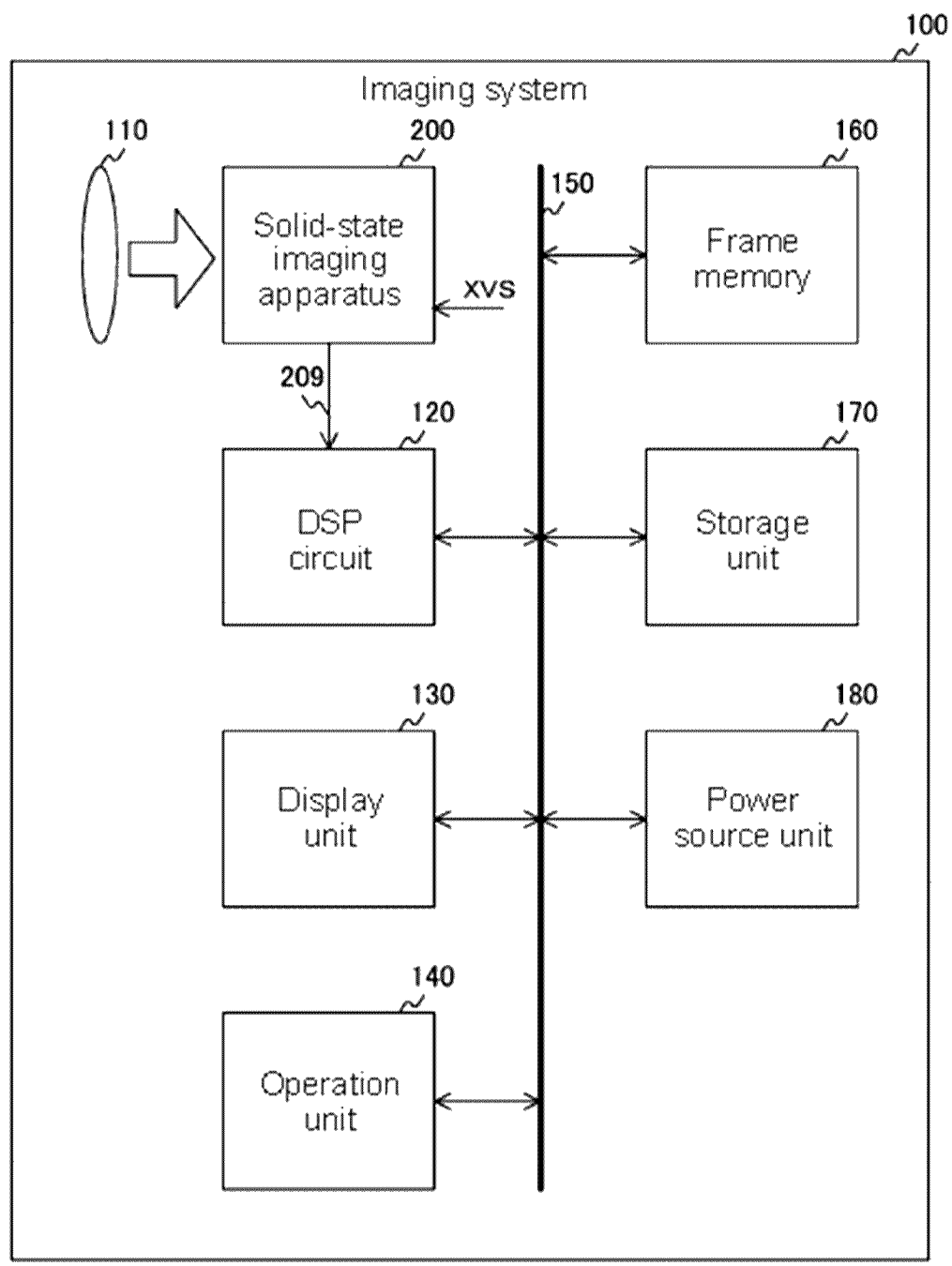

[Fig. 2]
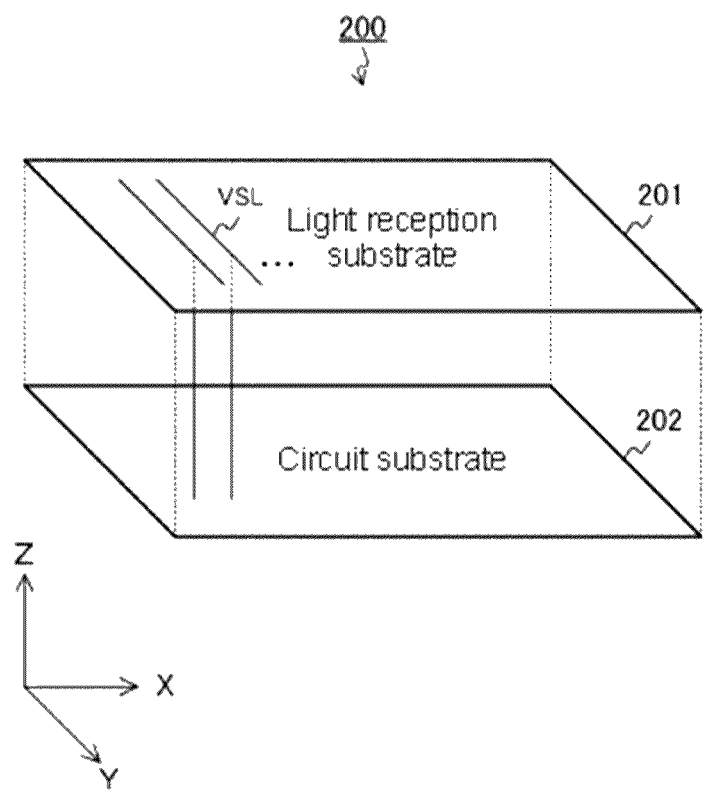

[Fig. 3]
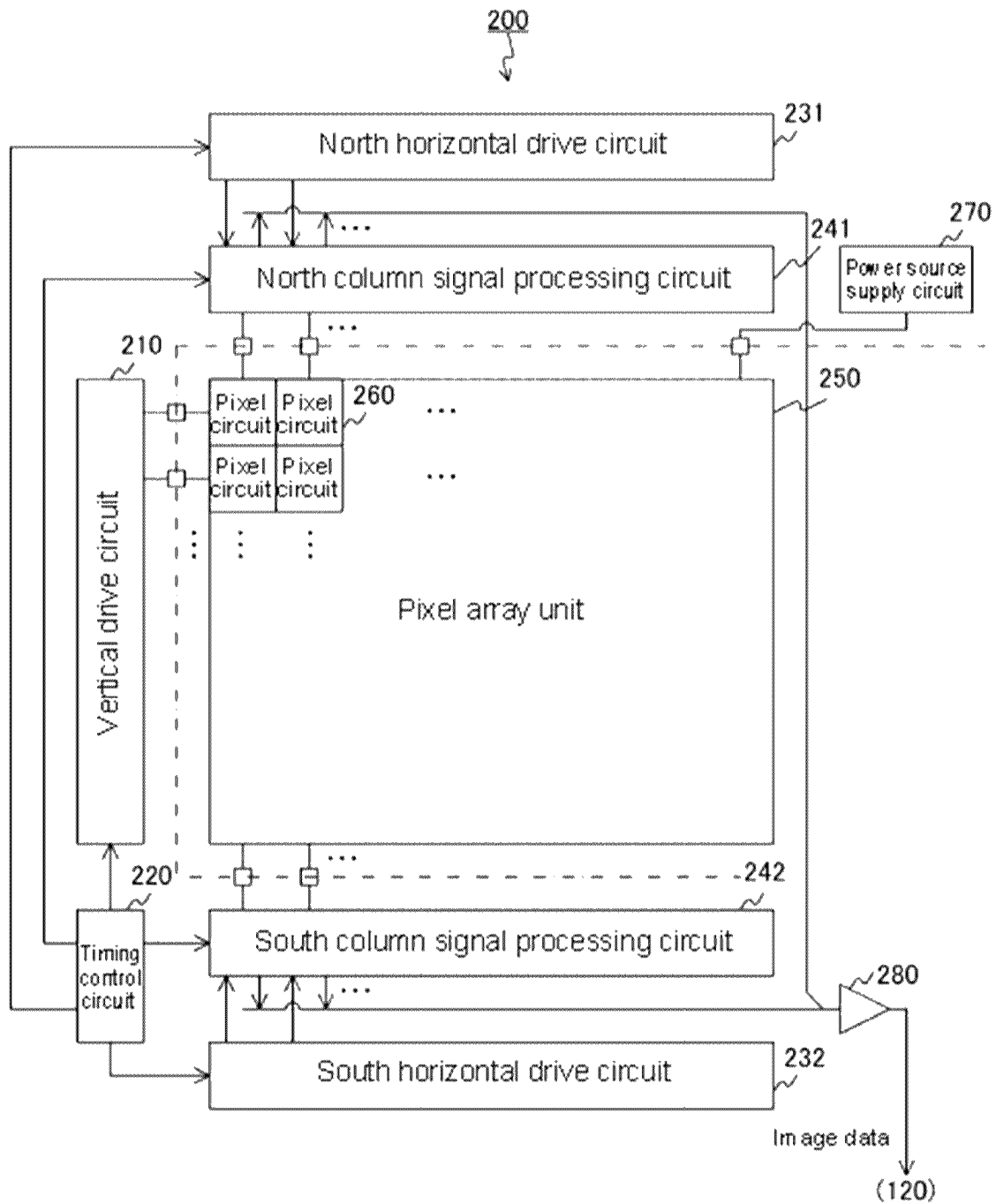

[Fig. 4]
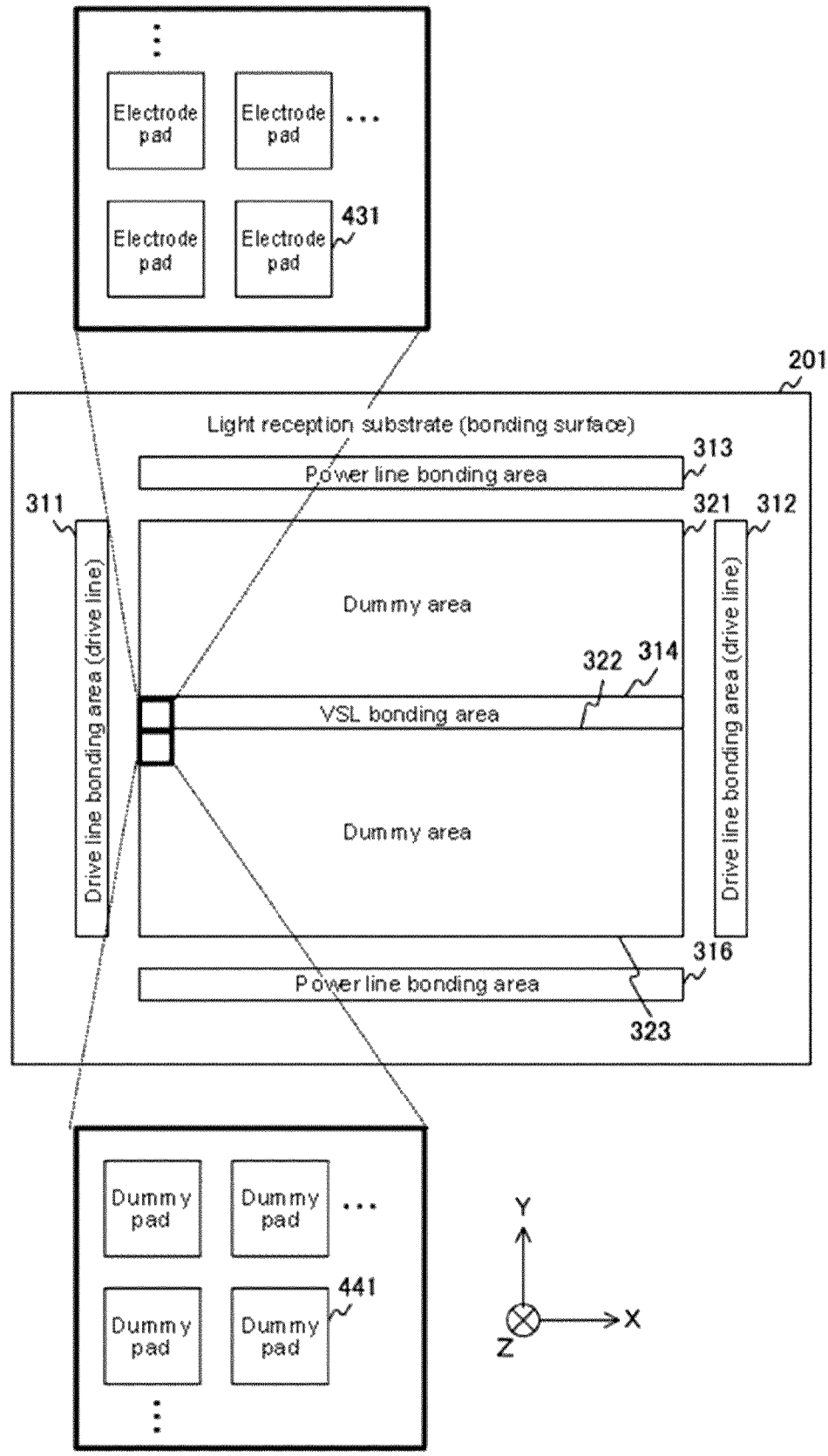

[Fig. 5]
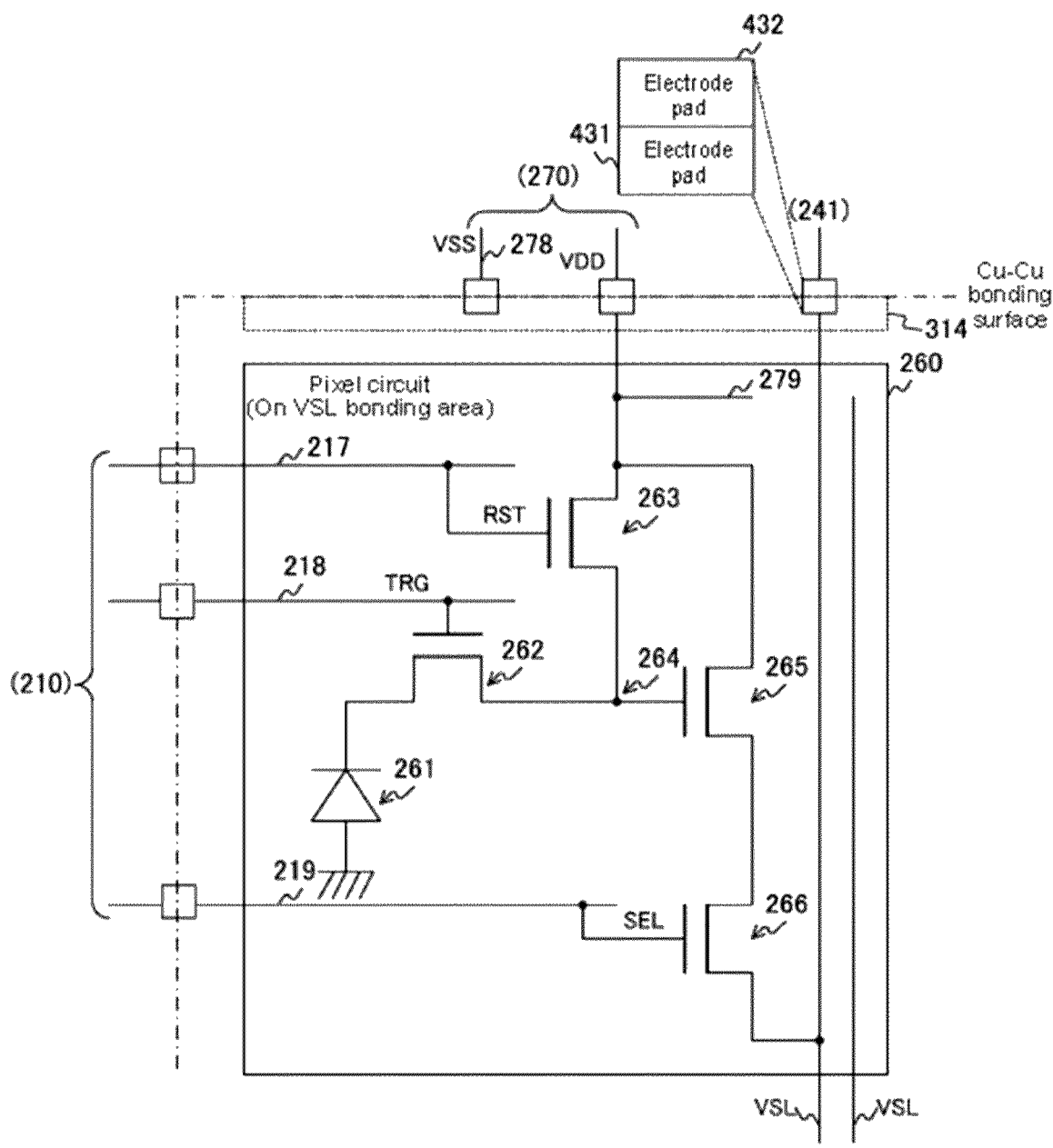

[Fig. 6]
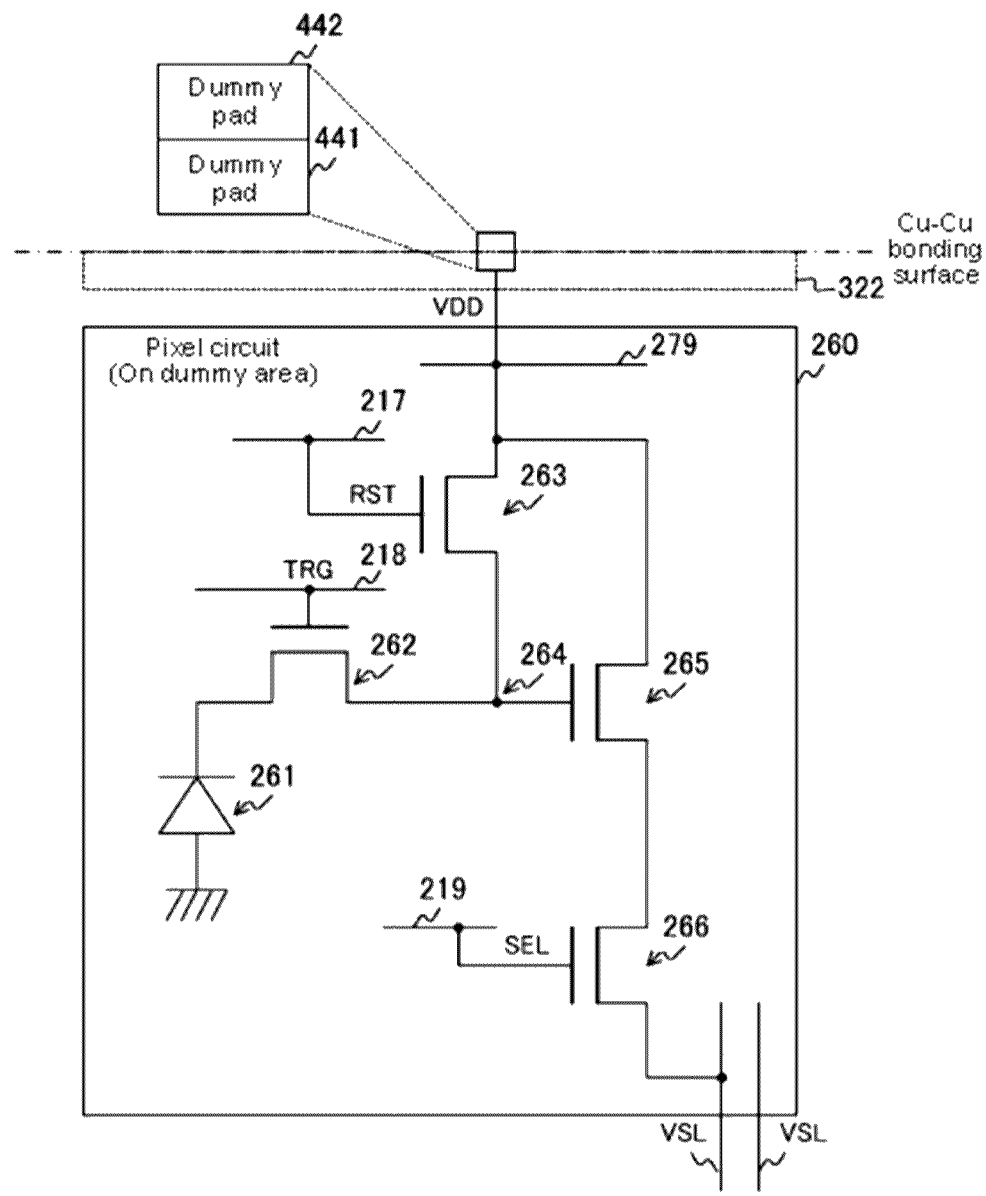

[Fig. 7]
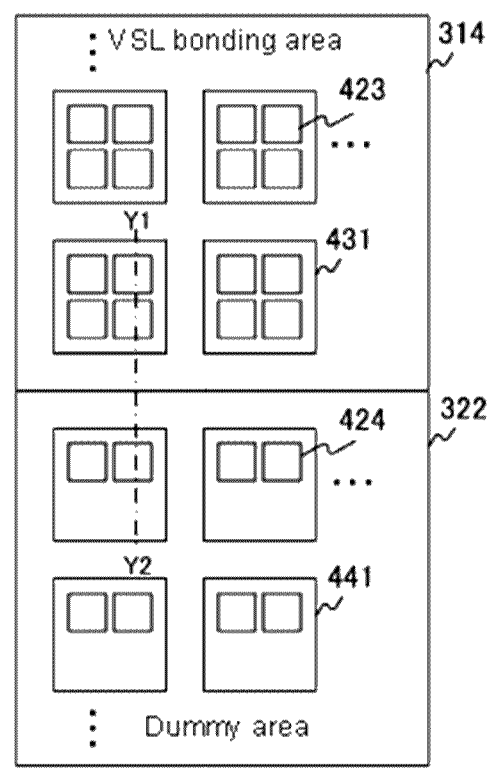
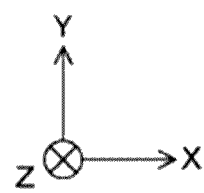

[Fig. 8]
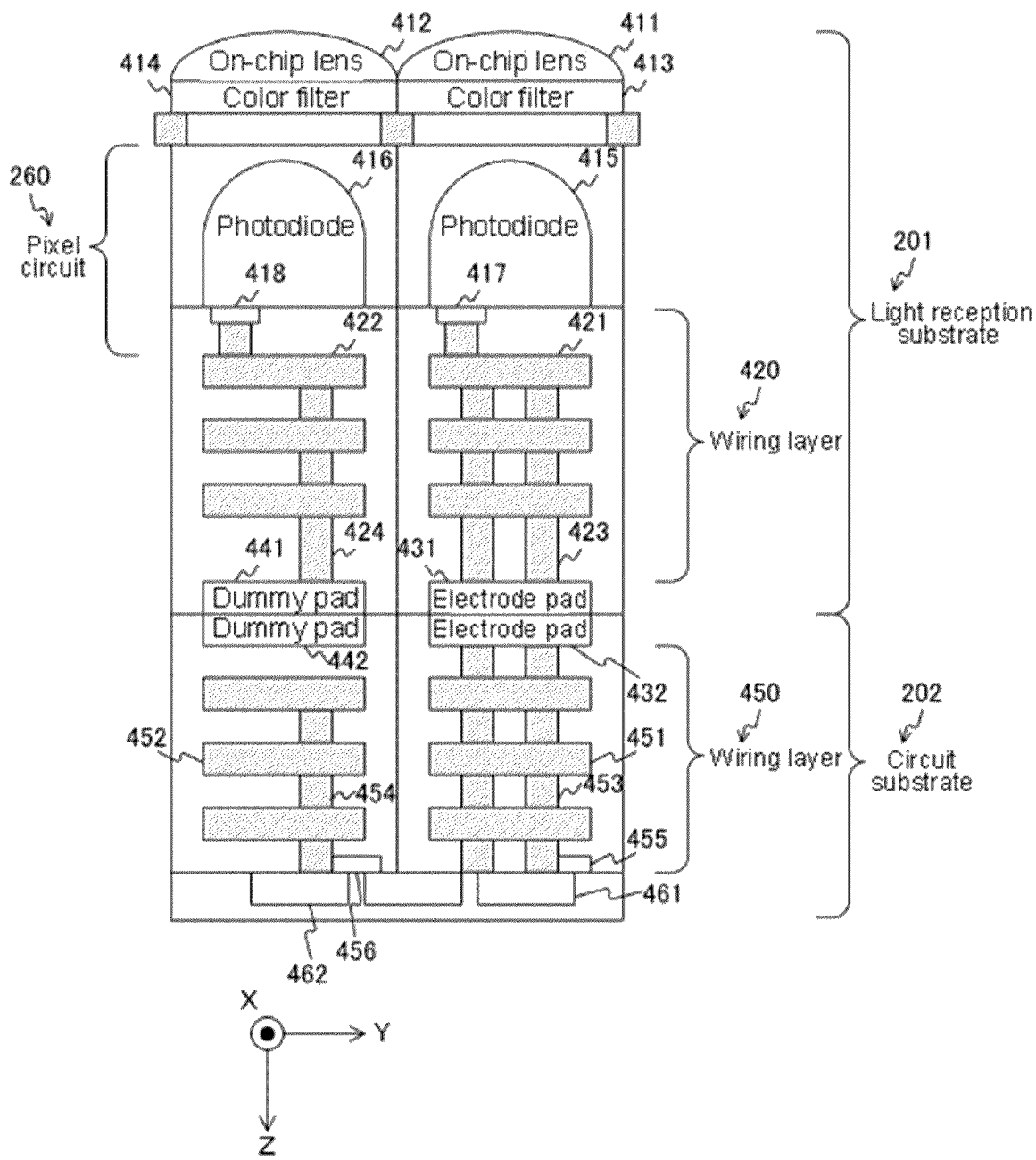

[Fig. 9]
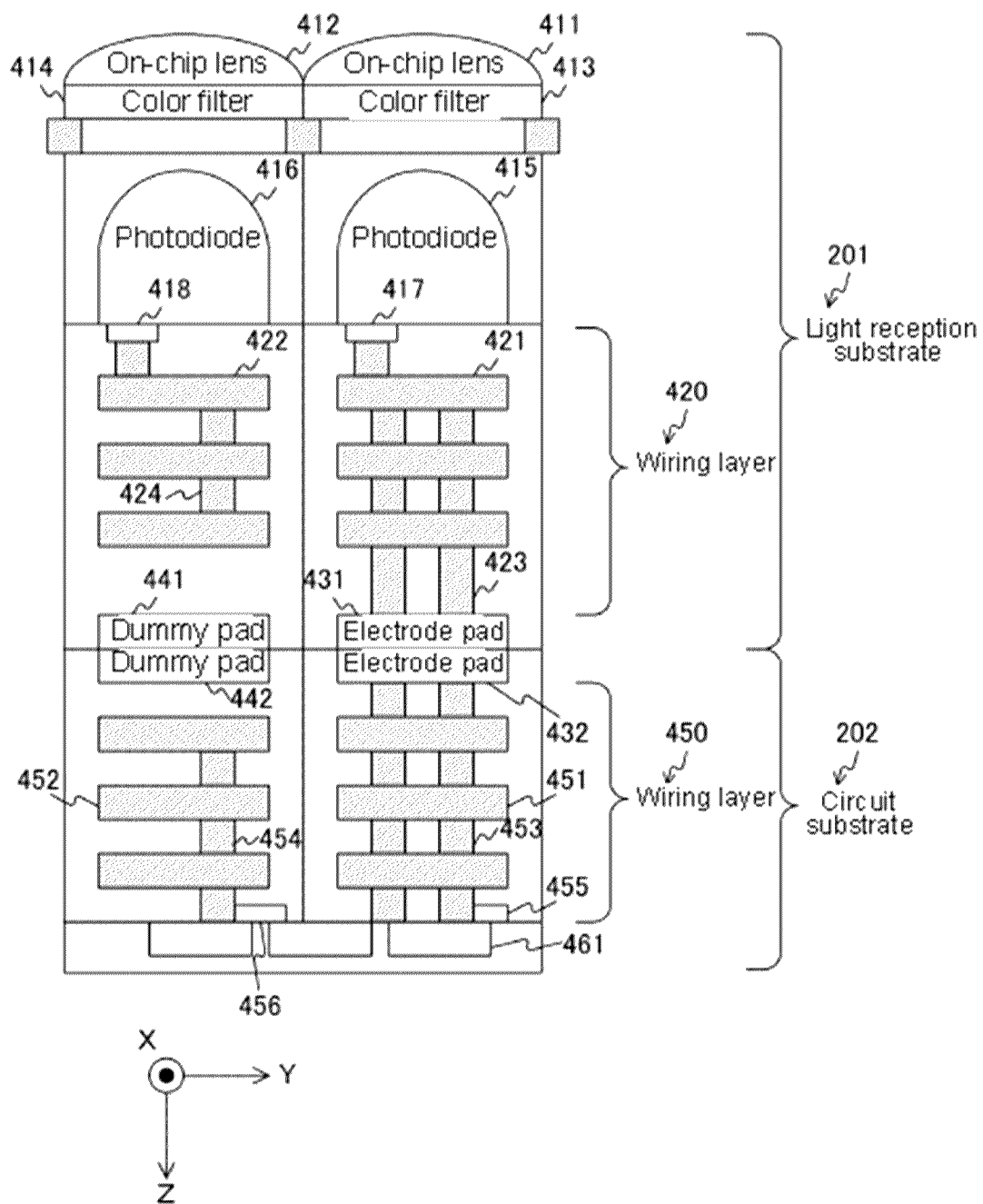

[Fig. 12]
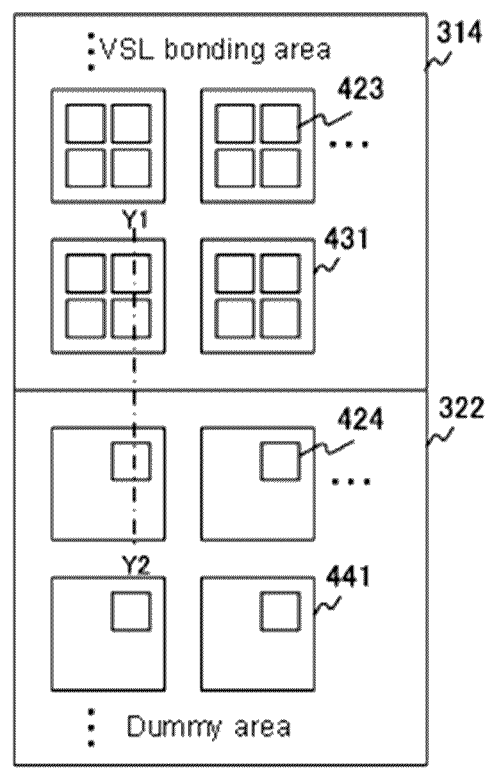

[Fig. 13]
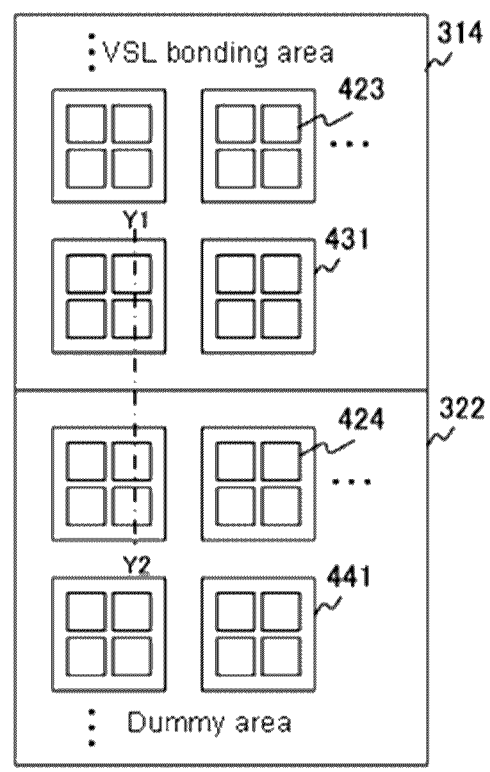

[Fig. 14]
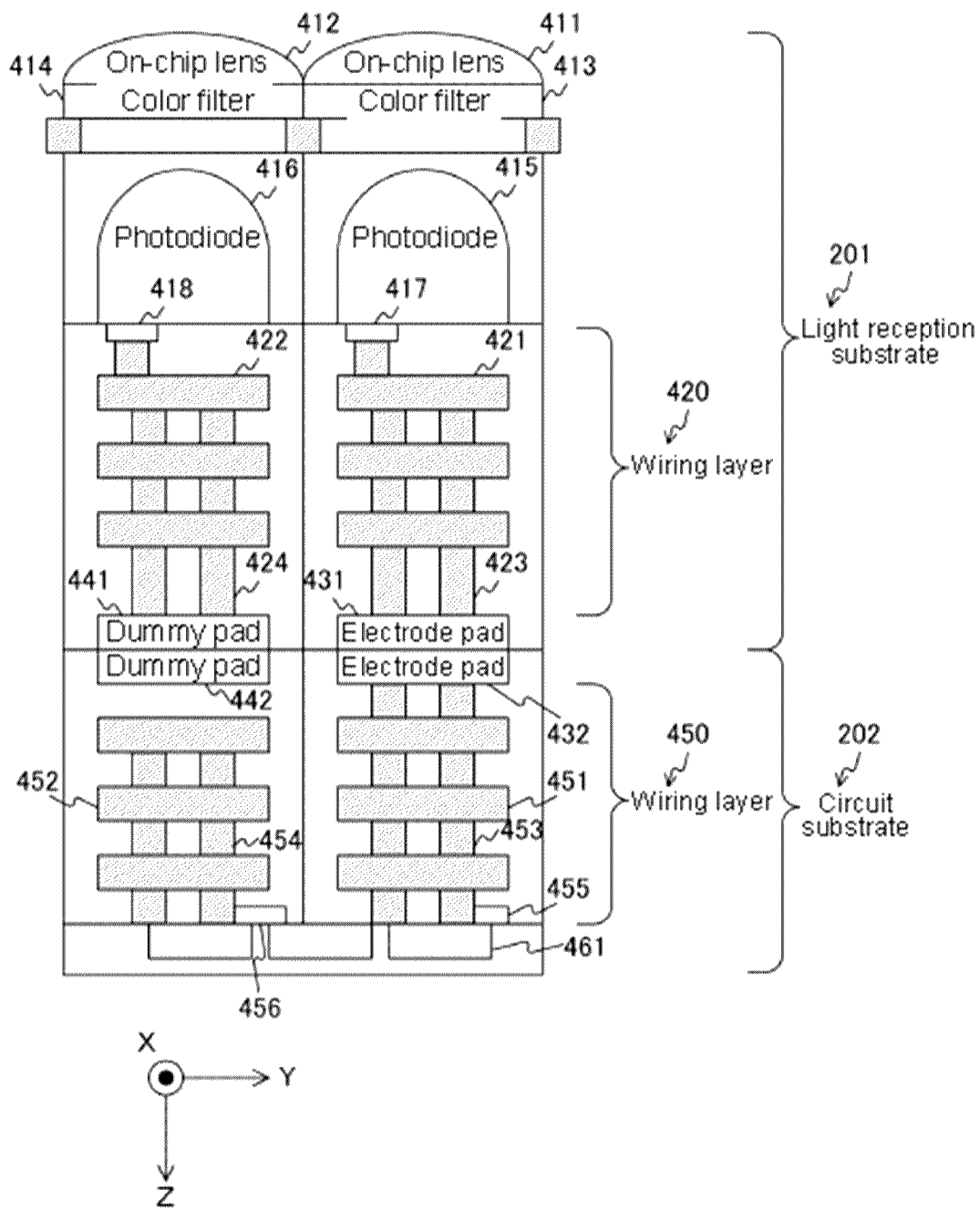

[Fig. 15]
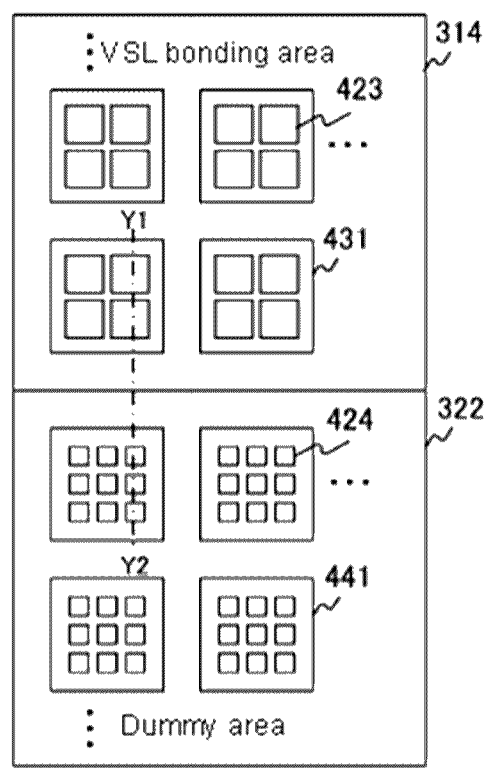

[Fig. 16]
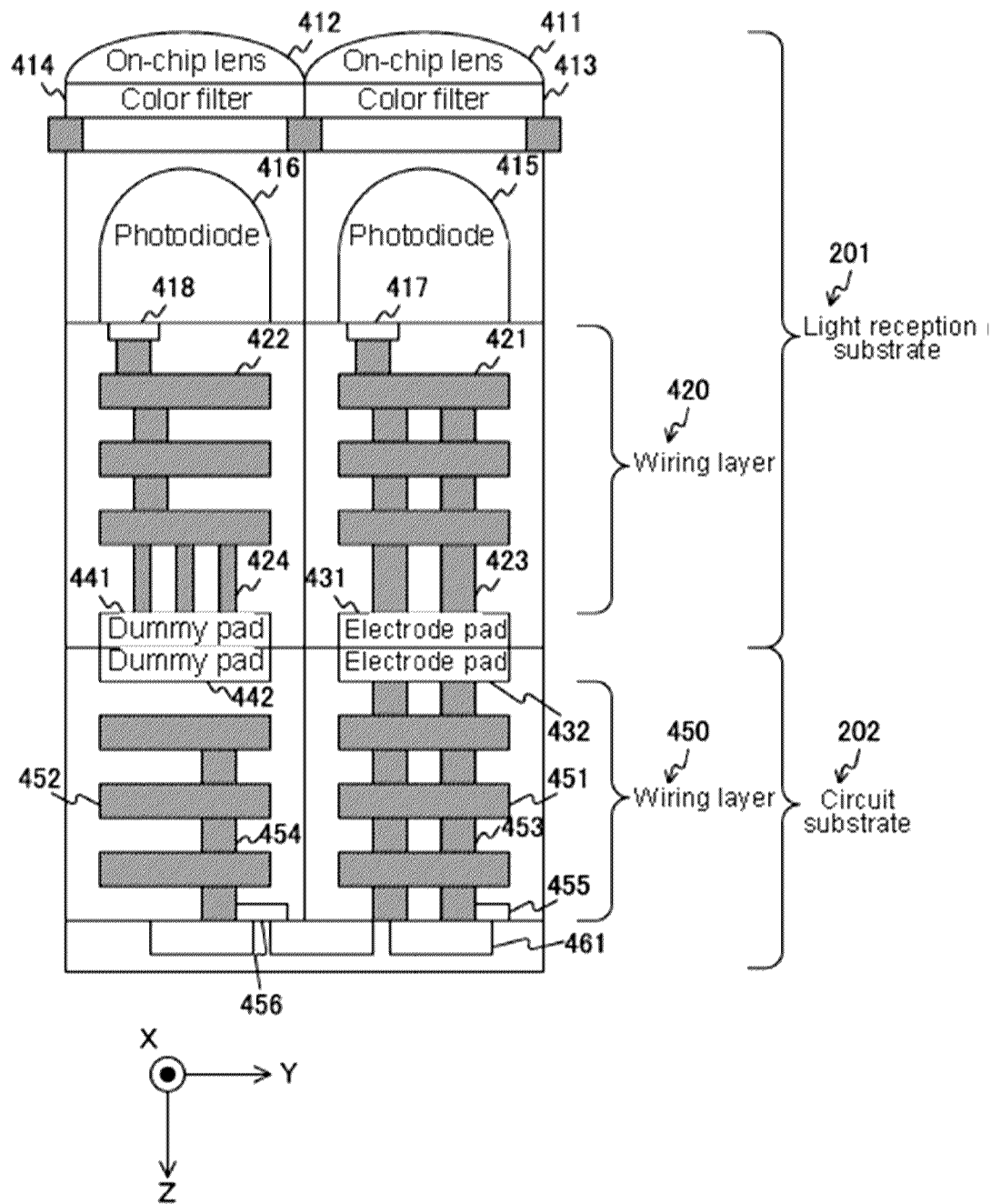

[Fig. 17]
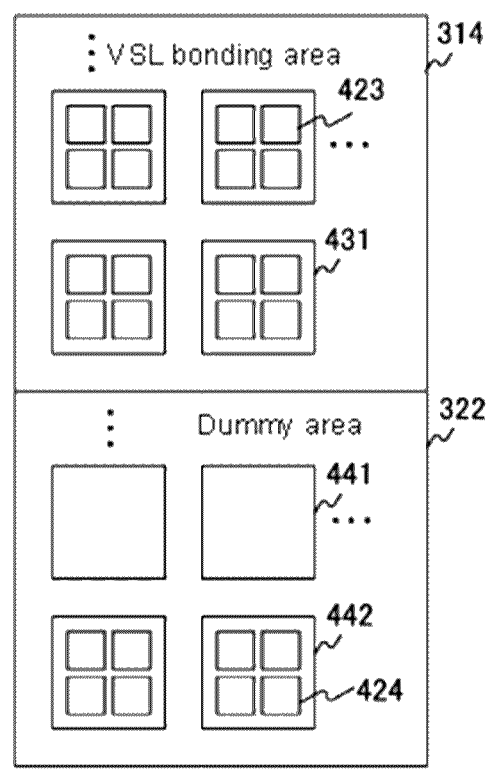

[Fig. 18]

[Fig. 19]
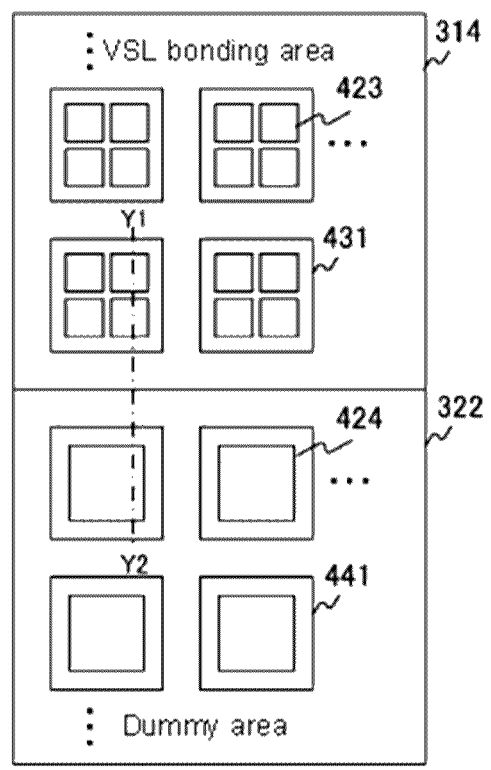

[Fig. 20]
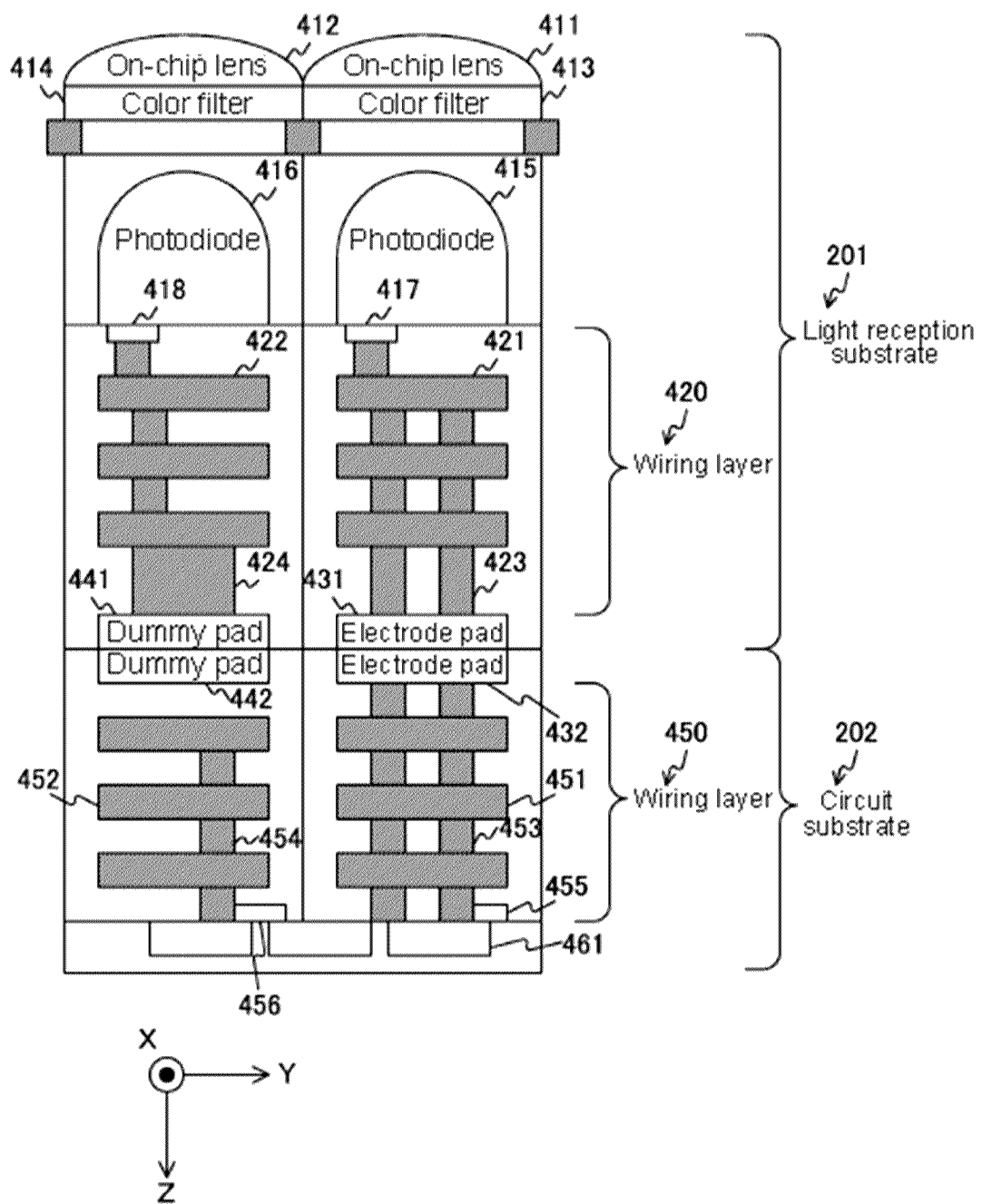

[Fig. 21]
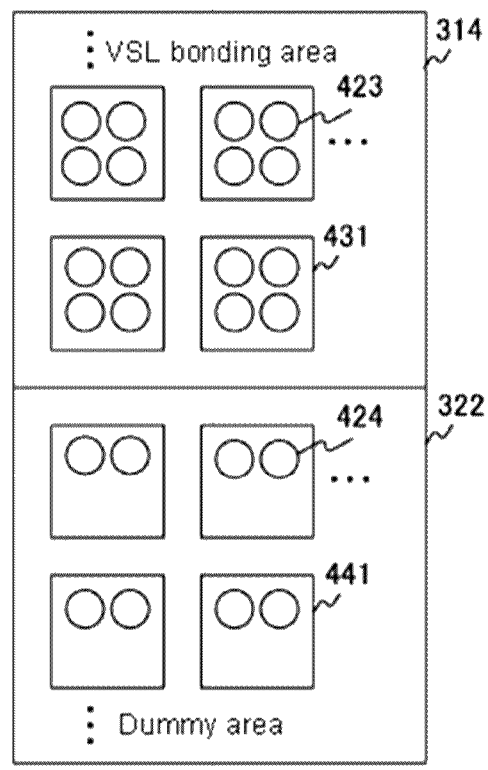
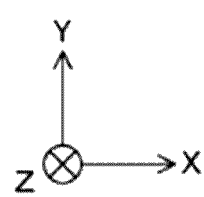

[Fig. 22]
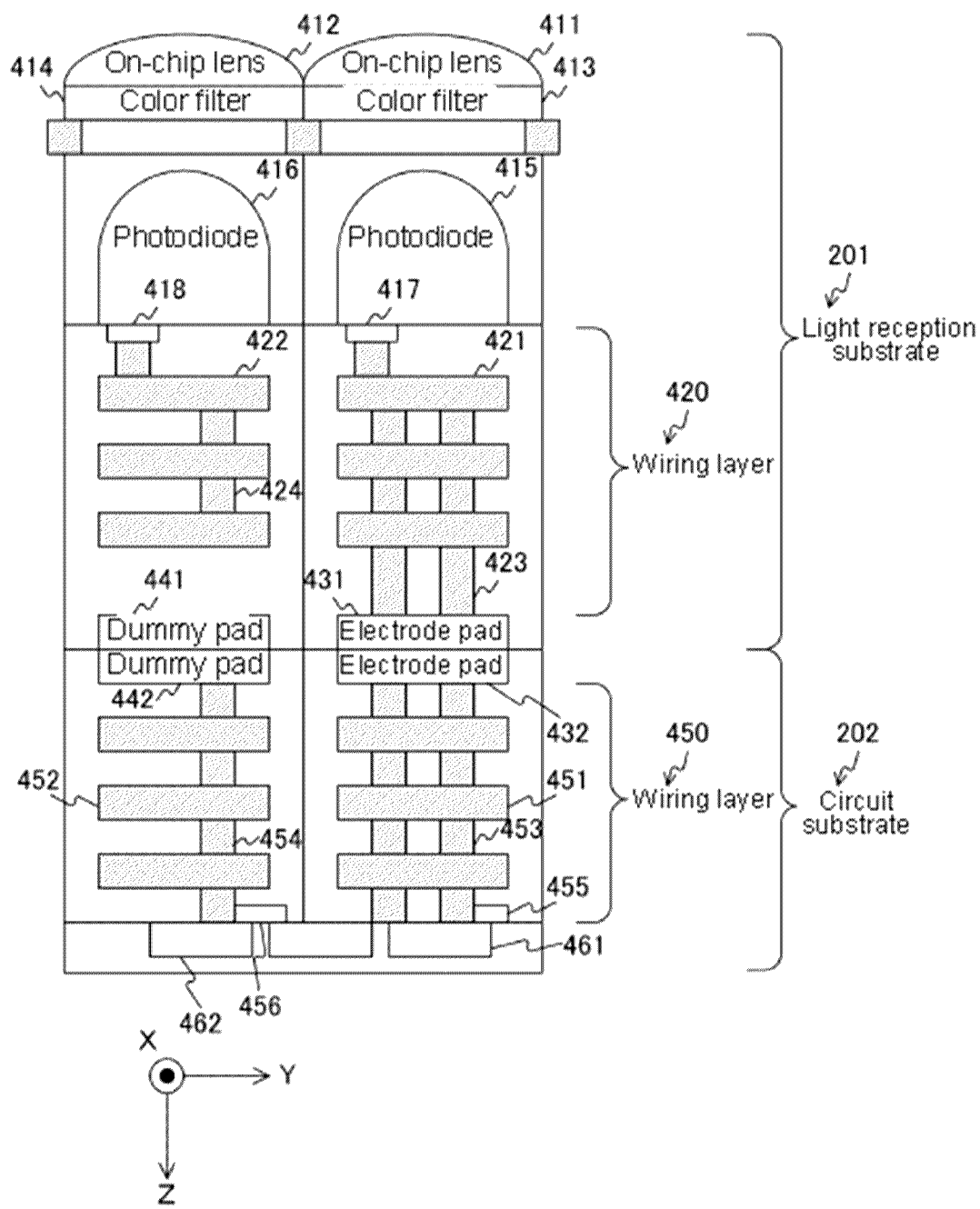

[Fig. 23]
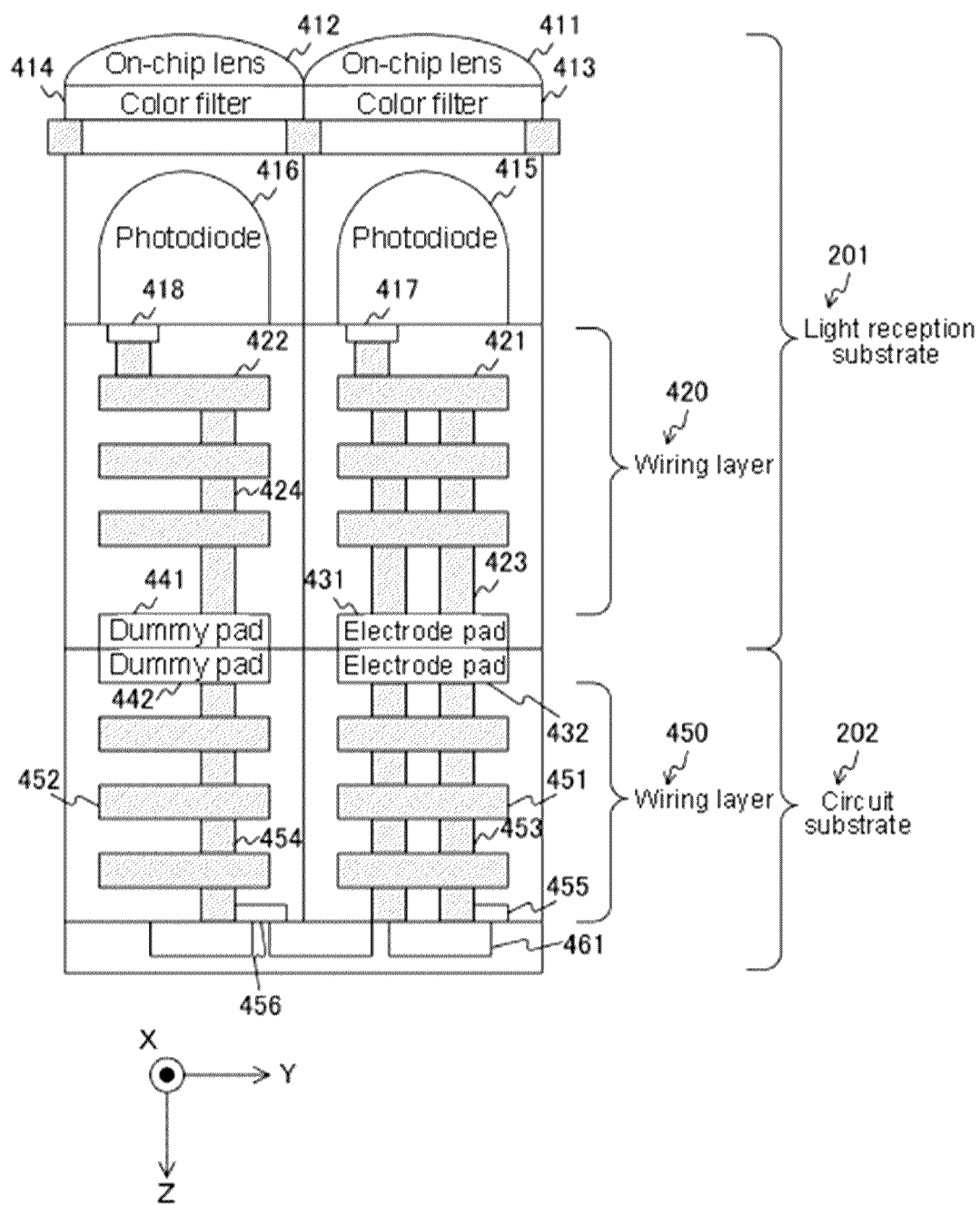

[Fig. 24]
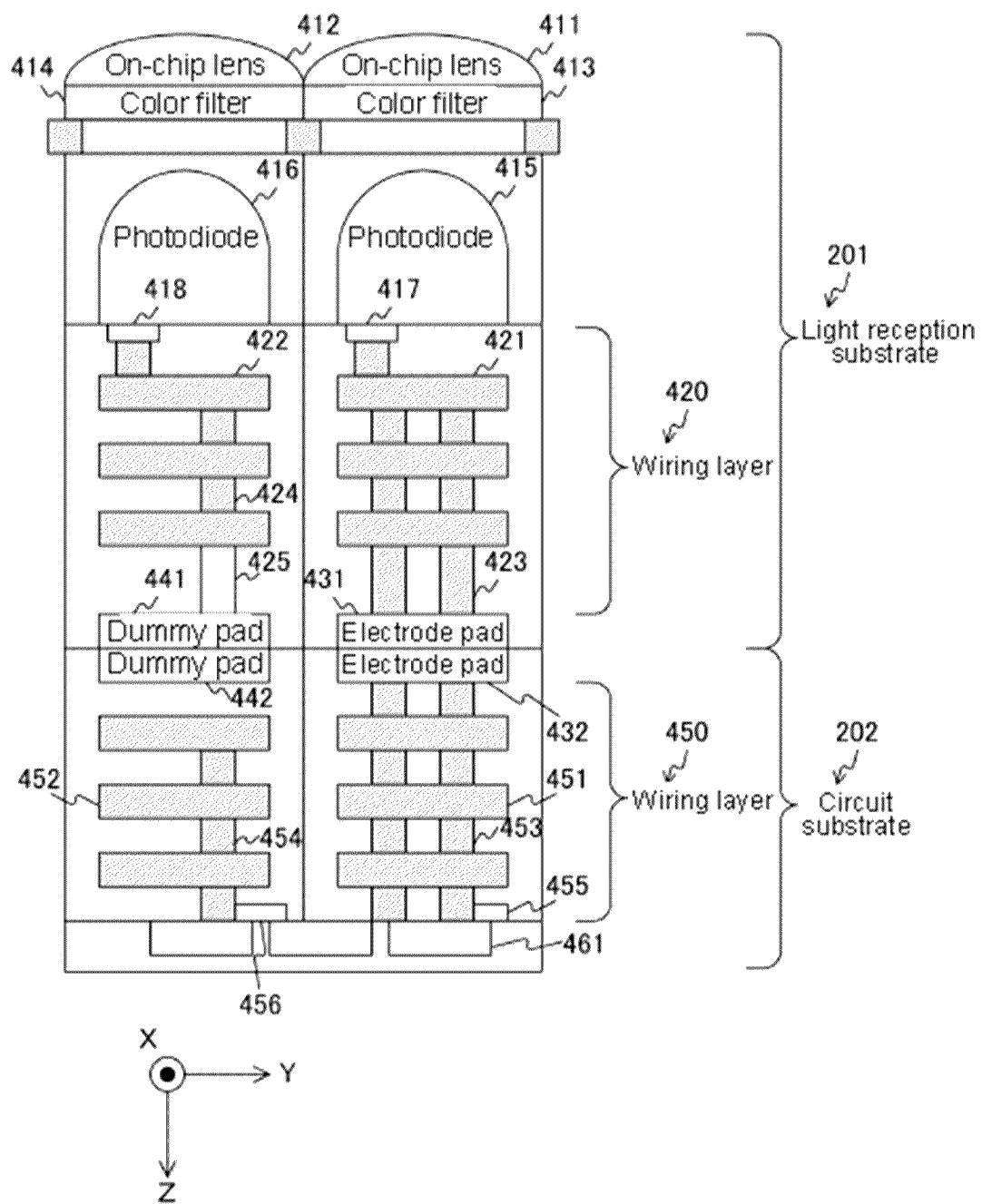

[Fig. 25]
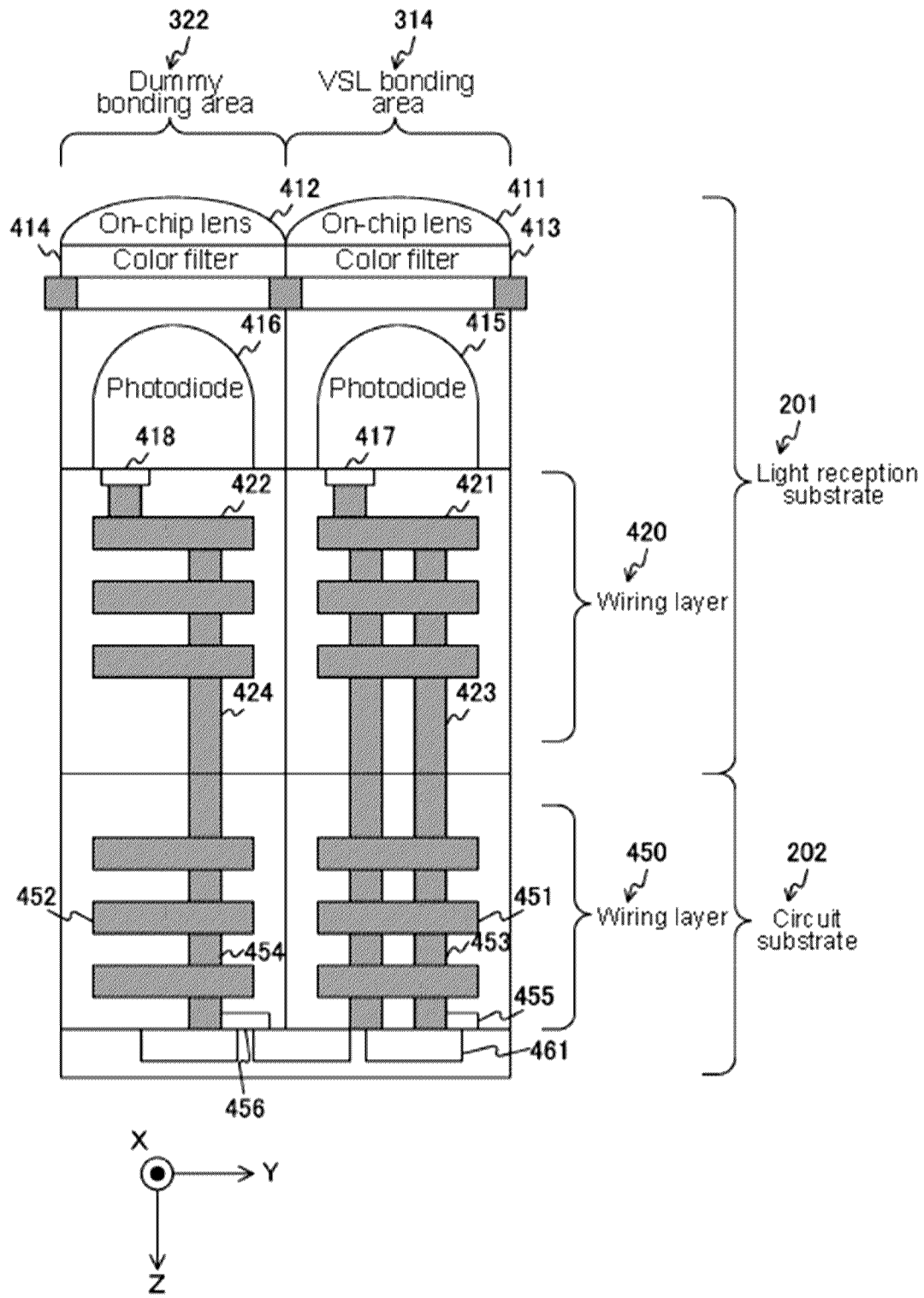

[Fig. 26]
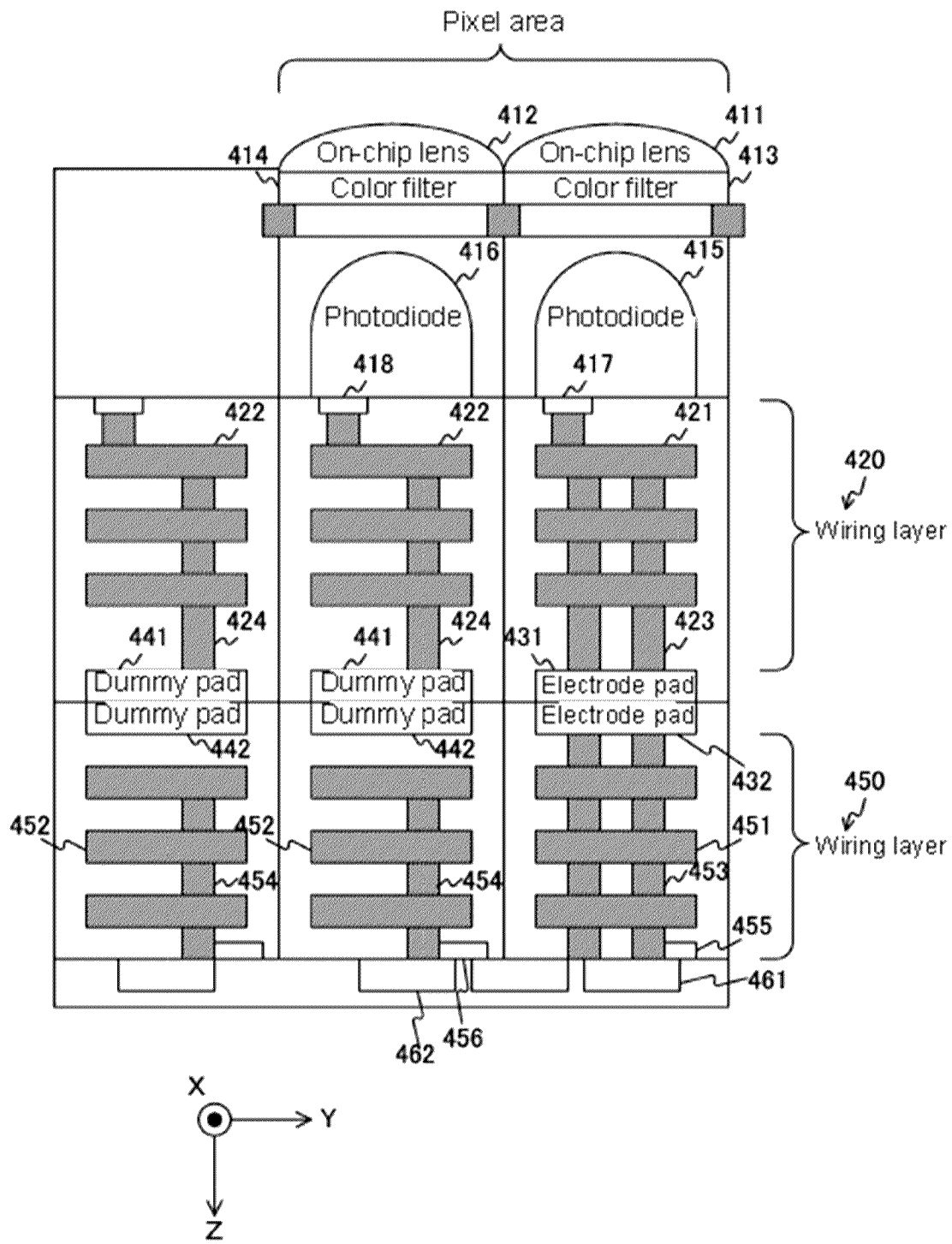

[Fig. 27]
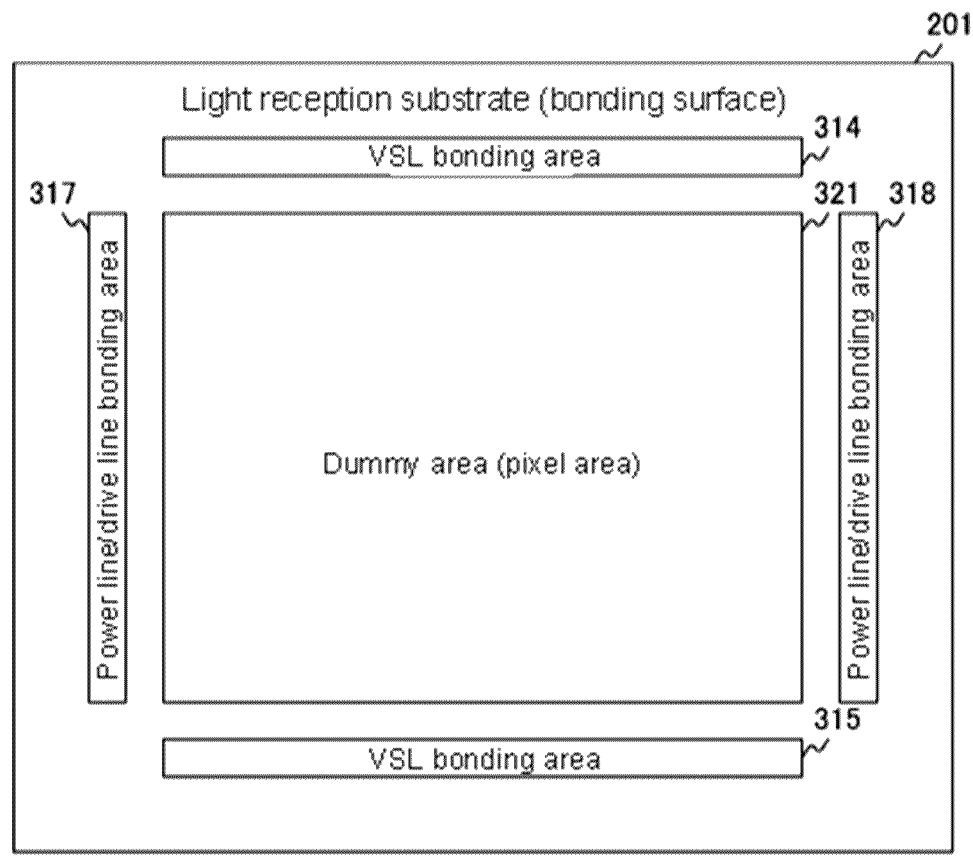

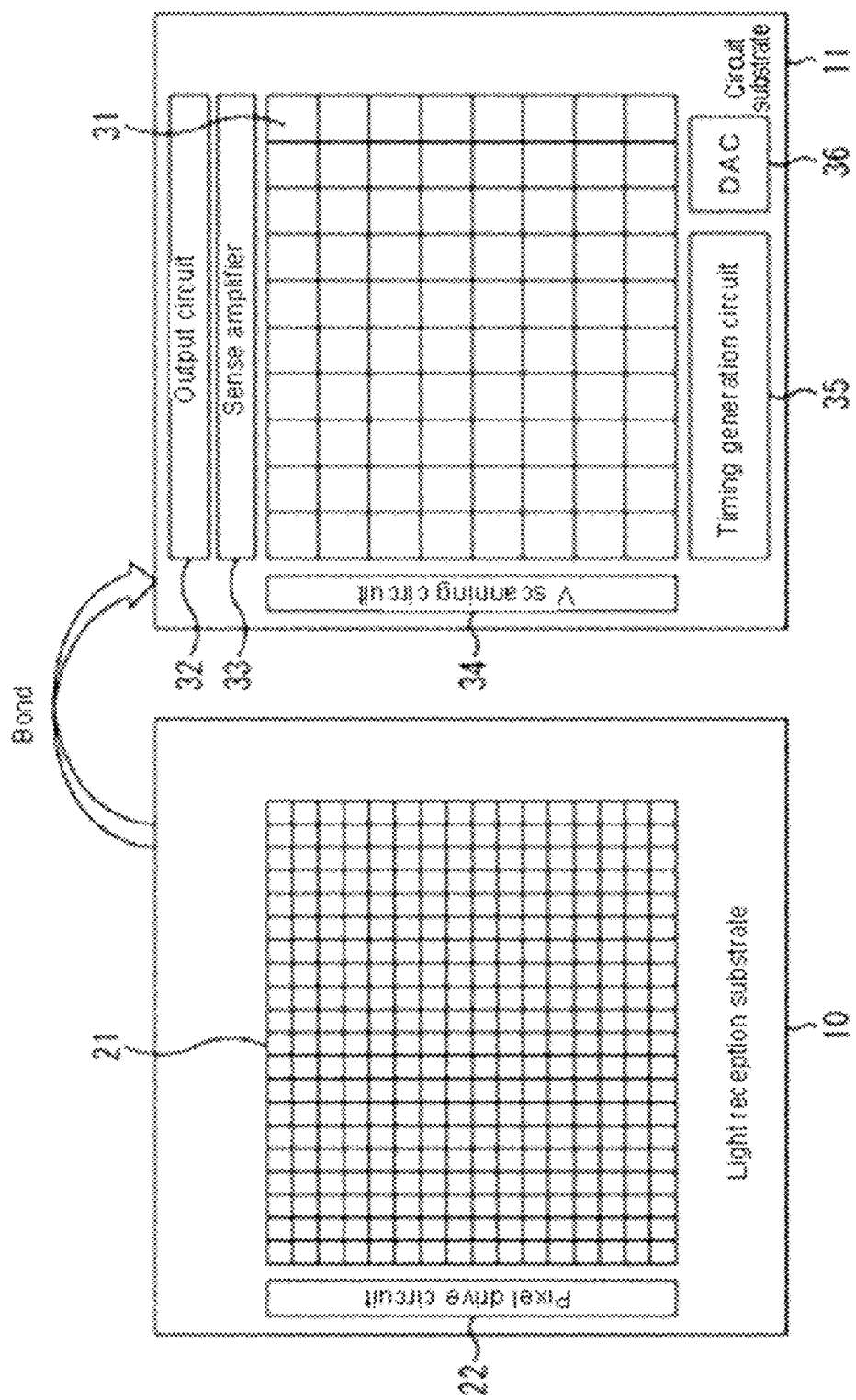
[Fig. 28]

[Fig. 29]
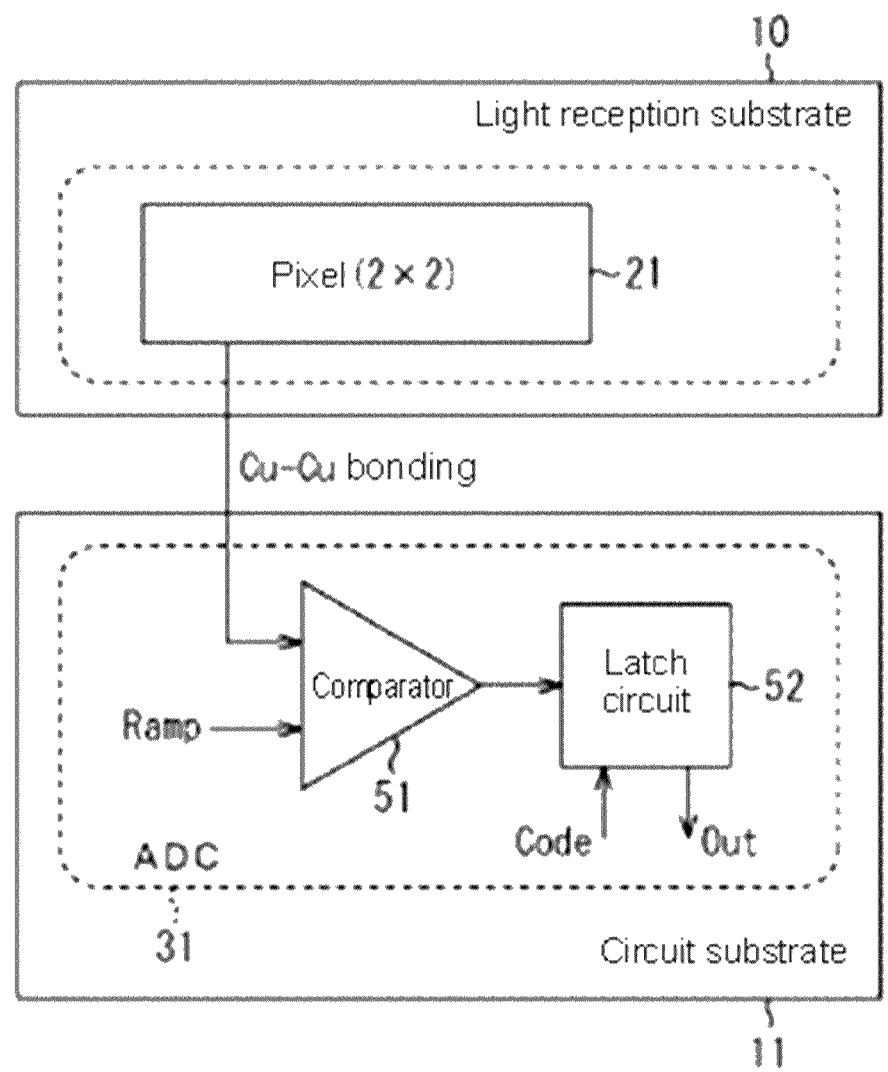

[Fig. 30]
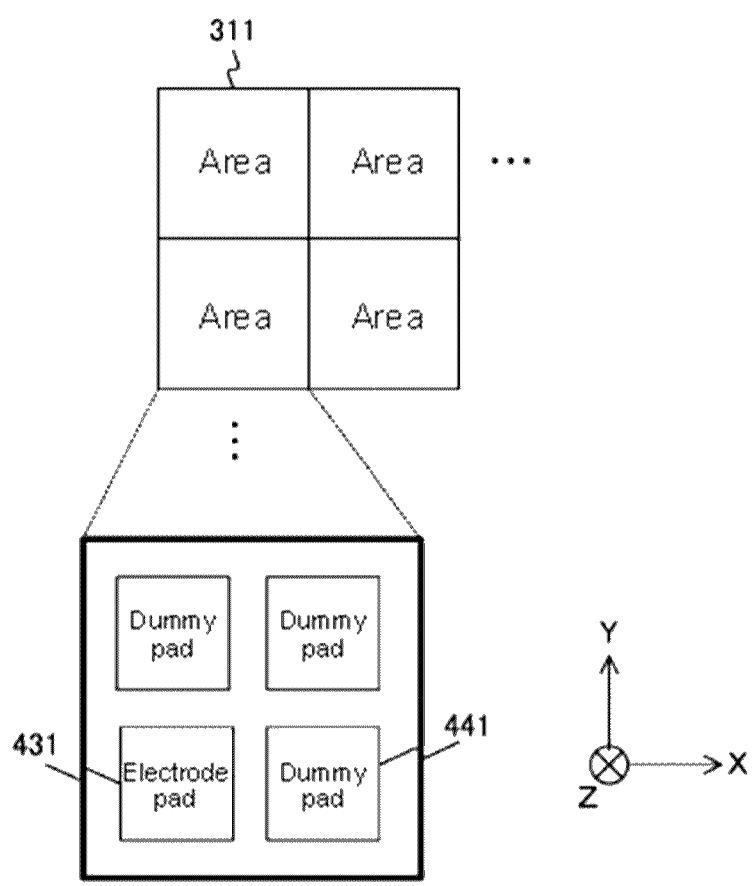

[Fig. 31]
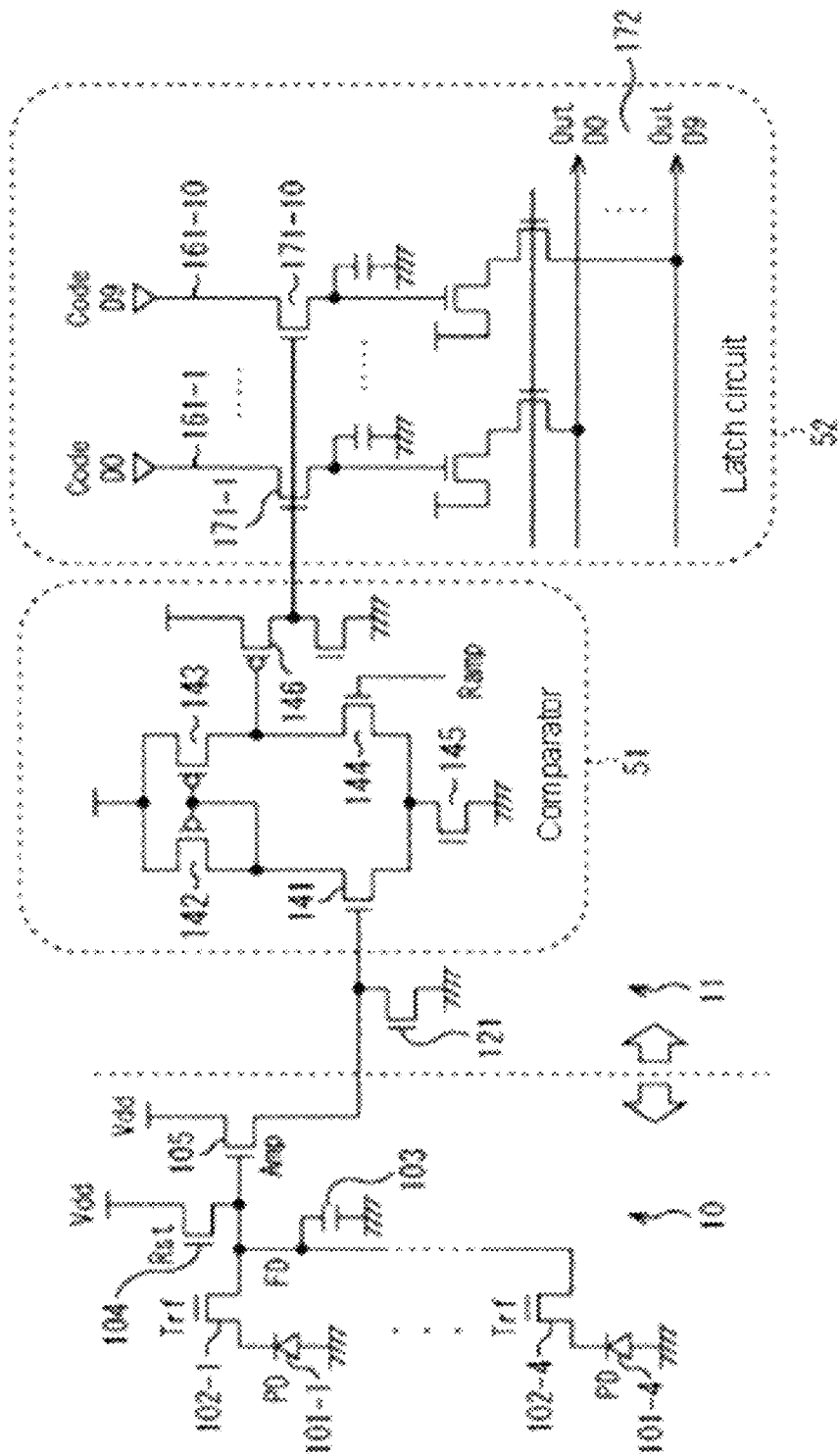

[Fig. 32]
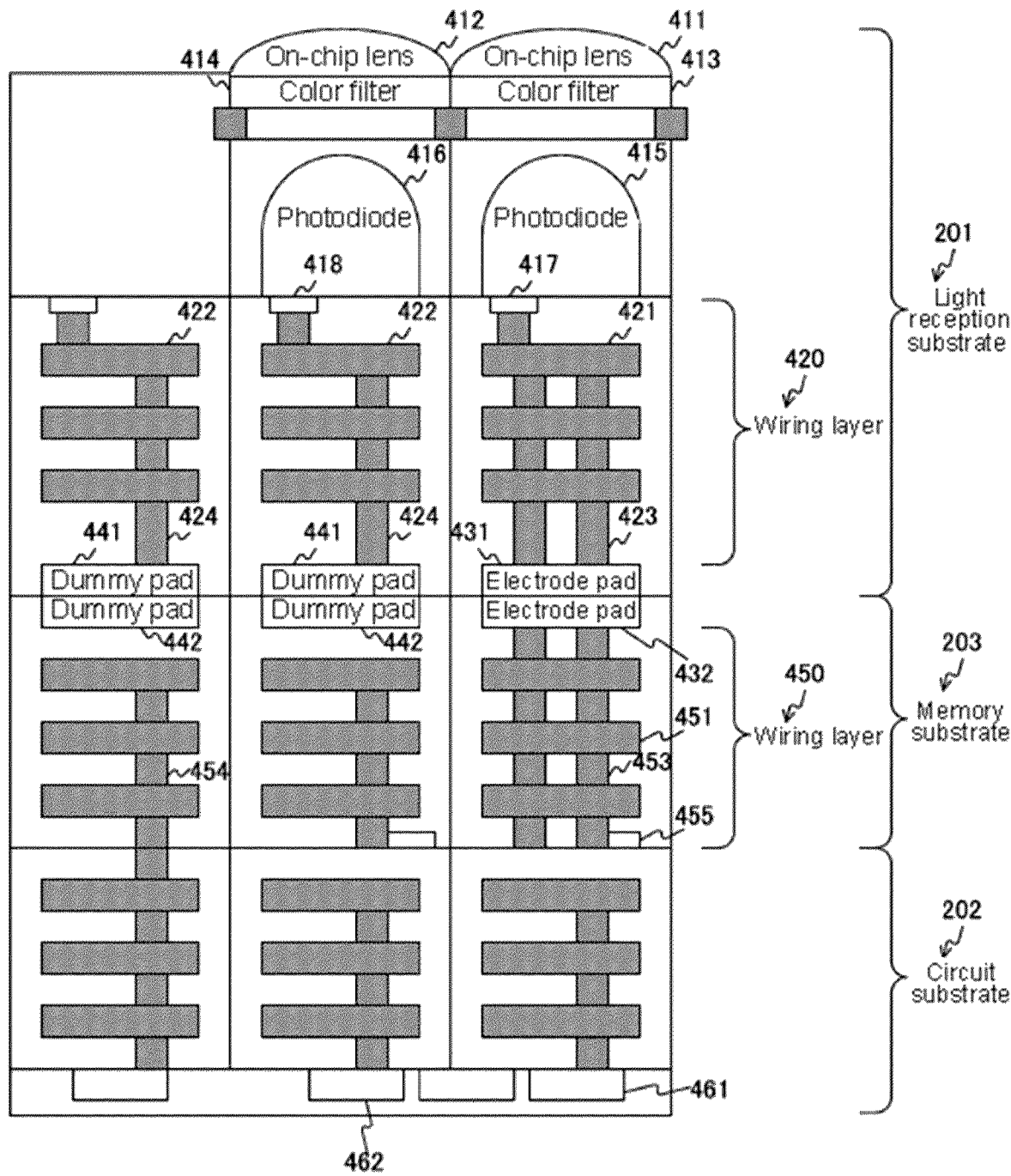

[Fig. 33]
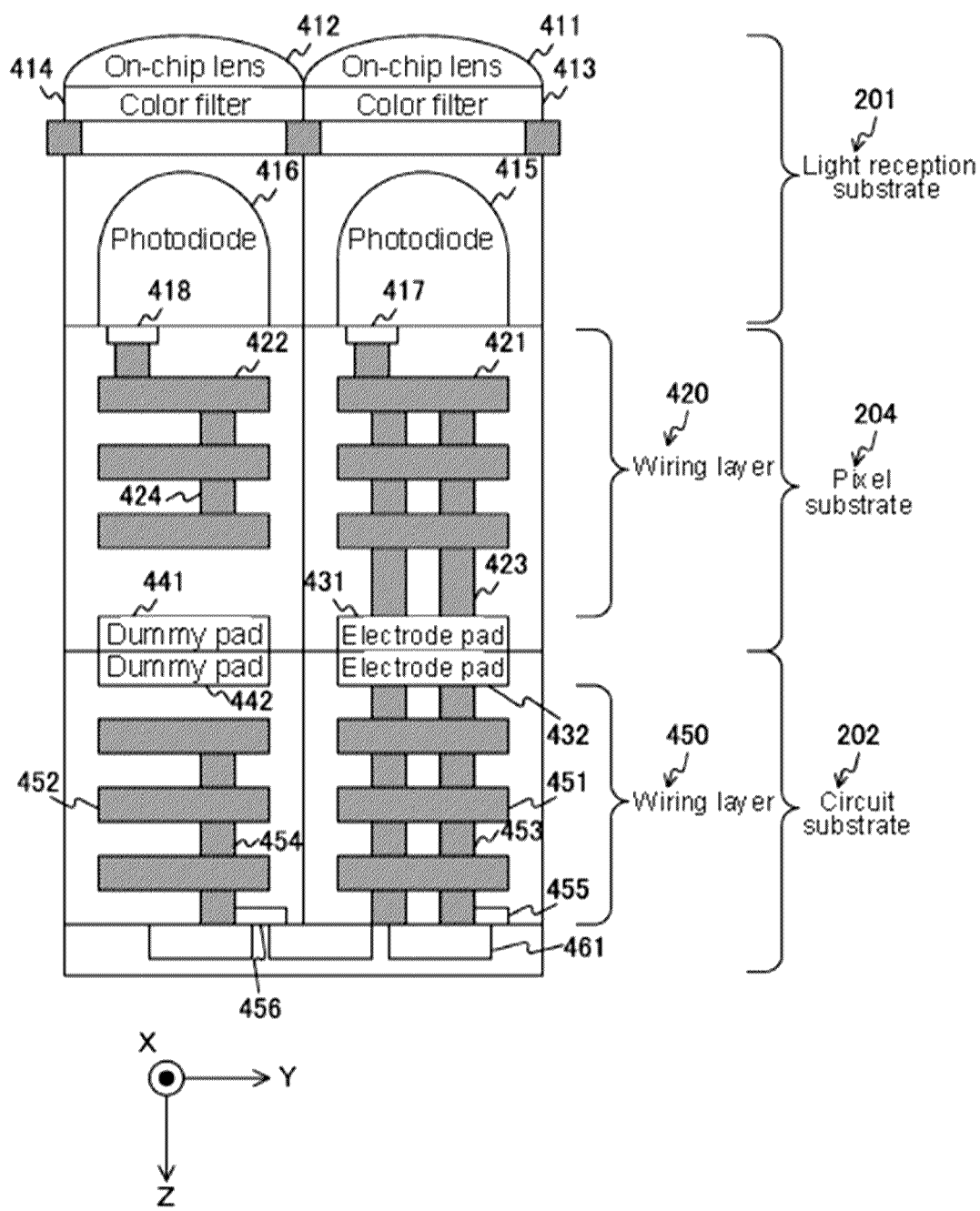

[Fig. 34]
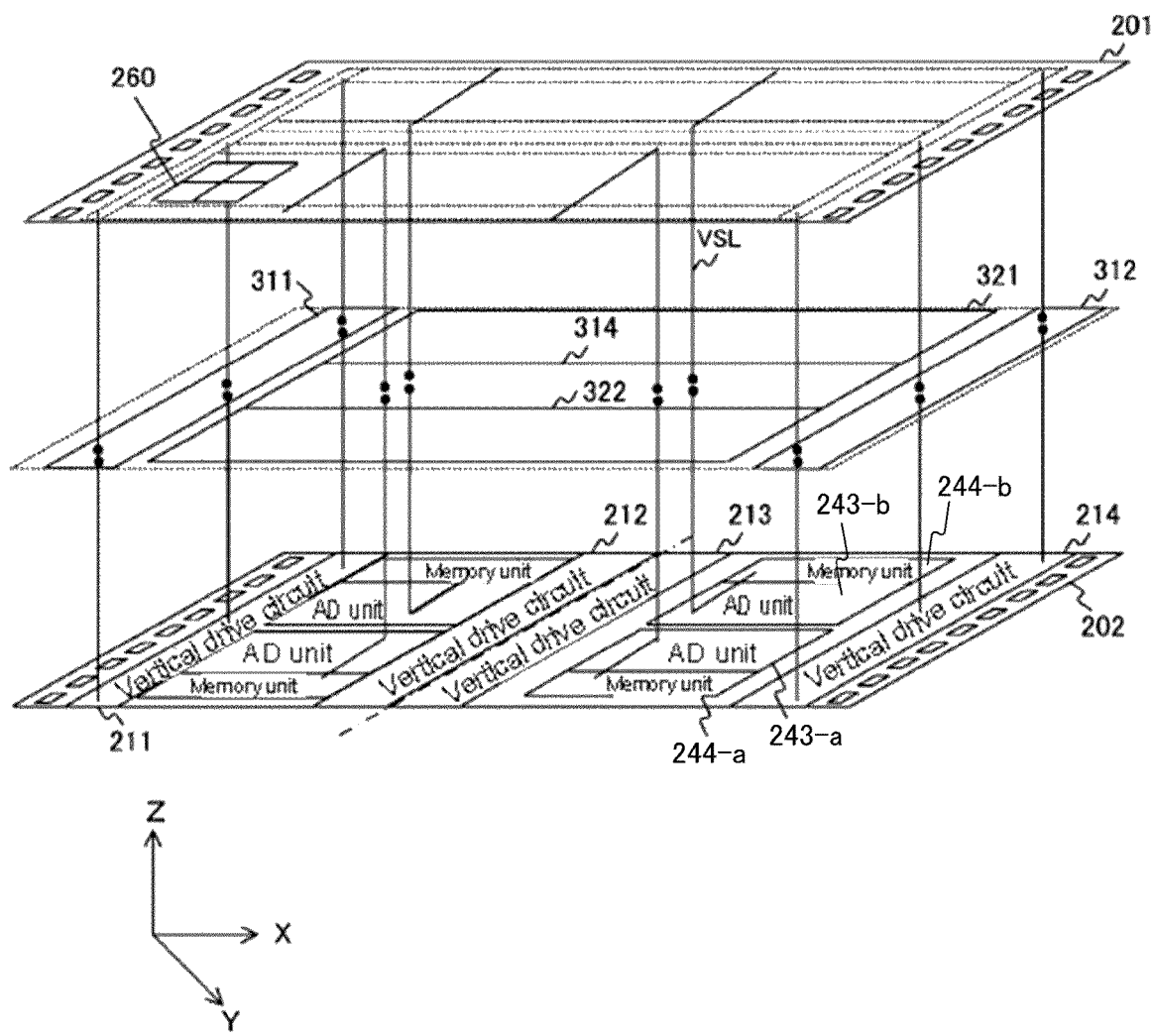

[Fig. 35]
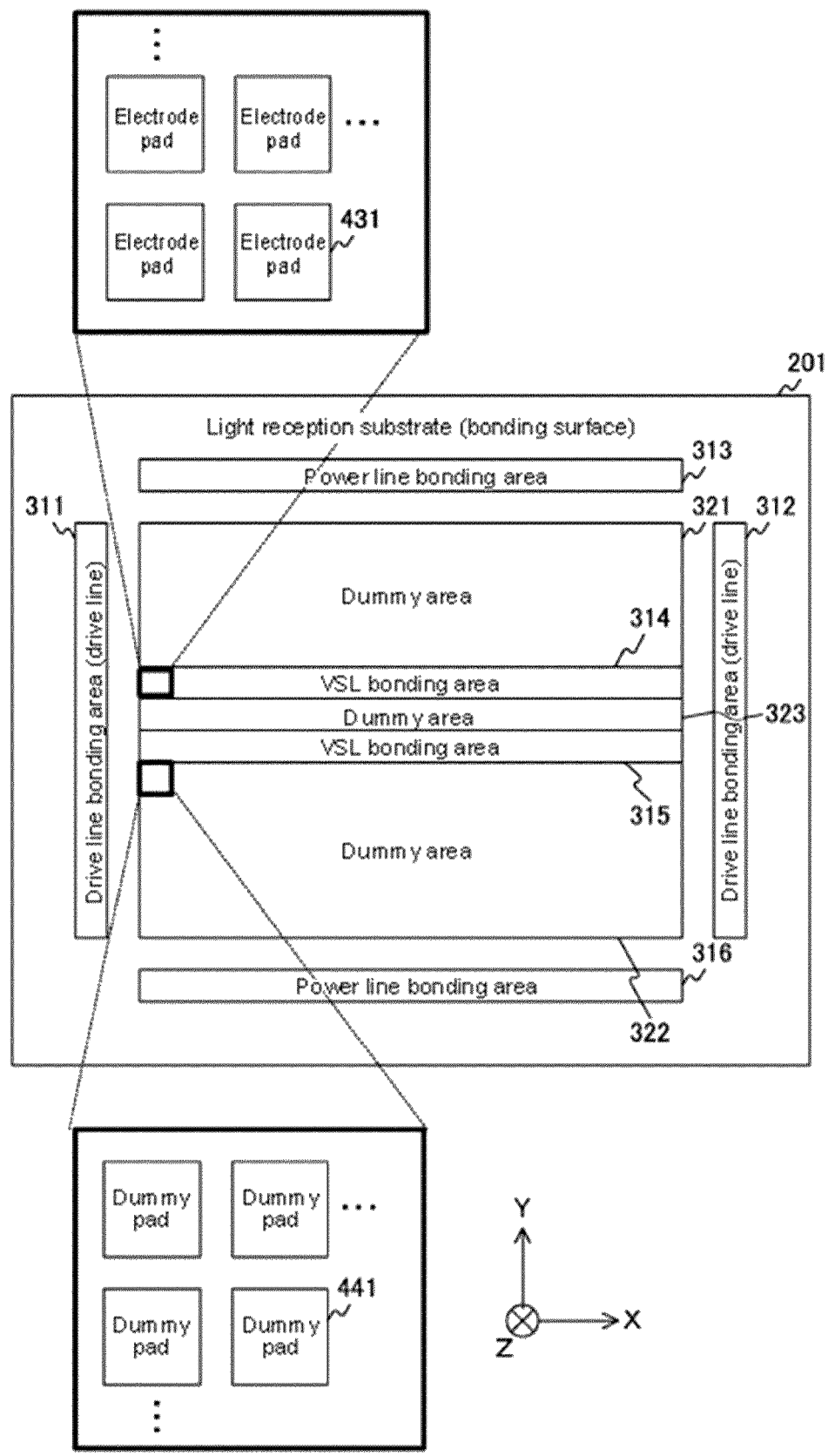

[Fig. 36]
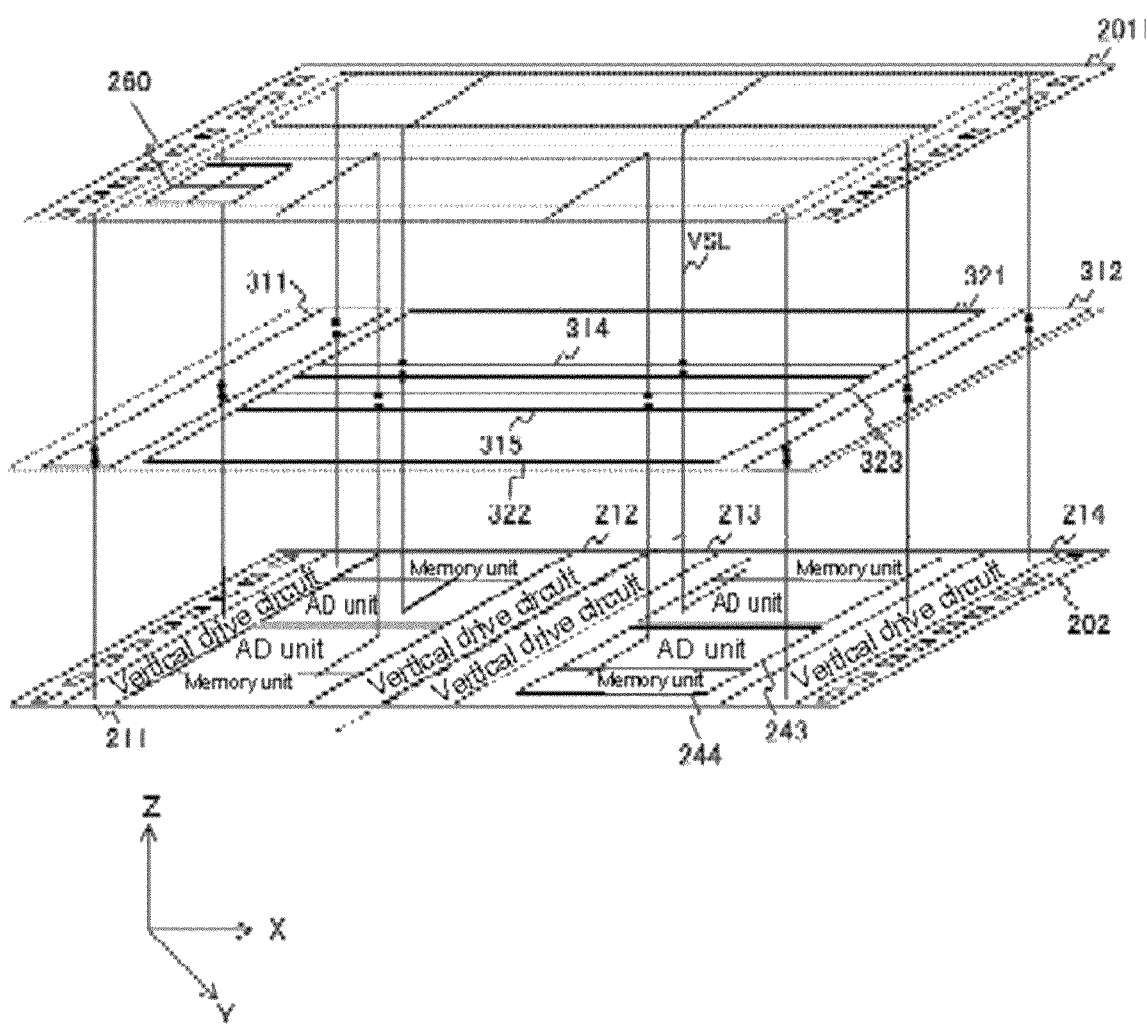

[Fig. 37]
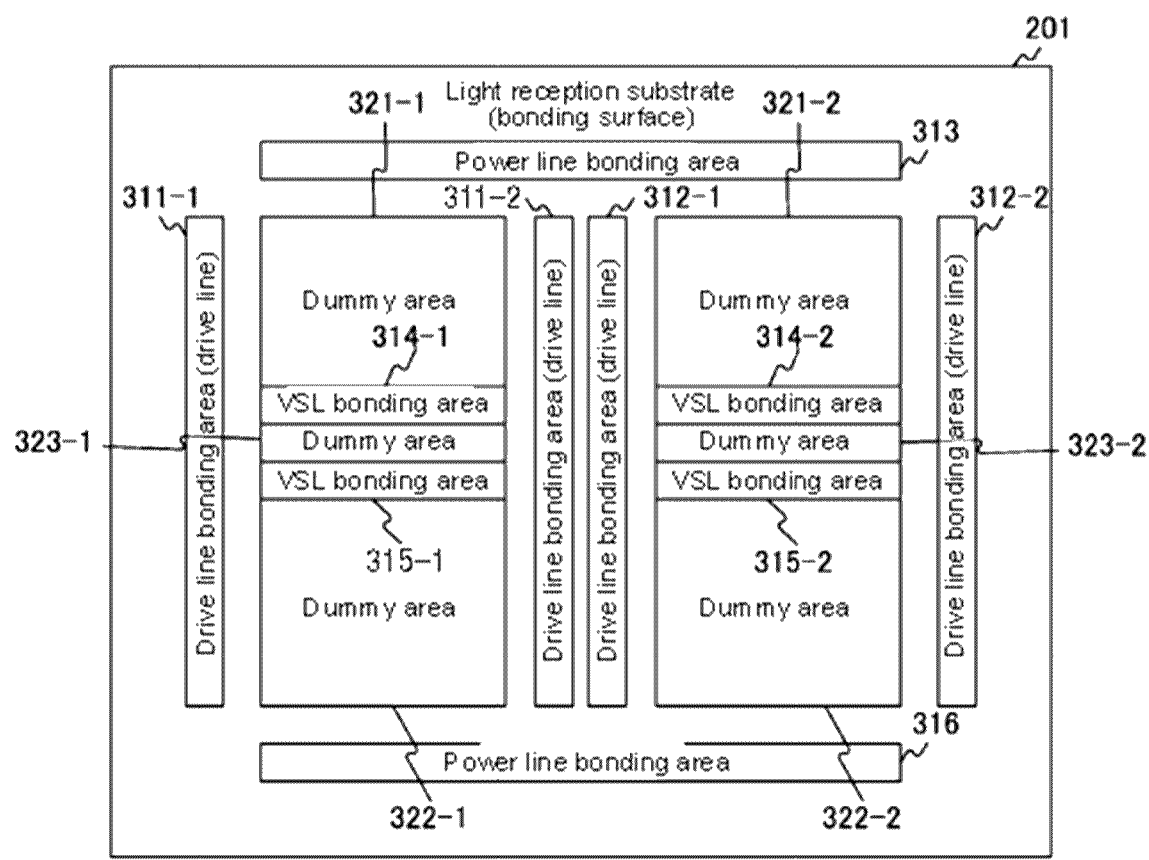

[Fig. 38]
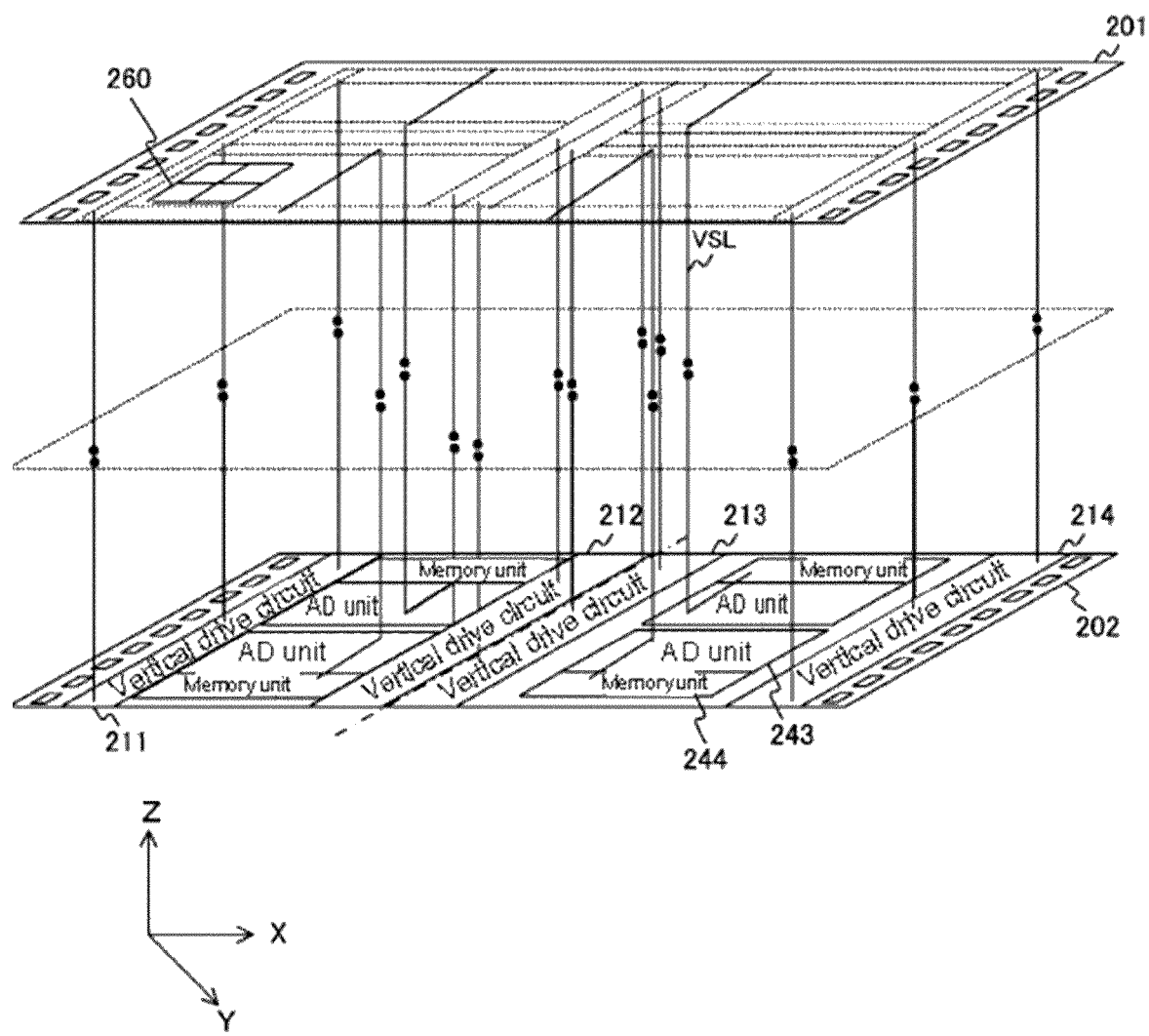

[Fig. 39]
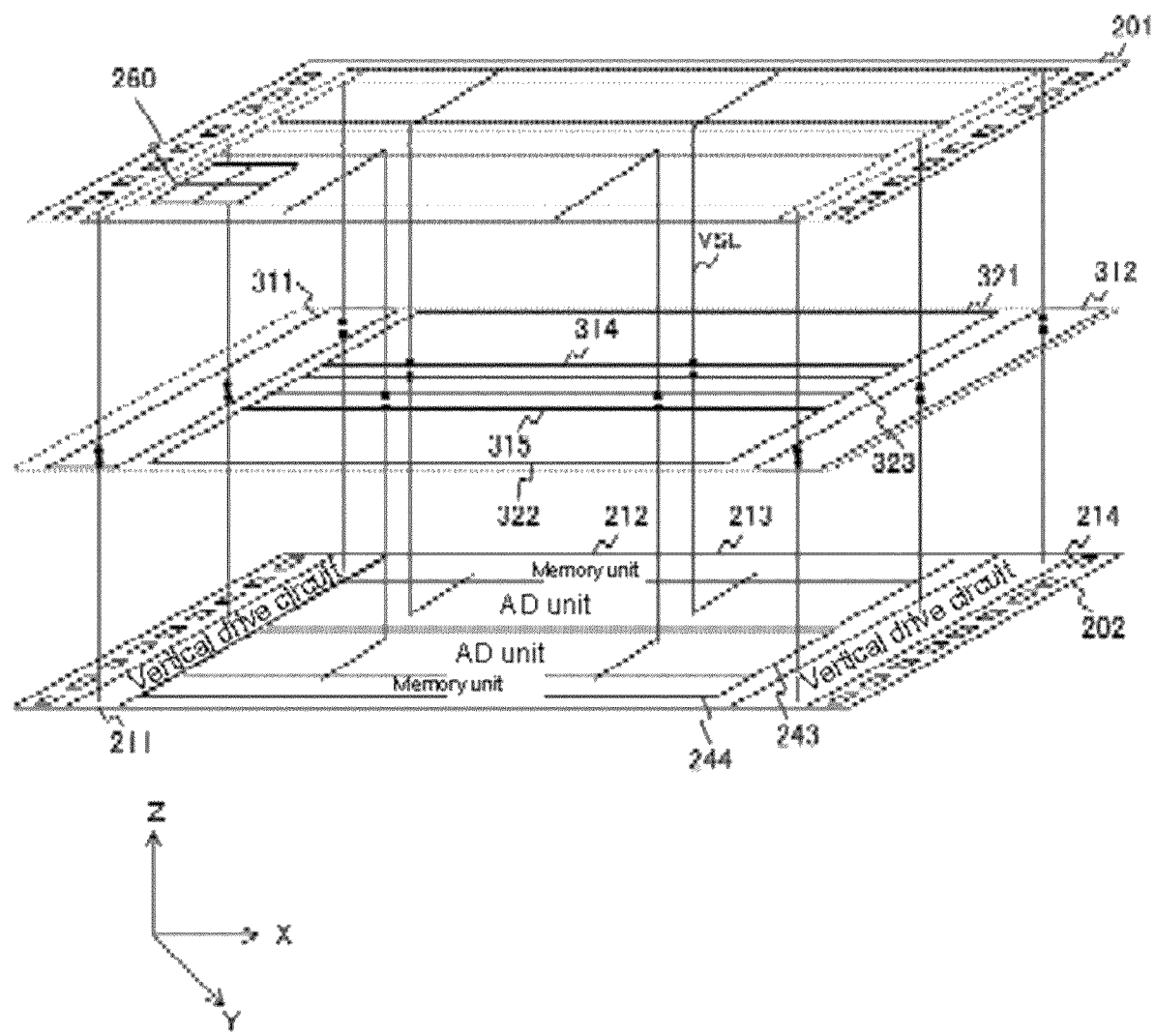

[Fig. 40]

[Fig. 41]
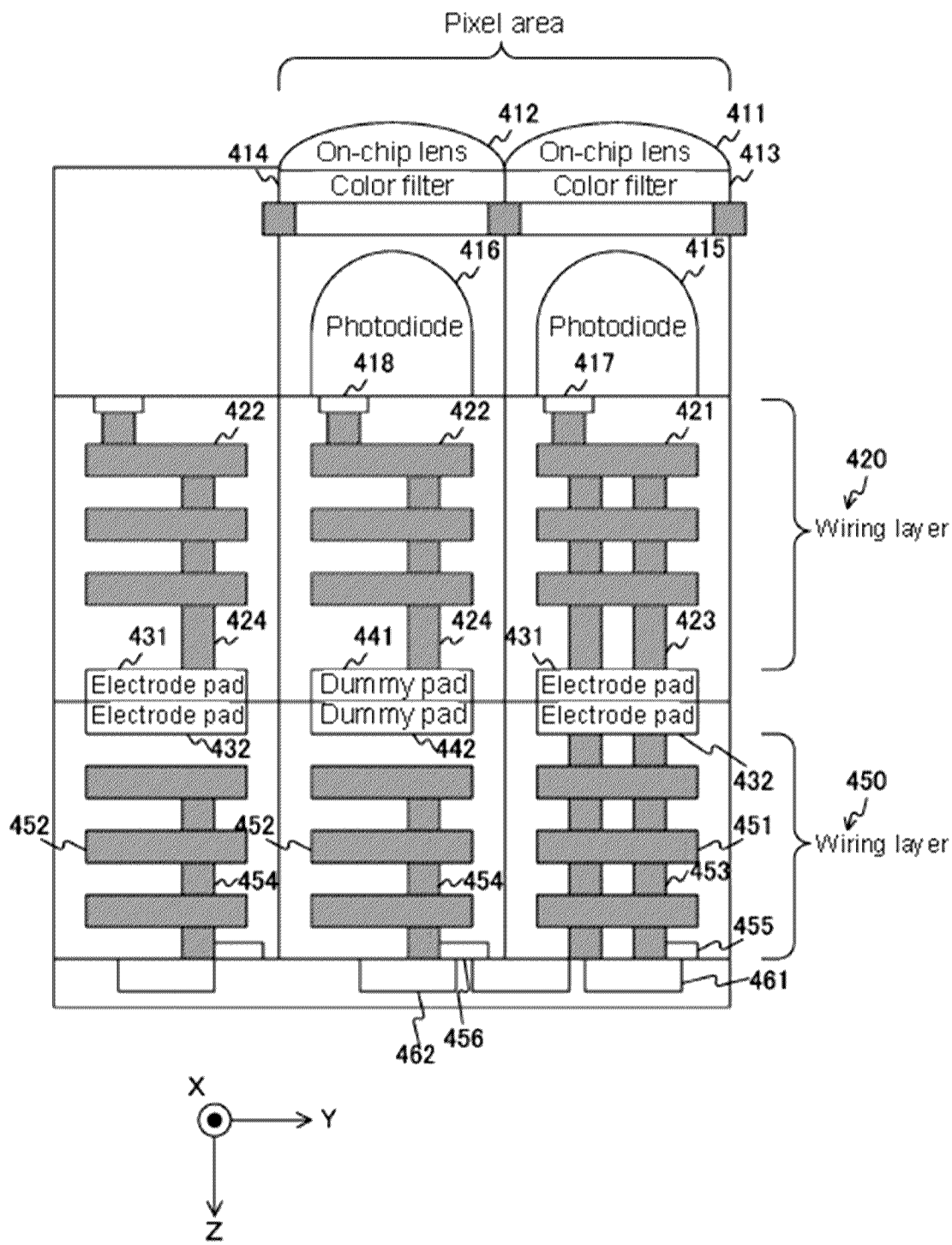

[Fig. 42]
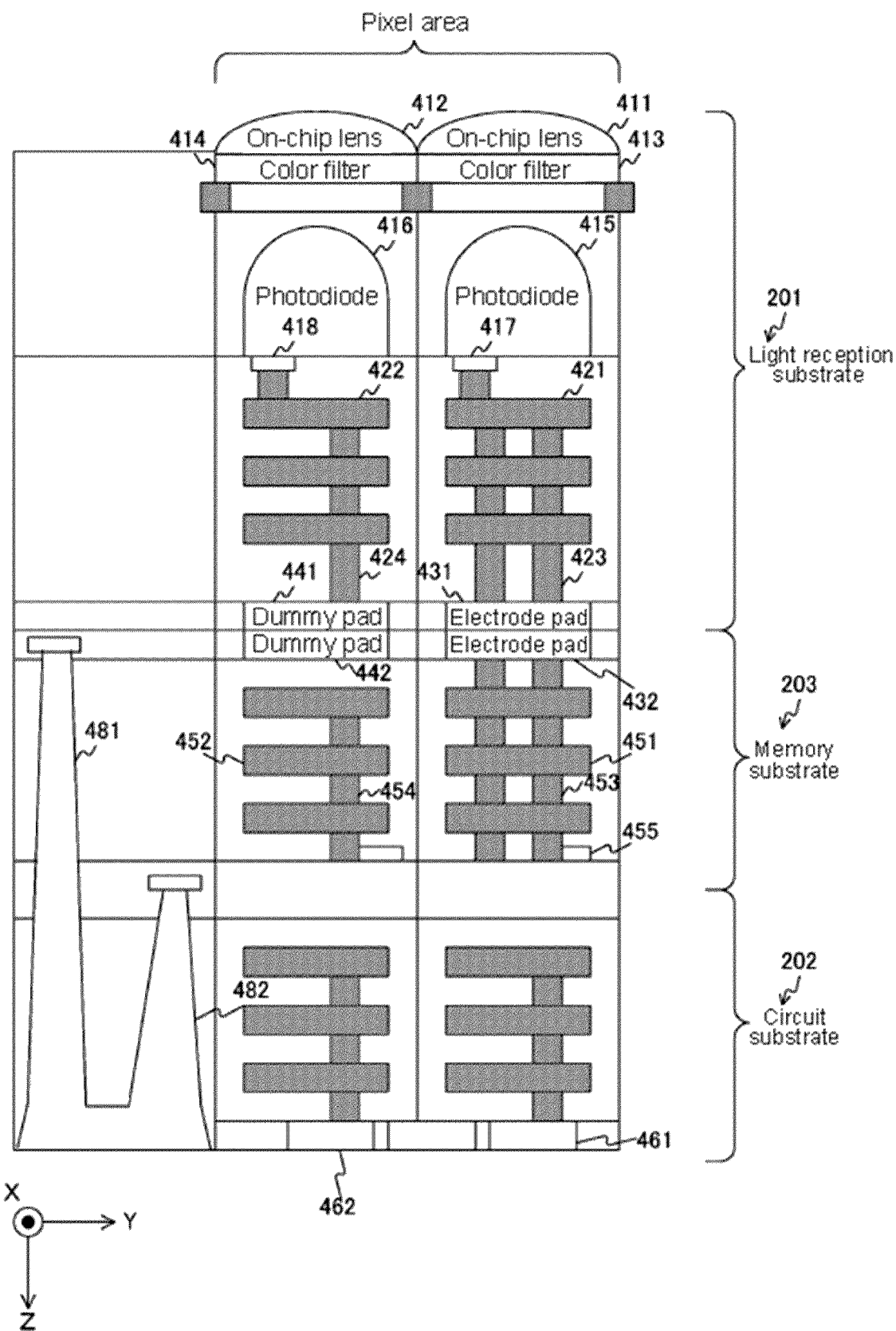

[Fig. 43]
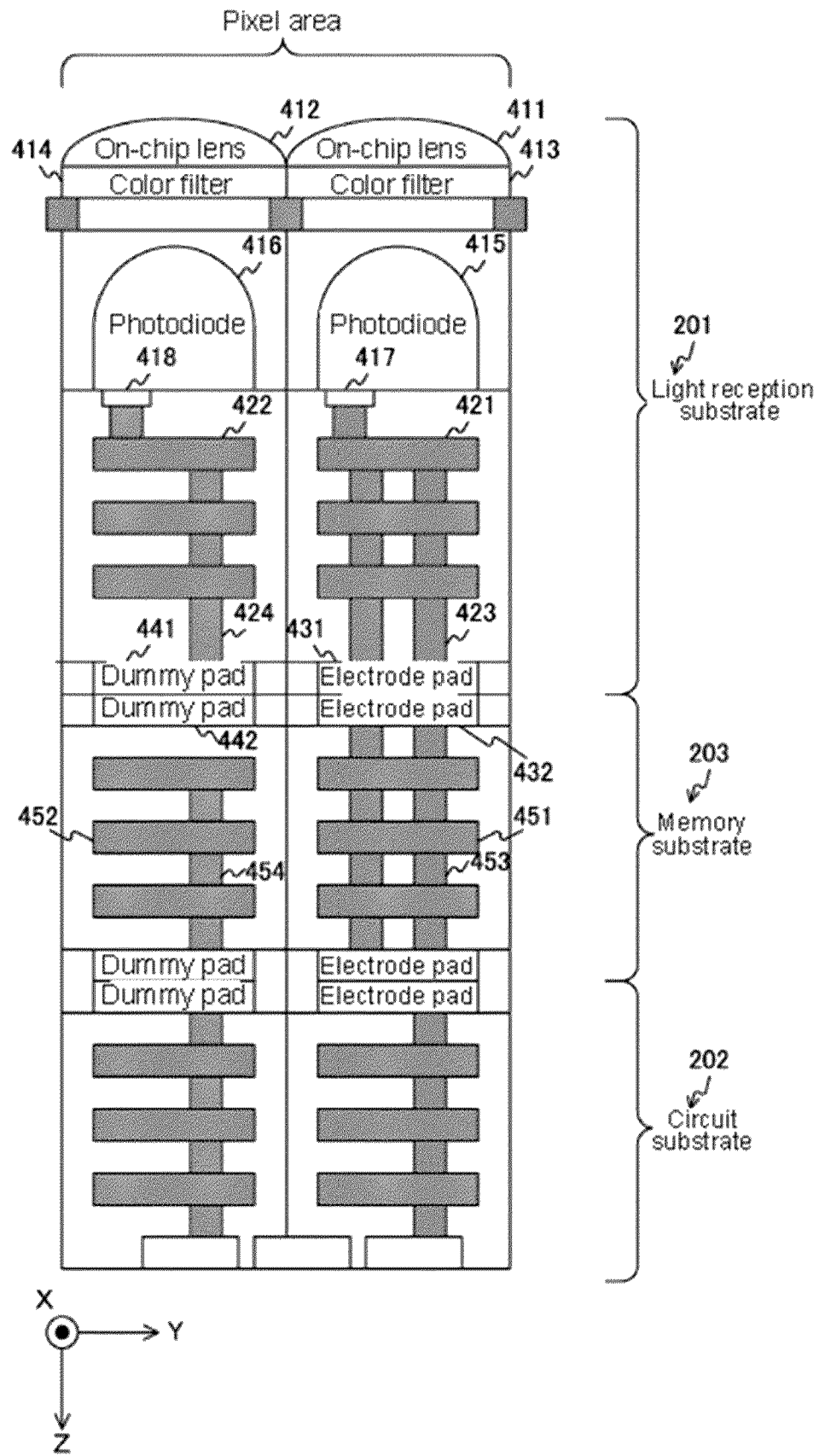

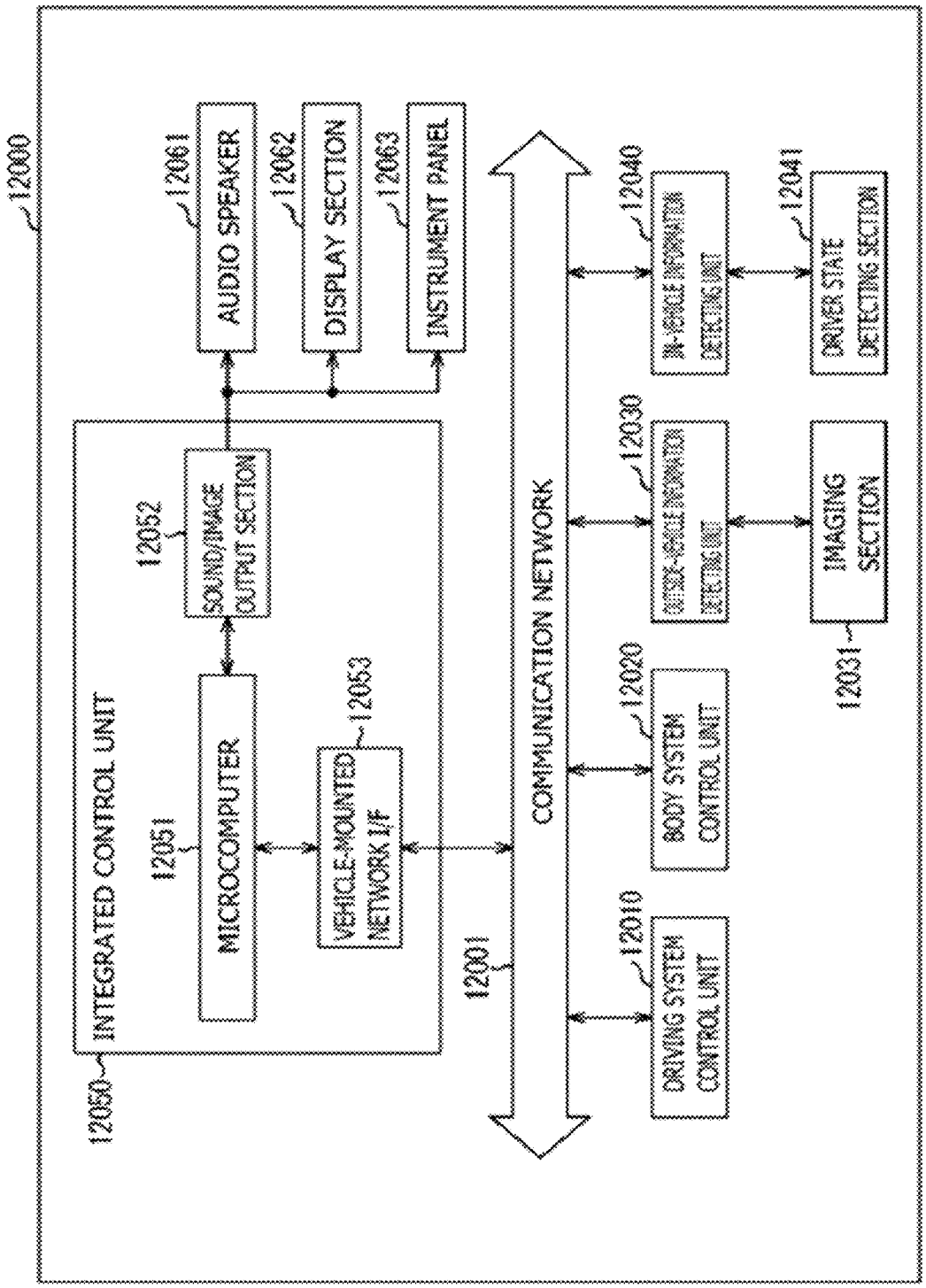
[Fig. 44]

[Fig. 45]
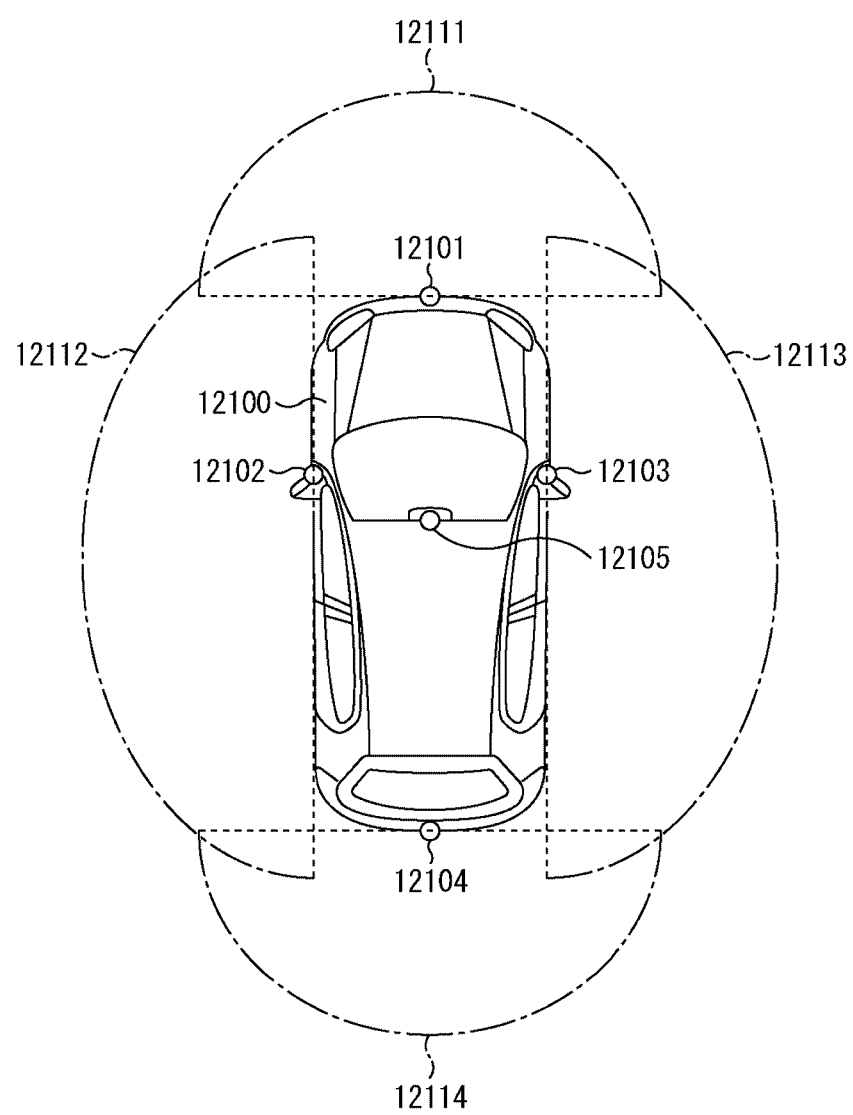

IMAGE SENSOR

CROSS REFERENCE TO RELATED APPLICATIONS

This application is a national stage application under 35 U.S.C. 371 and claims the benefit of PCT Application No. PCT/JP2020/008559 having an international filing date of 28 Feb. 2020, which designated the United States, which PCT application claimed the benefit of Japanese Patent Application No. 2019-036818, filed 28 Feb. 2019, the entire disclosures of each of which are incorporated herein by reference.

TECHNICAL FIELD

The present disclosure relates to a solid-state imaging apparatus and an imaging system. Specifically, the present disclosure relates to a solid-state imaging apparatus and an imaging system in which noise due to a dark current occurs.

BACKGROUND ART

In order to reduce the scale and area of a circuit for each semiconductor substrate, a conventional technology of stacking and bonding a plurality of semiconductor substrates has been used in a solid-state imaging apparatus. For example, a solid-state imaging apparatus in which copper electrode pads are exposed on the bonding surfaces of a pair of semiconductor substrates and the electrode pads are bonded to each other for electrical conduction has been proposed (see, for example, Japanese Patent Application Laid-open No. 2012-164870). The method of joining the copper electrode pads to each other as described above is called Cu (Copper)-Cu bonding. Further, in the above-mentioned solid-state imaging apparatus, pads that are not used for electrical conduction are called dummy pads which are provided on the bonding surfaces below a plurality of pixel circuits.

CITATION LIST

Patent Literature

PTL 1: Japanese Patent Application Laid-open No. 2012-164870

SUMMARY

In the above-mentioned existing technology, in addition to the electrode pads, also the dummy pads are bonded to each other to improve the bonding strength. However, a difference occurs between the dark current of the pixel circuit on the electrode pad and the dark current of the pixel circuit on the dummy pad, which causes a problem that noise occurs in the image data due to the difference and the image quality is reduced. The reason why the difference in dark current occurs as described above is presumably because there is a difference between the amount of hydrogen supplied to the pixel circuit on the electrode pad and the amount of hydrogen supplied to the pixel circuit on the dummy pad.

In view of the above-mentioned circumstances, it is desirable to suppress reduction in image quality of image data in a solid-state imaging apparatus in which a plurality of semiconductor substrates are stacked and dummy pads are provided.

Technical Problem

In accordance with a first aspect of the present disclosure, there is provided an image sensor including a first substrate including a plurality of pixels and a plurality of vertical signal lines and a plurality of first wiring layers at one side thereof and a second substrate including a plurality of second wiring layers at one side thereof. The first and second substrates are secured together with a bonding surface between the pluralities of first and second wiring layers. First pads are provided on each side of the bonding surface and between one of the plurality of first wiring layers and one of the plurality of second wiring layers and second pads are provided on each side of the bonding surface and between another of the plurality of first wiring layers and another of the plurality of second wiring layers. First vias are connected to the one of the plurality of first wiring layers and the first pad provided on the first substrate and second vias are connected to the one of the plurality of second wiring layers and the first pad provided on the second substrate. The first pad provided on the first substrate and the second pad provided on the second substrate are connected to each other. Third vias are connected to the another of the plurality of first wiring layers and fourth vias are connected to the another of the plurality of second wiring layers. At least one of the third vias and the fourth vias connect the second pads and at least one of the another of the plurality of first and second wiring layers together. The first pads provide for electrical connection between the one of the plurality of first wiring layers and the one of the plurality of second wiring layers, the first pads are electrically connected to one of the plurality of the vertical signals lines and the second pads do not electrically connect to the plurality of vertical signal lines.

Solution to Problem

Further, in the first aspect, the first substrate further comprises a pixel circuit and the second substrate further comprises a subsequent circuit.

Further, in the first aspect, pixel signals from the pixel circuit are transferred from the pixel circuit to the subsequent circuit.

Further, in the first aspect, the dummy pads are electrically floating.

Further, in the first aspect, the dummy pads are connected to a fixed potential.

Further, in the first aspect, the first pads are electrode pads and the second pads are dummy pads.

Further, in the first aspect, a number of the first and second vias equals a number of the third and fourth vias.

Further, in the first aspect, a number of the first and second vias is greater than a number of the third and fourth vias.

Further, in the first aspect, a number of the first and second vias is less than a number of the third and fourth vias.

Further, in the first aspect, the third vias and the fourth vias connect the second pads and the another of the plurality of first wiring layers and the another of the plurality of second wiring layers together.

Further, in the first aspect, the third vias connect the second pads and the another of the plurality of first wiring layers together.

Further, in the first aspect, the first and second vias have different sizes than the third and fourth vias.

Further, in the first aspect, a cross sectional shape of the first, second, third and fourth vias is either rectangular, circular or elliptical.

Further, in the first aspect, a number of the third vias is different than a number of the fourth vias.

In accordance with a second aspect of the present disclosure, there is provided an image sensor including a first substrate and a second substrate provided beneath the first substrate. The first substrate includes a first bonding area including electrode pads and a second bonding area including dummy pads. A plurality of first vias extend from the first bonding area of the first substrate and connect to the electrode pads and a plurality of second vias extend from the second bonding area of the first substrate and connect to the dummy pads. A number of the plurality of first vias is greater than a number of the plurality of second vias.

Further, in the second aspect, the electrode pads provide for electrical connection between the first substrate and the second substrate.

Further, in the second aspect, the electrode pads are provided within the first bonding area.

Further, in the second aspect, the dummy pads are provided within the second bonding area.

Further, in the second aspect, the dummy pads are electrically floating.

Further, in the second aspect, the dummy pads are connected to a fixed potential.

In accordance with a third aspect of the present disclosure, there is provided an image sensor including a first substrate and a second substrate provided beneath the first substrate. The first substrate includes a pair of first bonding areas including electrode pads and at least one second bonding area provided between the pair of first bonding areas including dummy pads. A plurality of first vias extend from the pair of first bonding areas of the first substrate and connected to the electrode pads and a plurality of second vias extend from the at least one second bonding area of the first substrate and connected to the dummy pads.

Further, in the third aspect, the at least one second bonding area is provided in a center portion of the first substrate.

Further, in the third aspect, the image sensor further includes another second bonding area provided above one of the pair of first bonding areas and a further second bonding area provided below the other of the pair of first bonding areas.

Further, in the third aspect, the second substrate includes a plurality of pairs of circuit components.

Further, in the third aspect, the plurality of pairs of circuit components are arranged such that first and second circuit components in one pair are transposed in another pair of adjacent circuit components.

BRIEF DESCRIPTION OF DRAWINGS

FIG. 1 is a block diagram showing a configuration example of an imaging system according to a first embodiment of the present disclosure.

FIG. 2 is a diagram showing an example of a stacked structure of a solid-state imaging apparatus according to the first embodiment of the present disclosure.

FIG. 3 is a block diagram showing a configuration example of the solid-state imaging apparatus according to the first embodiment of the present disclosure.

FIG. 4 is a plan view showing an example of a bonding surface of a light reception substrate in the first embodiment of the present disclosure.

FIG. 5 is a circuit diagram showing a configuration example of a pixel circuit on a vertical signal line (VSL) bonding area in the first embodiment of the present disclosure.

FIG. 6 is a circuit diagram showing a configuration example of a pixel circuit in a dummy area in the first embodiment of the present disclosure.

FIG. 7 is a plan view showing an example of the VSL bonding area and the dummy area in the first embodiment of the present disclosure.

FIG. 8 is an example of a cross-sectional view of the solid-state imaging apparatus according to the first embodiment of the present disclosure.

FIG. 9 is an example of a cross-sectional view of a solid-state imaging apparatus according to a Comparative Example.

FIG. 12 is a plan view showing an example of a VSL bonding area and a dummy area according to a first modified example of the first embodiment of the present disclosure.

FIG. 13 is a plan view showing an example of a VSL bonding area and a dummy area according to a second modified example of the first embodiment of the present disclosure.

FIG. 14 is an example of a cross-sectional view of a solid-state imaging apparatus according to the second modified example of the first embodiment of the present disclosure.

FIG. 15 is a plan view showing an example of a VSL bonding area and a dummy area in a third modified example of the first embodiment of the present disclosure.

FIG. 16 is an example of a cross-sectional view of a solid-state imaging apparatus according to the third modified example of the first embodiment of the present disclosure.

FIG. 17 is a plan view showing an example of a VSL bonding area and a dummy area in a second embodiment of the present disclosure.

FIG. 19 is a plan view showing an example of a VSL bonding area and a dummy area in a third embodiment of the present disclosure.

FIG. 20 is an example of a cross-sectional view of a solid-state imaging apparatus according to the third embodiment of the present disclosure.

FIG. 21 is a plan view showing an example of a VSL bonding area and a dummy area in a fourth embodiment of the present disclosure.

FIG. 22 is an example of a cross-sectional view of a solid-state imaging apparatus according to a fifth embodiment of the present disclosure.

FIG. 23 is an example of a cross-sectional view of a solid-state imaging apparatus according to a sixth embodiment of the present disclosure.

FIG. 24 is an example of a cross-sectional view of a solid-state imaging apparatus according to a seventh embodiment of the present disclosure.

FIG. 25 is an example of a cross-sectional view of a solid-state imaging apparatus according to an eighth embodiment of the present disclosure.

FIG. 26 is an example of a cross-sectional view of a solid-state imaging apparatus according to a ninth embodiment of the present disclosure.

FIG. 27 is a plan view showing an example of a bonding surface of a light reception substrate in a tenth embodiment of the present disclosure;

FIG. 28 is a diagram describing a configuration of a solid-state imaging apparatus according to a eleventh embodiment of the present disclosure.

FIG. 29 is a diagram describing circuits disposed on a light reception substrate and a circuit substrate in the eleventh embodiment of the present disclosure.

FIG. 30 is a plan view showing an example of a bonding surface of the light reception substrate in the eleventh embodiment of the present disclosure:

FIG. 31 is a diagram showing a circuit configuration of the solid-state imaging apparatus according to the eleventh embodiment of the present disclosure.

FIG. 32 is an example of a cross-sectional view of a solid-state imaging apparatus according to a twelfth embodiment of the present disclosure.

FIG. 33 is an example of a cross-sectional view of a solid-state imaging apparatus according to a thirteenth embodiment of the present disclosure.

FIG. 34 is an example of a perspective view of a solid-state imaging apparatus according to a fourteenth embodiment of the present disclosure.

FIG. 35 is a plan view showing an example of a bonding surface of a light reception substrate in the fourteenth embodiment of the present disclosure.

FIG. 36 is another example of a perspective view of the solid-state imaging apparatus according to the fourteenth embodiment of the present disclosure.

FIG. 37 is a plan view showing another example of the bonding surface of the light reception substrate in the fourteenth embodiment of the present disclosure.

FIG. 38 is another example of a perspective view of the solid-state imaging apparatus according to the fourteenth embodiment of the present disclosure.

FIG. 39 is another example of a perspective view of the solid-state imaging apparatus according to the fourteenth embodiment of the present disclosure.

FIG. 41 is an example of a cross-sectional view of a solid-state imaging apparatus according to a fifteenth embodiment of the present disclosure.

FIG. 42 is an example of a cross-sectional view of a solid-state imaging apparatus according to a sixteenth embodiment of the present disclosure.

FIG. 43 is another example of a cross-sectional view of the solid-state imaging apparatus according to the sixteenth embodiment of the present disclosure.

FIG. 44 is a block diagram depicting an example of schematic configuration of a vehicle control system.

FIG. 45 is a diagram explaining an example of installation positions of an outside-vehicle information detecting section and an imaging section.

DESCRIPTION OF EMBODIMENTS

Figure 10A:
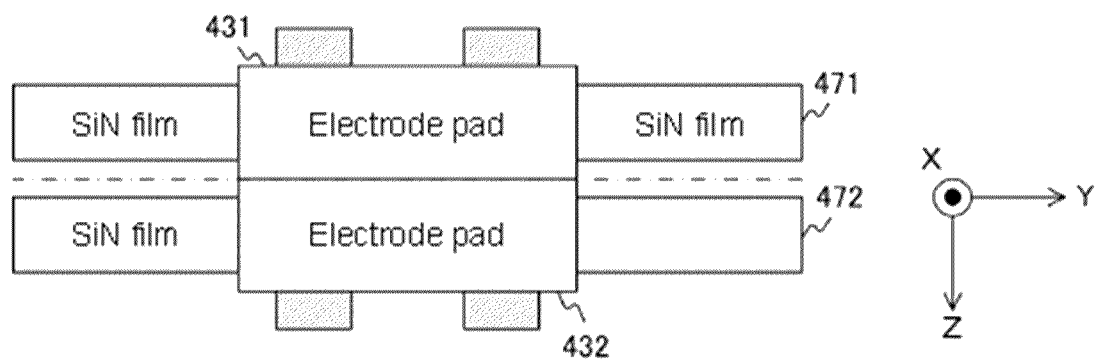
FIG. 10A is an enlarged view showing an example of the vicinity of the bonding surface in the first embodiment of the present disclosure.

Hereinafter, embodiments for carrying out the present disclosure (hereinafter, referred to as embodiments) will be described. The description will be made in the following order.

1. First Embodiment (example in which hydrogen is uniformly supplied by way of a via)

2. Second Embodiment (example in which a via is connected to a part of a dummy pad and hydrogen is uniformly supplied)

3. Third Embodiment (example in which hydrogen is uniformly supplied by way of a plurality of vias having different cross-sectional areas)

4. Fourth Embodiment (example in which hydrogen is uniformly supplied by way of a circular via)

5. Fifth Embodiment (example in which hydrogen is uniformly supplied to a circuit by way of a via)

6. Sixth Embodiment (example in which hydrogen is uniformly supplied by way of vias on the light reception side and the circuit side)

7. Seventh Embodiment (example in which hydrogen is uniformly supplied by way of a medium and a via)

8. Eighth Embodiment (example in which hydrogen is uniformly supplied by way of a via penetrating a bonding surface)

9. Ninth Embodiment (example in which hydrogen is uniformly supplied also to areas other than a pixel area by way of a via)

10. Tenth Embodiment (example in which a dummy pad is disposed in a pixel area and hydrogen is uniformly supplied by way of a via)

11. Eleventh Embodiment (example in which analog-to-digital conversion is performed for each area and hydrogen is uniformly supplied by way of a via)

12. Twelfth Embodiment (example in which hydrogen is uniformly supplied by way of a via in a three-layer stacked structure including a memory substrate)

13. Thirteenth Embodiment (example in which hydrogen is uniformly supplied by way of a via in a three-layer stacked structure including a pixel substrate)

14. Fourteenth Embodiment (example in which a plurality of vertical drive circuits is disposed and hydrogen is uniformly supplied by way of a via)

15. Fifteenth Embodiment (example in which an electrode pad is disposed in an area other than a pixel array unit and hydrogen is uniformly supplied by way of a via)

16. Sixteenth Embodiment (example in which hydrogen is uniformly supplied by way of a via in a three-layer stacked structure)

17. Application Example to Moving Objects

1. First Embodiment

Configuration Example of Imaging Apparatus

FIG. 1 is a block diagram showing a configuration example of an imaging system 100 according to a first embodiment of the present disclosure. The imaging system 100 is for acquiring image data by imaging, and includes an optical unit 110, a solid-state imaging apparatus 200, and a digital signal processing (DSP) circuit 120. Further, the imaging system 100 includes a display unit 130, an operation unit 140, a bus 150, a frame memory 160, a storage unit 170, and a power source unit 180. As the imaging system 100, a camera to be installed in a smartphone, an in-vehicle camera, or the like is assumed.

The optical unit 110 collects light from an object and guides the collected light to the solid-state imaging apparatus 200. The solid-state imaging apparatus 200 generates image data by photoelectric conversion. The solid-state imaging apparatus 200 supplies the generated image data to the DSP circuit 120 by way of a signal line 209.

The DSP circuit 120 executes predetermined signal processing on the image data. The DSP circuit 120 outputs the processed image data to the frame memory 160 or the like by way of the bus 150. Note that the DSP circuit 120 is an example of a signal processing circuit.

The display unit 130 displays the image data. As the display unit 130, for example, a liquid crystal panel or an organic electroluminescence (EL) panel is assumed. The operation unit 140 generates an operation signal in accordance with a user operation.

The bus 150 is a common path for the optical unit 110, the solid-state imaging apparatus 200, the DSP circuit 120, the display unit 130, the operation unit 140, the frame memory 160, the storage unit 170, and the power source unit 180 to transmit/receive data to/from each other.

The frame memory 160 holds the image data. The storage unit 170 stores various types of data such as image data. The power source unit 180 supplies power to the solid-state imaging apparatus 200, the DSP circuit 120, the display unit 130, and the like.

Configuration Example of Solid-State Imaging Apparatus

FIG. 2 is a diagram showing an example of a stacked structure of the solid-state imaging apparatus 200 according to the first embodiment of the present disclosure. The solid-state imaging apparatus 200 includes a circuit substrate 202, and a light reception substrate 201 stacked on the circuit substrate 202.

Hereinafter, a predetermined axis parallel to the substrate plane of the light reception substrate 201 and the circuit substrate 202 is defined as an X axis and an axis orthogonal to the substrate plane is defined as a Z axis. Further, an axis orthogonal to the X axis and the Z axis is defined as a Y axis. A plurality of vertical signal lines VSL is wired on the light reception substrate 201 along the Y-axis direction. The vertical signal lines VSL are electrical connected to a circuit in the circuit substrate 202 by way of vias by Cu—Cu bonding.

FIG. 3 is a block diagram showing a configuration example of the solid-state imaging apparatus 200 according to the first embodiment of the present disclosure. The solid-state imaging apparatus 200 includes a vertical drive circuit 210, a timing control circuit 220, a north horizontal drive circuit 231, a north column signal processing circuit 241, a pixel array unit 250, a south column signal processing circuit 242, and a south horizontal drive circuit 232. In addition, the solid-state imaging apparatus 200 further includes a power supply circuit 270 and an output unit 280.

A plurality of pixel circuits 260 is arranged in a two-dimensional lattice in the pixel array unit 250. Hereinafter, a set of the pixel circuits 260 arranged in the X axis direction will be referred to as "row" and a set of the pixel circuits 260 arranged in the Y axis will be referred to as "column".

The pixel circuits 260 each generate a pixel signal by performing photoelectric conversion on incident light.

The vertical drive circuit 210 sequentially selects and drives rows and causes each of the rows to output a pixel signal. The pixel circuits 260 in one (e.g., the odd rows) of the odd rows or the even rows each output a pixel signal to the north column signal processing circuit 241, and the other pixel circuits 260 (e.g., in the even rows) each output a pixel signal to the south column signal processing circuit 242.

The timing control circuit 220 controls the operation timing of each of the vertical drive circuit 210, the north horizontal drive circuit 231, the north column signal processing circuit 241, the south column signal processing circuit 242, and the south horizontal drive circuit 232.

The north column signal processing circuit 241 executes signal processing such as analog-to-digital (AD) conversion processing and correlated double sampling (CDS) processing on the pixel signal from the corresponding row (e.g., odd row) for each column. The north column signal processing circuit 241 outputs the processed pixel signal to the output unit 280 in accordance with control by the north horizontal drive circuit 231.

The south column signal processing circuit 242 executes signal processing such as AD conversion processing and CDS processing on the pixel signal from the corresponding row (e.g., even row) for each column. The south column signal processing circuit 242 outputs the processed pixel signal to the output unit 280 in accordance with control by the south horizontal drive circuit 232.

The north horizontal drive circuit 231 controls the north column signal processing circuit 241 to sequentially output the pixel signal in the row. The south horizontal drive circuit 232 controls the south column signal processing circuit 242 to sequentially output the pixel signal in the row.

The power supply circuit 270 supplies power to the pixel array unit 250 and the like. The output unit 280 outputs image data in which pixel signals are arranged.

Further, the pixel array unit 250 is disposed on the light reception substrate 201, and circuits such as the vertical drive circuit 210 other than the pixel array unit 250 are disposed on the circuit substrate 202. The dot-dash line in FIG. 3 indicates the bonding surface between the substrates. Note that although the pixel array unit 250 is disposed on the light reception substrate 201 and other circuits are disposed on the circuit substrate 202, the circuits to be disposed on the respective substrates are not limited to this configuration. For example, even components such as comparators in the north column signal processing circuit 241 and the south column signal processing circuit 242 can be disposed on the light reception substrate 201.

Further, although both the north column signal processing circuit 241 and the south column signal processing circuit 242 are disposed, only one of the circuits can be disposed. In this case, only corresponding one of the north horizontal drive circuit 231 and the south horizontal drive circuit 232 is disposed.

FIG. 4 is a plan view showing an example of the bonding surface of the light reception substrate 201 in the first embodiment of the present disclosure. Hereinafter, of both surfaces of the light reception substrate 201, the surface opposed to the bonding surface will be referred to as the "light reception surface". On the light reception surface, the plurality of pixel circuits 260 described above is arranged.

On the bonding surface of the light reception substrate 201, drive line bonding areas 311 and 312, power line bonding areas 313 and 316, a VSL bonding area 314, and dummy areas 321 and 322 are provided. The VSL bonding area 314 can be disposed at the center. In another words, the VSL bonding area 314 can be disposed between the dummy areas 321 and 322. Further, with the side of the light reception surface as the upper side, the VSL bonding area 314 and the dummy areas 321 and 322 are disposed below the pixel array unit 250. The configuration of the bonding surface of the circuit substrate 202 (illustrated in FIG. 2) is the same as that of the bonding surface of the light reception substrate 201.

In the VSL bonding area 314, for example, a plurality of electrode pads 431 each formed of copper is arranged. The electrode pads 431 are disposed below different pixel circuits 260. Further, the electrode pads 431 are each connected to a vertical signal line and a power source line by way of a via. Further, the electrode pads 431 are bonded to electrode pads on the side of the circuit substrate 202, and the light reception substrate 201 and the circuit substrate 202 are electrically connected to each other by way of the electrode pads. The north column signal processing circuit 241 and the south column signal processing circuit 242 are connected to the electrode pads 431 of the VSL bonding area 314. Note that the material of the electrode pad is not limited to copper, and another metal material such as gold, a conductive material, or the like may be used. Further, although the diameter of the via is smaller than the diameter of the pad in FIG. 4 as viewed from the X axis direction, the present disclosure is not limited to this configuration. The diameter of the via may be larger than, the same as, or smaller than the diameter of the pad as viewed from the X axis direction and the Y axis direction.

A plurality of electrode pads is also formed in the drive line bonding areas 311 and 312, and the electrode pads are each connected to a drive line by way of a via. Note that the drive line is a signal line for transmitting a drive signal for driving the pixel circuit 260.

A plurality of electrode pads is also formed in the power line bonding areas 313 and 316, and the electrode pads are each connected to a power source line and a ground line by way of a via.

A plurality of dummy pads 441 each formed of copper is arranged in each of the dummy areas 321 and 322. The dummy pads 441 are disposed below different pixel circuits 260. Further, although the dummy pads 441 are bonded to dummy pads on the side of the circuit substrate 202, the dummy pads 441 are not used for electrical connection between the light reception substrate 201 and the circuit substrate 202 unlike the electrode pads 431. The dummy pads are connected to other than the VSL (e.g., VDD, Ground) and or, are electrically floating. In other words, the dummy pads 441 are not used for electrical connection. However, by bonding the dummy pads 441 to each other in addition to the electrode pads 431, it is possible to improve the bonding strength and suppress the warpage of the substrate.

Configuration Example of Pixel Circuit

FIG. 5 is a circuit diagram showing a configuration example of the pixel circuit 260 on the VSL bonding area 314 in the first embodiment of the present disclosure. The pixel circuit 260 includes a photoelectric conversion device 261, a transfer transistor 262, a reset transistor 263, a floating diffusion layer 264, an amplification transistor 265, and a selection transistor 266.

Further, on the light reception surface of the pixel array unit 250, a pair of vertical signal lines VSL is wired along the Y axis direction for each column. One of the pair of vertical signal lines VSL is connected to the odd row, and the other of the pair of vertical signal lines VSL is connected to the even row. Further, on the light reception surface of the pixel array unit 250, drive lines 217 to 219 are wired along the X axis direction for each row.

The photoelectric conversion device 261 generates charges by photoelectrically converting incident light. The transfer transistor 262 transfers the charges from the photoelectric conversion device 261 to the floating diffusion layer 264 in accordance with a drive signal TRG. The drive signal TRG is supplied from the vertical drive circuit 210 by way of the drive line 218.

The reset transistor 263 performs initialization by extracting the charges from the floating diffusion layer 264 in accordance with a drive signal RST. The drive signal RST is supplied from the vertical drive circuit 210 by way of the drive line 217.

The floating diffusion layer 264 accumulates charges and generates a voltage corresponding to the amount of charges. The amplification transistor 265 amplifies the voltage of the floating diffusion layer 264.

The selection transistor 266 outputs, as a pixel signal, the signal of the amplified voltage to the north column signal processing circuit 241 or the south column signal processing circuit 242 by way of the vertical signal line VSL in accordance with a drive signal SEL. The drive signal SEL is supplied from the vertical drive circuit 210 by way of the drive line 219.

Further, the pixel circuits 260 on the VSL bonding area 314 are connected to the electrode pads 431 by way of the vertical signal lines VSL and vias. The electrode pads 431 are bonded to electrode pads 432 on the side of the circuit substrate 202. By way of the pads and the vias, one of the pair of vertical signal lines VSL is connected to the north column signal processing circuit 241, and the other vertical signal line VSL is connected to the south column signal processing circuit 242. Note that in the case of providing only one of the north column signal processing circuit 241 and the south column signal processing circuit 242, only one vertical signal line VSL is wired for each column.

Further, a connection node between a power source line 279 for supplying a power supply voltage VDD and the pixel circuit 260 is connected to the power supply circuit 270 on the side of the circuit substrate 202 by way of a via, the electrode pad 431, and the electrode pad 432.

FIG. 6 is a circuit diagram showing a configuration example of the pixel circuit 260 on a dummy area 322 in the first embodiment of the present disclosure. A via is disposed at a connection node between the pixel circuit 260 on or above the dummy area 322 and the vertical signal line VSL. However, the via in the dummy area 322 is not electrically connected to the circuit substrate 202 unlike the via in the VSL bonding area 314.

Further, the pixel circuit 260 on the dummy area 322 is connected to the dummy pad 441 by way of the power source line 279 and the via. The dummy pad 441 is bonded to a dummy pad 442 on the side of the circuit substrate 202. Note that the configuration of the pixel circuit 260 is not limited to the circuit illustrated in FIG. 5 or FIG. 6. For example, a selection transistor does not necessarily need to be disposed in the pixel circuit 260.

FIG. 7 is a plan view showing an example of the VSL bonding area 314 and the dummy area 322 in the first embodiment of the present disclosure. In the VSL bonding area 314, the plurality electrode pads 431 is arranged, and a predetermined number (e.g., four) of vias 423 is connected to the electrode pads 431. Note that the number of the vias 423 for each of the electrode pads 431 is not limited to four.

Meanwhile, the plurality of dummy pads 441 is arranged in the dummy area 322, and a different number (e.g., two) of the vias 424 is connected to each of the dummy pads 441. The number of the vias 424 is different from that of the electrode pads 431.

Further, for all the dummy pads 441, the number of vias to be connected is the same. Further, the cross-sectional area and the cross-sectional shape of each of the vias 423 and 424 are the same. For example, the cross-sectional shape of each via is rectangular.

In the case of a plurality of films stacked on the light reception substrate 201, the films themselves contain hydrogen in some cases. Further, hydrogen is mixed in the hydrogen sintering process in some cases. Depending on the situations, the number of vias of the electrode pads 431 or the dummy pads 441 is adjusted so that the amount of hydrogen to be supplied to each of the plurality of pixel circuits 260 is uniform.

FIG. 8 is an example of a cross-sectional view of the solid-state imaging apparatus 200 according to the first embodiment of the present disclosure. The cross-sectional view in FIG. 8 is a cross-sectional view if the solid-state imaging apparatus 200 cut along the line segment Y1-Y2 in FIG. 7.

In the light reception substrate 201, with the side of the light reception surface as the upper side, a wiring layer 420 is provided above the electrode pad 431. The wiring layer 420 includes a single insulation film or a plurality of insulation films, and a single wiring layer or a plurality of wiring layers. In areas in which the electrode pads are not bonded to each other, the upper and lower insulation films are connected to each other. Further, in the wiring layer 420, a metal wiring 421 such as a vertical signal line and a power source line is wired along the Y axis direction, and a transistor 417 such as a transfer transistor is disposed. Further, the vertical signal line and the like and the electrode pad 431 are connected to each other by way of the via 423. Further, a photodiode 415 is formed above the via 423, and a color filter 413 is formed above the photodiode 415. An on-chip lens 411 is formed above the color filter 413. The photodiode 415 and the transistor 417 constitute the pixel circuit 260. The wiring layer 420 includes the plurality of metal wirings 421 and 422. Each of the plurality of the metal wirings 421 are connected by way of the vias 423, and each of the plurality of the metal wirings 422 are connected by way of the vias 424. Further, the wiring layer 450 includes the plurality of metal wirings 451 and 452. Each of the plurality of metal wirings 451 are connected by way of the vias 453, and each of the plurality of the metal wirings 452 are connected by way of the vias 454.

Meanwhile, the wiring layer 420 is provided also above the dummy pad 441. In the wiring layer 420, a metal wiring 422 such as a power source line is wired along the Y axis direction or the X axis direction, and a transistor 418 such as a transfer transistor is disposed. Further, the power source line and the dummy pad 441 are connected to each other by way of the via 424. Further, a photodiode 416 is formed above the via 424, and a color filter 414 is formed above the photodiode 416. An on-chip lens 412 is formed above the color filter 414. The photodiode 416 and the transistor 418 constitute the pixel circuit 260.

In the circuit substrate 202, with the side of the light reception surface as the upper side, a wiring layer 450 is provided below the electrode pad 432. In the wiring layer 450, a metal wiring 451 is wired, and a transistor 455 is provided. A via 453 is connected to the electrode pad 432. Further, a subsequent circuit 461 such as an A/D converter (ADC) in the north column signal processing circuit 241 is disposed below the via 453. The via 453 connects the electrode pad 432 and the circuit such as the subsequent circuit 461 to each other.

Meanwhile, the wiring layer 450 is provided also below the dummy pad 442. In the wiring layer 450, a metal wiring 452 is wired, and the transistor 456 and a via 454 are disposed. However, the via 454 is not connected to the dummy pad 442. Further, a subsequent circuit 462 such as an ADC in the north column signal processing circuit 241 is disposed below the via 454.

As described above, of both surfaces of the light reception substrate 201, on the light reception surface opposed to the bonding surface, the plurality pixel circuits 260 is arranged. In the process (hydrogen sintering process or the like) when bonding the light reception substrate 201 and the circuit substrate 202 to each other, hydrogen or the like is mixed in the vicinity of the bonding surface in some cases. The hydrogen or the like is known to terminate the dangling bond of silicon as disclosed in Japanese Patent Application Laid-open No. 2001-267547. Due to this property, in the case where the hydrogen or the like is supplied to the semiconductor device (photoelectric conversion device or transistor) in the pixel circuits 260, a dark current that occurs in the pixel circuit 260 is suppressed in accordance with the amount of supplied hydrogen or the like.

As illustrated in FIG. 8, the via 423 connects the electrode pad 431 and the pixel circuit 260 above the electrode pad 431 to each other, and causes a pixel signal to be transmitted through the via 423. The via 424 connects the dummy pad 441 and the pixel circuit 260 above the dummy pad 441 to each other. In other words, the via 423 connects, by way of the electrode pad 431, the pixel circuit 260 above the electrode pad 431 and the VSL bonding area 314 on the bonding surface to each other, and the via 424 connects, by way of the dummy pad 441, the pixel circuit 260 above the dummy pad 441 and the dummy area 322 on the bonding surface to each other.

Since hydrogen is contained in the vicinity of the bonding surface due to the process at the time of bonding, hydrogen is supplied to the pixel circuit 260 above the electrode pad 431 by way of the via 423, and hydrogen is supplied also to the pixel circuit 260 above the dummy pad 441 by way of the via 424. As a result, the amount of hydrogen supplied to each of the plurality of pixel circuits 260 is constant, and the amount of dark current generated in each circuit is constant. Further, by connecting also the via 424 to the dummy pad 441, the uniformity of the opening of the via is improved, and process variations can be suppressed. Further, it is possible to suppress the plasma damage and improve the yield.

Further, the electrode pad for dummy bonding floats if no via is provided. By additionally disposing a via, it is possible to connect the electrode pad (e.g., the dummy pad 441) for dummy bonding to, for example, a fixed potential (VDD), an arbitrary potential, a ground potential (GND), or the like. As a result, it is possible to stabilize the electrode for dummy bonding in potential, and the electrical characteristics are improved. Examples of the method of connecting the electrode pad for dummy bonding to a fixed potential, an arbitrary potential, or a ground potential include a method of directly connecting a via to the potential. Further, by additionally disposing a via, it is possible to connect the electrode pad to another wiring by way of the via. By connecting the wiring connected to a contact terminal opposite to the electrode pad, of contact terminals of the via, to an arbitrary potential, the electrode pad may be connected to the potential by way of the via.

Note that the light reception substrate 201 is an example of a first semiconductor substrate, and the circuit substrate 202 is an example of a second semiconductor substrate. The pixel circuit 260 is an example of a first circuit. The subsequent circuit 461 is an example of a second circuit. The electrode pad 431 is an example of a first electrode pad. The dummy pad 441 is an example of a second electrode pad. The electrode pad 432 is an example of a third electrode pad, and the dummy pad 442 is an example of a fourth electrode pad. The wiring layer 420 is an example of a first wiring layer, and the wiring layer 450 is an example of a second wiring layer. The via 423 is an example of a first via, and the via 453 is an example of a second via. The via 424 is an example of a third via.

Further, although hydrogen is assumed as an atom that terminates the dangling bond of silicon, an atom other than hydrogen has a property that terminates the dangling bond of silicon in some cases. For this reason, the number of vias can be adjusted so that the supply amount of the atom other than hydrogen, which terminates the dangling bond of silicon, is uniform. Examples of the atom that terminates the dangling bond of silicon include hydrogen (H), fluorine (F), nitrogen (N), oxygen (O), and carbon (C). Other examples of such an atom include, but not limited to, elements of Group 13 to Group 17.

Next, a Comparative Example in which the via 424 is not connected to the dummy pad 441 will be considered.

FIG. 9 is an example of a cross-sectional view of a solid-state imaging apparatus according to a Comparative Example. As illustrated in FIG. 9, in the case where the via 424 is not connected to the dummy pad 441, the amount of hydrogen supplied to the pixel circuit 260 above the dummy pad 441 is reduced as compared with the amount of hydrogen supplied to the pixel circuit 260 above the electrode pad 431. For this reason, the amount of hydrogen supplied to each of the plurality of pixel circuits 260 is non-uniform, and a difference occurs in the amount of dark current generated in each circuit. As a result, noise due to the difference in dark current occurs, which reduces the image quality of image data.

Figure 10B:
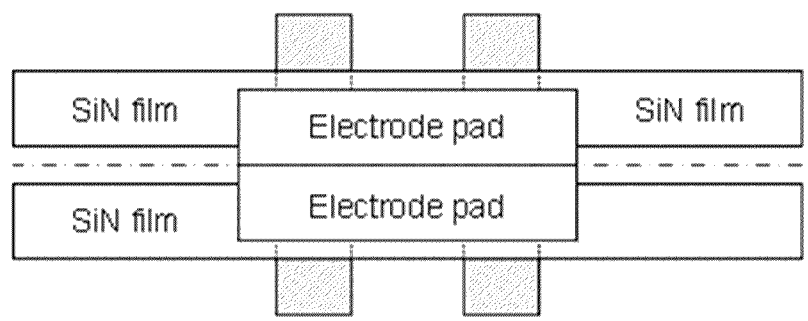
FIG. 10B is an enlarged view showing an example of the vicinity of the bonding surface in Comparative Example.

FIGS. 10A and 10B are enlarged views each showing an example of the vicinity of the bonding surface in the first embodiment of the present disclosure or the Comparative Example. FIG. 10A is an enlarged view showing an example of the vicinity of the bonding surface in the first embodiment of the present disclosure. FIG. 10B is an enlarged view showing an example of the vicinity of the bonding surface in the Comparative Example.

As shown in FIG. 10A, a silicon nitride (SiN) film 471 is formed on the bonding surface on the light reception side in order to suppress warpage of the light reception substrate 201. The electrode pad 431 is formed by breaking through the SiN film 471. In other words, the electrode pad 431 penetrates the SiN film 471.

Similarly, a SiN film 472 is formed on the bonding surface on the circuit side, and the electrode pad 432 is formed by breaking through the SiN film 472.

As disclosed in Japanese Patent Application Laid-open No. 2018-078305, the SiN films 471 and 472 are used for suppressing warpage. However, the SiN film 471 and the like each have a property to block hydrogen as disclosed in Japanese Patent Application Laid-open No. 2004-165236. For this reason, in the case where the SiN film 472 is not broken through as illustrated in FIG. 10B, there is a possibility that hydrogen is not supplied to the pixel circuit 260 and a dark current is not sufficiently suppressed. Therefore, in the case of forming a SiN film, it is favorable that the electrode pad breaks through the SiN film.

Figure 11A:
FIG. 11A is a diagram showing an example of image data in the first embodiment of the present disclosure.
Figure 11B:
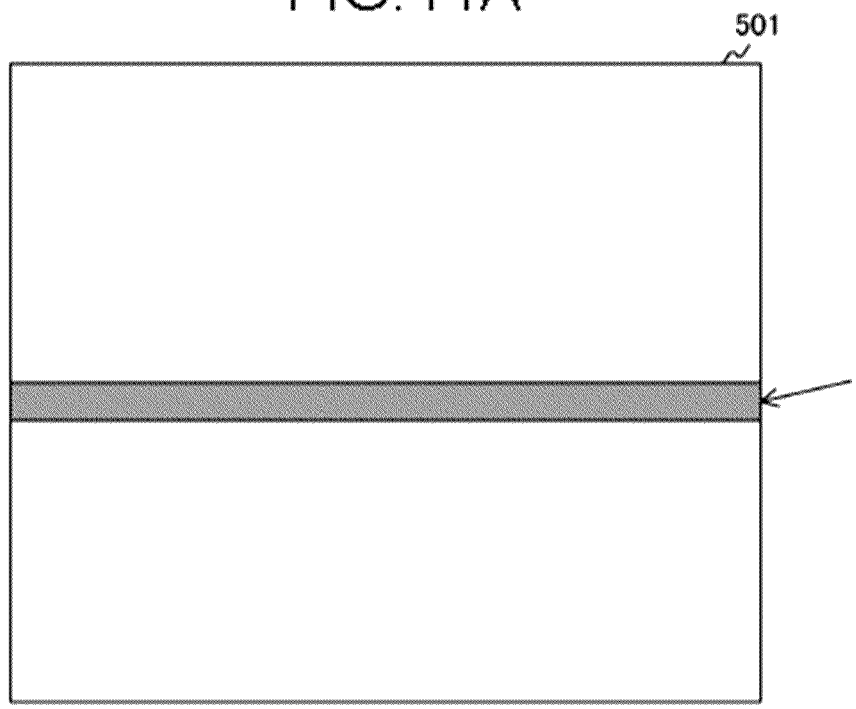
FIG. 11B is a diagram showing an example of image data in Comparative Example.

FIGS. 11A and 11B are diagrams that each shows an example of image data in the first embodiment of the present disclosure or the Comparative Example. FIG. 11A is a diagram showing image data 500 obtained by performing imaging in a dark state in the first embodiment of the present disclosure. FIG. 11B is a diagram showing an example of the image data 501 acquired by performing imaging in a dark state in the Comparative Example in which the via is not connected to the dummy pad.

In the case where the via is connected to the dummy pad, hydrogen is supplied also to the pixel circuit 260 above the dummy pad by way of the via. For this reason, the amount of hydrogen supplied to each of the plurality of pixel circuits 260 is uniform and the amount of dark current generated in each circuit is uniform. As a result, as illustrated in FIG. 11A, streaking does not occur the image data 500, which makes it possible to improve the image quality.

Meanwhile, in the case where the via is not connected to the dummy pad, hydrogen is not supplied to the pixel circuit 260 above the dummy pad. For this reason, the amount of hydrogen supplied to each of the plurality of pixel circuits 260 is non-uniform and the amount of dark current generated in each circuit is non-uniform. As a result, as shown in FIG. 11B, streak noise occurs in the VSL bonding area 314 in image data 501, which degrades the image quality.

As described above, in accordance with the first embodiment of the present disclosure, since the vias 424 connect the pixel circuits 260 and the dummy area 322 on the bonding surface to each other by way of the dummy pads 441, it is possible to make the amount of hydrogen supplied to each of the plurality of pixel circuits 260 uniform. As a result, the amount of generated dark current becomes uniform, and it is possible to improve the image quality of image data.

First Modified Example

The amount of hydrogen to be supplied has been made uniform by using two vias of the dummy pad 441 in the above-mentioned first embodiment. However, in the case where the number of vias is two, the amount of supplied hydrogen is excessive in some cases. The solid-state imaging apparatus 200 according to a first modified example of the first embodiment is different from the solid-state imaging apparatus 200 according to the first embodiment in that the number of vias of the dummy pads 441 is reduced to reduce the amount of hydrogen to be supplied.

FIG. 12 is a plan view showing an example of the VSL bonding area 314 and the dummy area 322 in the first modified example of the first embodiment of the present disclosure. The solid-state imaging apparatus 200 according to the first modified example of the first embodiment is different from that according to the first embodiment in that the number of vias of the dummy pad 441 is one. By reducing the number of vias of the dummy pad 441 by one, it is possible to reduce the amount of hydrogen to be supplied to the pixel circuit 260 above the dummy pad 441.

In accordance with the first modified example of the first embodiment of the present disclosure, since the number of vias of the dummy pad 441 is reduced, it is possible to reduce the amount of hydrogen to be supplied to the pixel circuit 260 above the dummy pad 441.

Second Modified Example

The amount of hydrogen to be supplied has been made uniform by using two vias of the dummy pad 441 in the above-mentioned first embodiment. However, in the case where the number of vias is two, the amount of supplied hydrogen is insufficient in some cases. The solid-state imaging apparatus 200 according to a second modified example of the first embodiment is different from that according to the first embodiment in that the number of vias of the dummy pad 441 is increased to increase the amount of hydrogen to be supplied.

FIG. 13 is a plan view showing an example of the VSL bonding area 314 and the dummy area 322 in the second modified example of the first embodiment of the present disclosure.

FIG. 14 is an example of a cross-sectional view of the solid-state imaging apparatus 200 according to the second modified example of the first embodiment of the present disclosure.

As illustrated in FIG. 13 and FIG. 14, the solid-state imaging apparatus 200 according to the second modified example of the first embodiment is different from that according to the first embodiment in that the number of vias of the dummy pad 441 is four which is similar in number to the electrode pad 431. By increasing the number of vias of the dummy pad 441, it is possible to increase the amount of hydrogen to be supplied to the pixel circuit 260 above the dummy pad 441.

Note that the number of vias per dummy pad 441 is not limited to one, two, or four, and may be three.

As described above, in accordance with the second modified example of the first embodiment of the present disclosure, since the number of vias of the dummy pad 441 is increased, it is possible to increase the amount of hydrogen to be supplied to the pixel circuit 260 above the dummy pad 441.

Third Modified Example

The number of vias of the dummy pad 441 has been increased to four in the above-mentioned second modified example of the first embodiment. However, in the case where the number of vias is four, the amount of hydrogen is insufficient in some cases. The solid-state imaging apparatus 200 according to a third modified example of the first embodiment is different from that according to the second modified example of the first embodiment in that the number of vias of the dummy pad 441 is further increased.

FIG. 15 is a plan view showing an example of the VSL bonding area 314 and the dummy area 322 in the third modified example of the first embodiment of the present disclosure.

FIG. 16 is an example of a cross-sectional view of the solid-state imaging apparatus 200 according to the third modified example of the first embodiment of the present disclosure.

As illustrated in FIG. 15 and FIG. 16, the solid-state imaging apparatus 200 according to the third modified example of the first embodiment is different from that according to the first embodiment in that the number of vias of the dummy pad 441 is nine. By increasing the number of vias of the dummy pad 441, it is possible to increase the amount of hydrogen to be supplied to the pixel circuit 260 above the dummy pad 441.

Note that the number of vias per dummy pad 441 is not limited to four or nine, and may be five to eight.

As described above, in accordance with the third modified example of the first embodiment of the present disclosure, since the number of vias of the dummy pad 441 is further increased, it is possible to further increase the amount of hydrogen to be supplied to the pixel circuit 260 above the dummy pad 441.

2. Second Embodiment

The number of vias to be connected to the dummy pads 441 has been the same for all the dummy pads 441 in the above-mentioned first embodiment. However, it is unnecessary to provide a via depending on the position of the dummy pad in some cases. The solid-state imaging apparatus 200 according to a second embodiment is different from that according to the first embodiment in that a dummy pad to which a via is connected and a dummy pad to which a via is not connected are disposed.

FIG. 17 is a plan view showing an example of the VSL bonding area 314 and the dummy area 322 in the second embodiment of the present disclosure. The dummy area 322 in the second embodiment is different from that in the first embodiment in that a plurality of dummy pads 441 and a plurality of dummy pad 442 are arranged.

It is unnecessary to supply hydrogen to each of the dummy pads 441 disposed at the respective positions, and a via is not connected to the dummy pad. Meanwhile, it is necessary to supply hydrogen to each of the dummy pads 442 disposed at the respective positions, and the number of vias of the dummy pad is four or the like. By adjusting the number of vias as described above, it is possible to make the amount of hydrogen to be supplied uniform.

Note that the dummy pad 441 is an example of a first dummy pad, and the dummy pad 442 is an example of a second dummy pad.

As described above, in accordance with the second embodiment of the present disclosure, since the dummy pad 441 to which a via is not connected and the dummy pad 442 to which a via is connected are arranged, it is possible to adjust the amount of hydrogen to be supplied and make it uniform.

Modified Example

A dummy pad to which a via is not connected and a dummy pad to which a via is connected have been arranged in the above-mentioned second embodiment. However, there is a possibility that the amount of hydrogen to be supplied of the dummy pad to which a via is not connected is insufficient. The solid-state imaging apparatus 200 according to a modified example of the second embodiment is different from that according to the second embodiment in that two or more types of dummy pads having a different number of vias are arranged.

Figure 18A:
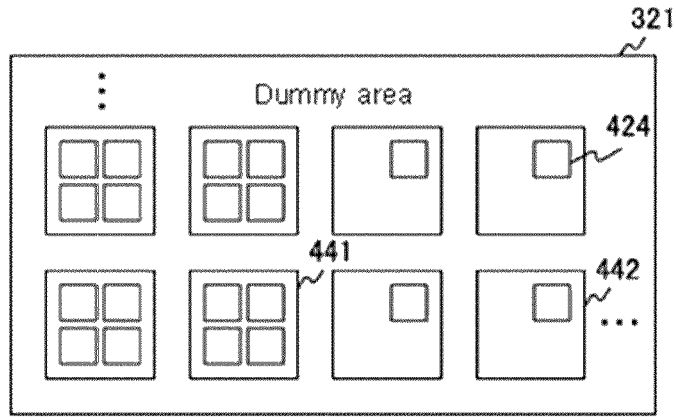
FIG. 18A is a plan view showing an example of a dummy area in a modified example of the second embodiment of the present disclosure.
Figure 18B:
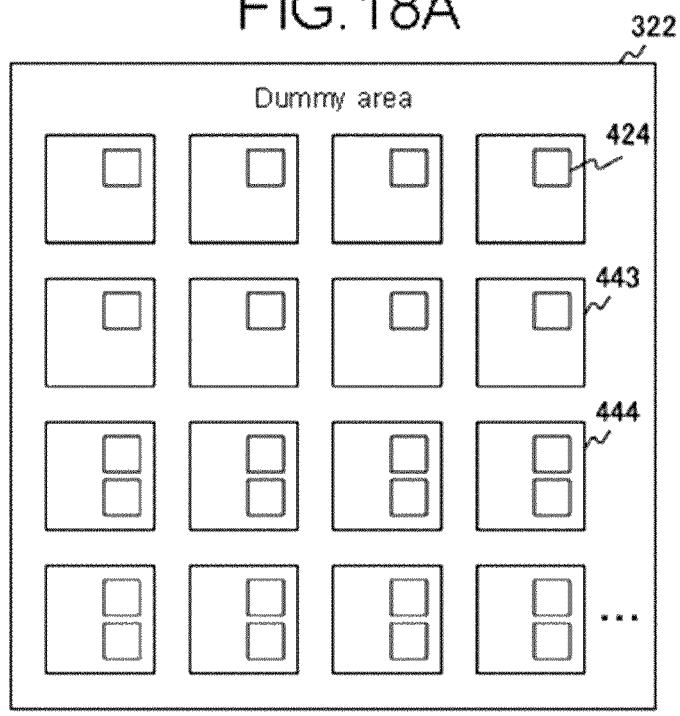
FIG. 18B is a plan view showing an example of a dummy area in the modified example of the second embodiment of the present disclosure.
Figure 18C:
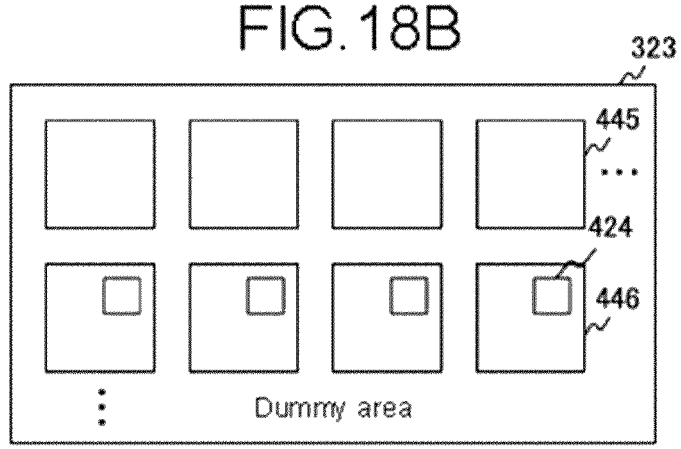
FIG. 18C is a plan view showing an example of a dummy area in the modified example of the second embodiment of the present disclosure.

FIGS. 18A-18C are each plan views showing an example of the dummy area 321, 322, and 323, respectively, in a modified example of the second embodiment of the present disclosure. FIG. 18A is a plan view showing an example of the dummy area 321. FIG. 18B is a plan view showing an example of the dummy area 322. FIG. 18C is a plan view showing an example of the dummy area 323.

The number of vias per dummy pad is adjusted so that the amount of hydrogen to be supplied is uniform. For example, as illustrated in FIG. 18A, the dummy pads 441 and 442 are arranged in the dummy area 321. The number of vias to be connected to the dummy pad 441 is, for example, four, and the number of vias to be connected to the dummy pad 442 is a number (e.g., one) different from the number of vias to be connected to the dummy pad 441.

Note that the dummy pad 441 is an example of a first dummy pad, and the dummy pad 442 is an example of a second dummy pad.

As illustrated in FIG. 18B, dummy pads 443 and 444 are arranged in the dummy area 322. The number of vias to be connected to the dummy pad 443 is, for example, one, and the number of vias to be connected to the dummy pad 444 is a number (e.g., two) different from the number of vias to be connected to the dummy pad 443.

As illustrated in FIG. 18C, dummy pads 445 and 446 are arranged in the dummy area 323. A via is not connected to the dummy pad 445, and the number of vias of the dummy pad 446 is, for example, one.

As described above, in accordance with the modified example of the second embodiment of the present disclosure, since a plurality of types of dummy pads to which a different number of vias is connected are arranged, it is possible to make the amount of hydrogen to be supplied uniform by adjusting the number of vias.

3. Third Embodiment

The cross-sectional area of the via 423 of the electrode pad 431 and the cross-sectional area of the via 424 of the dummy pad 441 have been the same in the above-mentioned first embodiment. In this configuration, the amount of hydrogen of the via to be supplied is non-uniform in some cases. The solid-state imaging apparatus 200 according to a third embodiment is different from that according to the first embodiment in that the cross-sectional area of the via 423 of the electrode pad 431 and the cross-sectional area of the via 424 of the dummy pad 441 differ.

FIG. 19 is a plan view showing an example of the VSL bonding area 314 and the dummy area 322 in the third embodiment of the present disclosure.

FIG. 20 is an example of a cross-sectional view of the solid-state imaging apparatus 200 according to the third embodiment of the present disclosure.

As illustrated in FIG. 19 and FIG. 20, the cross-sectional area of the via 423 of the electrode pad 431 and the cross-sectional area of the via 424 of the dummy pad 441 differ. For example, the cross-sectional area of the via 424 is larger than that of the via 423. Further, the number of vias of the electrode pad 431 is four, and the number of vias of the dummy pad 441 is one. The number and cross-sectional area of each of the vias 423 and 424 are adjusted so that the amount of hydrogen to be supplied is uniform.

As described above, in accordance with the third embodiment of the present disclosure, since the cross-sectional area of the via 423 of the electrode pad 431 and the cross-sectional area of the via 424 of the dummy pad 441 differ, it is possible to make the amount of hydrogen to be supplied uniform by adjusting the cross-sectional area.

4. Fourth Embodiment

The via having a rectangular cross-sectional shape has been used in the above-mentioned first embodiment. The cross-sectional shape of the via is not limited to a rectangular shape, and may be a circular shape. The solid-state imaging apparatus 200 according to a fourth embodiment is different from that according to the first embodiment in that a via having a circular cross-sectional shape is used.

FIG. 21 is a plan view showing an example of the VSL bonding area 314 and the dummy area 322 in the fourth embodiment of the present disclosure. The vias 423 and 424 in the fourth embodiment are different from those in the first embodiment in that the vias 423 and 424 each have a circular cross-sectional shape. Note that the cross-sectional shape of the via is not limited to a circular shape or a rectangular shape. For example, the cross-sectional shape of the via may be an elliptical shape.

As described above, in accordance with the fourth embodiment of the present disclosure, since the cross-sectional shape of the via is a circular shape, it is possible to make the dark current uniform by supplying hydrogen by way of the circular via.

5. Fifth Embodiment

The dark current of each of the plurality of pixel circuits 260 on the light reception side has been made uniform in the above-mentioned first embodiment. The dark current on the plurality of circuits (e.g., ADCs) on the circuit side is non-uniform in some cases. The solid-state imaging apparatus 200 according to a fifth embodiment is different from that according to the first embodiment in that the via on the circuit side and the dummy pad are connected to each other to make the dark current on the circuit side uniform.

FIG. 22 is an example of a cross-sectional view of the solid-state imaging apparatus 200 according to the fifth embodiment of the present disclosure. The solid-state imaging apparatus 200 according to the fifth embodiment is different from that according to the first embodiment in that the via 424 is not connected to the dummy pad 441 on the light reception side and the via 454 is connected to the dummy pad 442 on the circuit side. Assumption is made that the dark current on the light reception side is uniform even in the case where the via 424 is not connected to the dummy pad 441 on the light reception side.

On the plane opposed to the bonding surface, of both surfaces of the circuit substrate 202, a plurality of circuits such as the subsequent circuits 461 and 462 are arranged as described above. The via 453 connects the subsequent circuit 461 and the electrode pad 432 to each other, and the via 454 connects the subsequent circuit 462 and the dummy pad 442 to each other. The subsequent circuits 461 and 462 are each, for example, an ADC. As a result, it is possible to make the amount of hydrogen to be supplied to each of the subsequent circuit 461 and 462 and the like on the circuit side uniform, and make the amount of dark current on the circuit side uniform.

As described above, in accordance with the fifth embodiment of the present disclosure, since the via 454 on the circuit side connects the subsequent circuit 462 and the dummy pad 442 to each other, it is possible to make the amount of hydrogen to be supplied to each of the plurality of circuits on the circuit side uniform. As a result, the amount of generated dark current becomes uniform, and it is possible to improve the image quality of image data.

6. Sixth Embodiment

The dummy pad on the circuit side has not been connected to the via in the above-mentioned first embodiment. In this configuration, there is a possibility that the amount of supplied hydrogen is insufficient. The solid-state imaging apparatus 200 according to a sixth embodiment is different from that according to the first embodiment in that a via is further connected to the dummy pad on the circuit side to increase the amount of hydrogen to be supplied.

FIG. 23 is an example of a cross-sectional view of the solid-state imaging apparatus 200 according to the sixth embodiment of the present disclosure. The solid-state imaging apparatus 200 according to the sixth embodiment is different from that according to the first embodiment in that the via 454 is connected also to the dummy pad 442 on the circuit side. However, the via 454 is not connected to the power supply circuit 270, and the dummy pads 441 and 442 are not used for electrical connection.

As illustrated in FIG. 23, by connecting a via not only to the dummy pad 441 on the light reception side but also to the dummy pad 442 on the circuit side, it is possible to supply also hydrogen in the circuit substrate 202 to the pixel circuit 260 above the circuit substrate 202. As a result, it is possible to increase the amount of hydrogen to be supplied as compared with the case where a via is connected to only the dummy pad 441 on the light reception side.

Note that the dummy pad 441 is an example of a dummy pad on a light reception side, and the dummy pad 442 is an example of a dummy pad on a circuit side. Further, the via 454 is an example of a fourth via.

As described above, in accordance with the sixth embodiment of the present disclosure, since a via is connected also to the dummy pad 442 on the circuit side, it is possible to increase the amount of hydrogen to be supplied as compared with the case where a via is connected to only the dummy pad 441 on the light reception side.

7. Seventh Embodiment

The via 424 has been directly connected to the dummy pad 441 in the above-mentioned first embodiment. However, hydrogen can be supplied by was of a hollow path because hydrogen vaporizes. The solid-state imaging apparatus 200 according to a seventh embodiment is different from that according to the first embodiment in that hydrogen is supplied by way of a hollow path.

FIG. 24 is an example of a cross-sectional view of the solid-state imaging apparatus 200 according to the seventh embodiment of the present disclosure. The solid-state imaging apparatus 200 according to the seventh embodiment is different from that according to the first embodiment in that the via 424 and the dummy pad 441 are connected to each other by way of a cavity 425 that is a hollow path. In other words, the via 424 connects the bonding surface and the pixel circuit 260 to each other by way of air (medium that carries hydrogen) in the cavity 425 and the dummy pad 441. As a result, it is possible to shorten the length of the via 424 by the amount corresponding to the cavity 425. Note that the cavity 425 can be filled with a filler such as an organic substance as long as the filler is a medium capable of carrying hydrogen.

As described above, in accordance with the seventh embodiment of the present disclosure, since the via 424 connects the bonding surface and the pixel circuit 260 to each other by way of the cavity 425 and the dummy pad 441, it is possible to shorten the length of the via 424 by the amount corresponding to the cavity 425.

8. Eighth Embodiment

Pads have been provided on the bonding surface for each of the pixel circuits 260 and the pads have been bonded to each other in the above-mentioned first embodiment. However, in the case where the accuracy of the bonding position is sufficiently high, it is unnecessary to provide pads. The solid-state imaging apparatus 200 according to an eighth embodiment is different from that according to the first embodiment in that hydrogen is supplied by way of a via that penetrates the bonding surface, which eliminates the necessity to provide pads.

FIG. 25 is an example of a cross-sectional view of the solid-state imaging apparatus 200 according to the eighth embodiment of the present disclosure. In the eighth embodiment, the via 424 on the light reception side is connected to the via 454 on the circuit side without going through a dummy pad. Note that an end of the via 424 is connected to a power source line on the light reception side, but a circuit is not connected to the other of the via 424. This via is not used for electrical connection.

Further, the via 423 on the light reception side is connected to the via 453 on the circuit side without going through an electrode pad.

Since a via is disposed on each of the dummy area 322 and the VSL bonding area 314, it is possible to uniformly supply hydrogen to the plurality of pixel circuits 260 by way of the vias.

As described above, in accordance with the eighth embodiment of the present disclosure, since the via on the light reception side and the via on the circuit side are directly connected to each other, it is possible to make the amount of hydrogen to be supplied uniform without using pads.

9. Ninth Embodiment

The dummy pad 441 and the via 424 have been disposed in the pixel area in which the pixel circuits 260 are disposed in the above-mentioned first embodiment. However, they can be disposed in areas other than the pixel area. The solid-state imaging apparatus 200 according to a ninth embodiment is different from that according to the first embodiment in that the dummy pad 441 and the via 424 are disposed also in the area other than the pixel area.

FIG. 26 is an example of a cross-sectional view of a solid-state imaging apparatus according to a ninth embodiment of the present disclosure. The configuration of the pixel area in the ninth embodiment is similar to that in the first embodiment. As illustrated in FIG. 26, the solid-state imaging apparatus 200 according to the ninth embodiment is different from that according to the first embodiment in that the dummy pads 441 and the via 424 are disposed also in an area other than the pixel area.

As described above, in the ninth embodiment of the present disclosure, the dummy pad 441 and the via 424 are disposed in an area other than the pixel area.

10. Tenth Embodiment

Although the VSL bonding area 314 is disposed in the pixel area in which the pixel circuits 260 are disposed in the above-mentioned first embodiment, the present disclosure is not limited to this configuration. The solid-state imaging apparatus 200 according to the tenth embodiment is different from that according to the first embodiment in that the VSL bonding area 314 is disposed in an area outside the pixel area.

FIG. 27 is a plan view showing an example of the bonding surface of the light reception substrate in the tenth embodiment of the present disclosure. On the bonding surface of the light reception substrate 201 according to the tenth embodiment, power source line/drive line bonding areas 318 and 319, the VSL bonding areas 314 and 315, and the dummy area 321 are provided. Further, with the side of the light reception surface as the upper side, the dummy area 321 is disposed below the pixel array unit 250 (pixel area). The configuration of the bonding surface of the circuit substrate 202 is the same as the bonding surface of the light reception substrate 201.

Further, the VSL bonding areas 314 and 315 are provided outside the pixel area.

As described above, in the tenth embodiment of the present disclosure, the VSL bonding areas 314 and 315 are disposed outside the pixel area.

11. Eleventh Embodiment

AD conversion has been performed for each column in the above-mentioned first embodiment. However, AD conversion can be performed for each area including the plurality of pixel circuits 260. The solid-state imaging apparatus 200 according to an eleventh embodiment is different from that according to the first embodiment in that AD conversion is performed for each area.

FIG. 28 is a diagram showing a configuration of the solid-state imaging apparatus 200 according to the eleventh embodiment of the present disclosure. The embodiment of the present disclosure is applicable to a stacked-type imaging apparatus. The stacked-type imaging apparatus has a configuration in which a chip in which a signal processing circuit is formed is used instead of a support substrate for a pixel part and a pixel part is overlaid on the chip. With such a configuration, it is possible to miniaturize the imaging apparatus.

As shown in FIG. 28, on a light reception substrate 10, pixels 21 are arranged in a matrix and a pixel drive circuit 22 for driving the respective pixels 21 is disposed. On the lower substrate 11, ADCs (A/D Converters) 31 are arranged in matrix at positions corresponding to the pixels 21. In the example shown in FIG. 28, a configuration in which 2×2=4 pixels are used as one block (area) and one ADC 31 processes four pixels 21 corresponding to one block is shown. In such a configuration, the ADCs 31 are operated in parallel, and each ADC 31 performs AD conversion while scanning four pixels.

On the circuit substrate 11, also an output circuit 32, a sense amplifier 33, a V scanning circuit 34, a timing generation circuit 35, and a DAC (D/A Converter) are mounted. The output from the ADC 31 is output to the outside by way of the sense amplifier 33 and the output circuit 32. Processing related to reading from the pixel 21 is executed by the pixel drive circuit 22 and the V scanning circuit 34, and controlled at the timing generated by the timing generation circuit 35. Further, the DAC 36 is a circuit that generates a ramp signal.

The ramp signal is a signal to be supplied to a comparator of the ADC 31. The internal configuration of the ADC 31 will be described with reference to FIG. 29. FIG. 29 is a block diagram showing a configuration of the pixels 21 corresponding to one block (area) and the ADC31. The signal from each of the pixels 21 corresponding to the one block including 2×2=4 pixels is compared with the ramp voltage of the ramp signal by a comparator 51 of the ADC 31.

The ramp voltage is a voltage that gradually decreases from a predetermined voltage. When the ramp voltage starts dropping and the signal from the pixel 21 crosses (when the voltage of the signal from the pixel 21 and the ramp voltage become the same voltage), the output of the comparator 51 is inverted. The output of the comparator 51 is input to a latch circuit 52. A code value indicating the time at that time is input to the latch circuit 52, and a code value when the output of the comparator 51 is inverted is held in the latch circuit 52 and then read from the latch circuit 52.

FIG. 30 is a plan view showing an example of the bonding surface of the light reception substrate in the eleventh embodiment of the present disclosure. On the bonding surface, the same number of pads as the number of pixels is arranged for each block (area). In the case where 2×2 pixels are used as one area, four pads are arranged. One of the four pads is the electrode pad 431 and the other three are the dummy pads 441.

FIG. 31 shows a circuit diagram of an imaging apparatus including the ADC 31. In FIG. 31, the circuits included in the light reception substrate 10 and the circuit substrate 11 shown in FIG. 29 are illustrated. The light reception substrate 10 includes the pixels 21, and the circuit of the pixels 21 has a configuration as shown on the left side of FIG. 31. Now, a configuration in which four pixels share one floating diffusion (FD) will be described as an example.

Photodiodes (PD) 101-1 to 101-4 as photoelectric conversion units are respectively connected to transfer transistors (Trf) 102-1 to 102-4. Hereinafter, in the case where it is not necessary to individually distinguish the photodiodes 101-1 to 101-4, they will be referred to simply as the photodiode 101. Another part will be referred to similarly.

The transfer transistors 102-1 to 102-4 are connected to a floating diffusion (FD) 103. The transfer transistor 102 transfers, to the floating diffusion 103 at the timing when a transfer pulse is given, signal charges that are photoelectrically converted by the photodiode 101 and accumulated.

The floating diffusion 103 functions as a charge-voltage conversion unit that converts signal charges into a voltage signal. A drain electrode and a source electrode of a reset transistor (Rst) 104 are respectively connected to the pixel power source of a power supply voltage Vdd and the floating diffusion 103. Prior to the transfer of signal charges from the photodiode 101 to the floating diffusion 103, the reset transistor 104 applies a reset pulse RST to the gate electrode and resets the voltage of the floating diffusion 103 to a reset voltage.

A gate electrode and a drain electrode of an amplification transistor (Amp) 105 are respectively connected to the floating diffusion 103 and the pixel power source of the power supply voltage Vdd. The amplification transistor 105 outputs, as a reset level, the voltage of the floating diffusion 103 reset by the reset transistor 104, and outputs, as a signal level, the voltage of the floating diffusion 103 after signal charges are transferred by the transfer transistor 102.

The set of the amplification transistor 105 and a load MOS 121 provided on the lower substrate 11 operates as a source follower, and transfers an analog signal representing the voltage of the floating diffusion 103 to the comparator 51 of the lower substrate 11.

The comparator 51 can includes a differential amplifier circuit. The comparator 51 includes a differential transistor pair unit including transistors 141 and 144, a load transistor pair unit that includes transistors 142 and 143 serving as output loads of the differential transistor pair unit and is disposed on the power source side, and a current source unit 145 that supplies a constant operation current and is disposed on the ground (GND) side.

The sources of the transistors 141 and 144 are commonly connected to the drain of the transistor of the current source unit 145. To the drains (output terminals) of the transistors 141 and 144, the drains of the corresponding transistors 142 and 143 of the load transistor pair unit are connected.

The output (drain of the transistor 144 in the illustrated example) of the differential transistor unit is sufficiently amplified through a buffer 146 and then output to the latch circuit 52.

Pixel signals transferred from the pixel 21 are supplied to the gate (input terminal) of the transistor 141, and the ramp signal from a DAC 36 is supplied to the gate (input terminal) of the transistor 144.

The latch circuit 52 includes 10 latch columns 161-1 to 161-10. Codes D0 to D9 (Hereinafter, referred to as the code values D) are respectively input to the latch columns 161-1 to 161-10. The code values D0 to D9 are code values indicating the time at that time.

Each latch column 161 is a dynamic circuit for miniaturization. Further, the output from the comparator 51 is input to the gate of a transistor 171 that turns on and off each latch column 161. In such a latch circuit 52, the code value when the output of the comparator 51 is inverted is held, and then read and output to the sense amplifier 33 (FIG. 1).

In such a configuration, the pixels 21 are arranged on the light reception substrate 10 and the circuit is disposed on the circuit substrate 11. The light reception substrate 10 and the circuit substrate 11 can be bonded to each other by, for example, Cu—Cu bonding. For the Cu—Cu bonding, the technology disclosed in Japanese Patent Application Laid-open No. 2011-54637 filed early by the present applicant can be used.

In the eleventh embodiment of the present disclosure, since AD conversion is performed for each area as described above, it is possible to improve the reading speed of image data as compared with the first embodiment in which AD conversion is performed for each column.

12. Twelfth Embodiment

The solid-state imaging apparatus 200 has had a two-layer stacked structure in which circuits are disposed on the light reception substrate 201 and the circuit substrate 202 in the above-mentioned first embodiment. However, the solid-state imaging apparatus 200 may have a three-layer stacked structure. The solid-state imaging apparatus 200 according to a twelfth embodiment is different from that according to the first embodiment in that the solid-state imaging apparatus 200 has a three-layer stacked structure.

FIG. 32 is an example of a cross-sectional view of the solid-state imaging apparatus 200 according to a twelfth embodiment of the present disclosure. In the twelfth embodiment, a memory substrate 201 is inserted between the light reception substrate 201 and the circuit substrate 202. The dummy pad and the electrode pad are used for Cu—Cu connection between the light reception substrate 201 and the memory substrate 203. Further, a memory that holds image data is disposed on the memory substrate 203.

As described above, in the twelfth embodiment of the present disclosure, a three-layer stacked structure is applied.

13. Thirteenth Embodiment

The solid-state imaging apparatus 200 has had a two-layer stacked structure in which circuits are disposed on the light reception substrate 201 and the circuit substrate 202 in the above-mentioned first embodiment. However, the solid-state imaging apparatus 200 may have a three-layer stacked structure. The solid-state imaging apparatus 200 according to a thirteenth embodiment is different from that according to the first embodiment in that the solid-state imaging apparatus 200 has a three-layer stacked structure.

FIG. 33 is an example of a cross-sectional view of the solid-state imaging apparatus 200 according to the thirteenth embodiment of the present disclosure. In the thirteenth embodiment, a pixel substrate 204 is inserted between the light reception substrate 201 and the circuit substrate 202. The dummy pad and the electrode pad are used for Cu—Cu connection between the pixel substrate 204 and the circuit substrate 202. Further, a photodiode and an optical system above the photodiode, e.g., the photodiode 415, the color filter 413, and the on-chip lens 411, are disposed on the light reception substrate 201. Various transistors other than the photodiode in the pixel circuits 260 are disposed on the pixel substrate 204. The photodiode is connected to a transistor or the like by way of a wiring as illustrated in FIG. 33.

As described above, in the thirteenth embodiment of the present disclosure, a three-layer structure is applied.

14. Fourteenth Embodiment

In the above-mentioned first embodiment, only one vertical drive circuit is disposed in the solid-state imaging apparatus 200. However, more vertical drive circuits can be disposed. The solid-state imaging apparatus 200 according to a fourteenth embodiment of the present disclosure is different from that according to the first embodiment in that a plurality of vertical drive circuits is disposed.

FIG. 34 is an example of a perspective view of the solid-state imaging apparatus 200 according to the fourteenth embodiment of the present disclosure. In the circuit substrate 202 in the fourteenth embodiment, the vertical drive circuits 211 to 214, a plurality of AD units 243, and a plurality of memory units 244 are disposed. Moreover, the AD units 243 and the memory units 244 form pairs of circuit components. As illustrated in FIG. 34, memory unit 244-*a* and AD unit 243-*a* form a circuit component pair. Likewise, an adjacent circuit component pair includes AD unit 243-*b* and memory unit 244-*b*. The memory unit 244-*a* and the AD unit 243-*b* are transposed in the adjacent circuit component pair (i.e. AD unit 243-*b* and memory unit 244-*b*) since the vertical signal lines VSL are required to first connect to the AD unit 243 and then to the memory unit 244. The same structure applies to the AD units 243 and the memory units 244 illustrated in FIGS. 36, 38 and 39 which are discussed below. In the fourteenth embodiment, it is possible that other circuit components such as a control circuit or processing circuit (not shown) are disposed in the circuit substrate 202. Further, the surface between the light reception substrate 201 and the circuit substrate 202 represents a bonding surface. The plan view of the bonding surface is similar to that illustrated in FIG. 4.

A predetermined number of ADCs are disposed in the AD units 243. A predetermined number of memories that hold digital signals from the AD units 243 are disposed the memory units 244. As the memories, SRAM (Static Random Access Memory) or the like is used.

As illustrated in FIG. 34, by disposing the VSL bonding area 314 at the center of the solid-state imaging apparatus 200, it is possible to reduce the difference in capacitance between the end and the center and suppress occurrence of shading. Further, it is also possible to suppress fluctuations in device characteristics. Further, by increasing the number of vertical drive circuits to four, it is possible to perform high-speed driving and complicated driving.

FIG. 35 is a plan view showing another example of the bonding surface of the light reception substrate 201 in the fourteenth embodiment of the present disclosure. As illustrated in FIG. 35, the VSL bonding areas 314 and 315 can be disposed at the center and a dummy area 323 can be disposed between the VSL bonding areas 314 and 315.

FIG. 36 is a perspective view corresponding to FIG. 35.

FIG. 37 is a plan view showing another example of the bonding surface of the light reception substrate 201 in the fourteenth embodiment of the present disclosure. As illustrated in FIG. 37, each of the areas in FIG. 35 can be divided into two. For example, a dummy area 321-1, a VSL bonding area 314-1, a dummy area 323-1, a VSL bonding area 315-1, and a dummy area 322-1 can be disposed in the stated order between drive line bonding areas 311-1 and 311-2. Further, a dummy area 321-2, a VSL bonding area 314-2, a dummy area 323-2, a VSL bonding area 315-2, and a dummy area 322-2 can be disposed in the stated order between drive line bonding areas 312-1 and 312-2.

FIG. 38 is a perspective view corresponding to FIG. 37.

FIG. 39 is another example of a perspective view of the solid-state imaging apparatus according to the fourteenth embodiment of the present disclosure. As illustrated in FIG. 39, two vertical drive circuits can also be disposed.

Figure 40A:
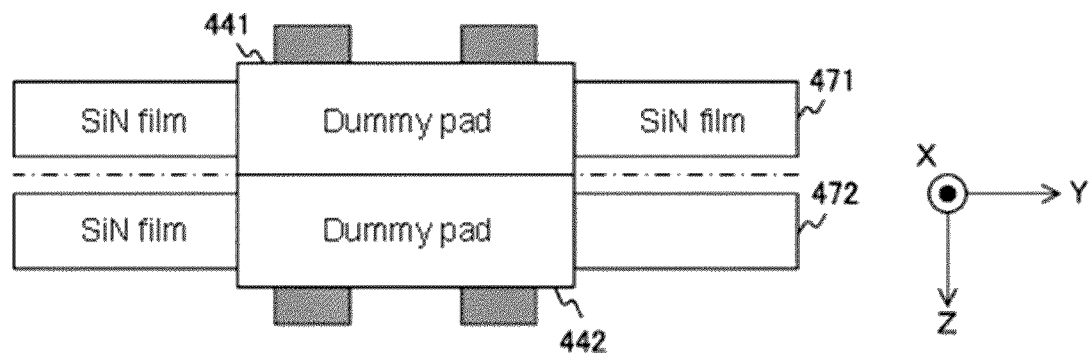
FIG. 40A is an enlarged view showing an example of the vicinity of the bonding surface in an embodiment of the present disclosure.
Figure 40B:
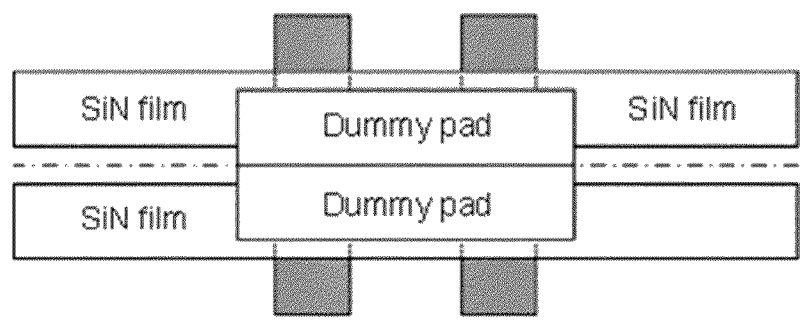
FIG. 40B is an enlarged view showing an example of the vicinity of the bonding surfaces in Comparative Example.

Now, supplementary description will be given of the bonding surface on which the dummy pad in the first embodiment is disposed. FIGS. 40A and 40B are respectively an enlarged view showing an example of the vicinity of the bonding surface on which the dummy pad is disposed in an embodiment of the present disclosure and in a Comparative Example. FIG. 40A is an enlarged view showing an example of the vicinity of the bonding surface in the first embodiment of the present disclosure. FIG. 40B is an enlarged view showing an example of the vicinity of the bonding surfaces in the Comparative Example. As illustrated in FIG. 40A, the dummy pad also is formed by breaking through the SiN film 471 similarly to the electrode pad. The same applies to the second embodiment and subsequent embodiments.

As described above, in the fourteenth embodiment of the present disclosure, since the vertical drive circuits 211 to 214 are disposed, it is possible to perform high-speed driving and complicated driving.

15. Fifteenth Embodiment

In the above-mentioned first embodiment, the electrode pad is disposed in the pixel array unit 250. However, the electrode pad can be disposed in an area other than the pixel array unit 250. The fifteen the embodiment is different from the first embodiment in that an electrode pad is disposed also in an area other than the pixel array unit 250.

FIG. 41 is an example of a cross-sectional view of the solid-state imaging apparatus 200 according to a fifteenth embodiment of the present disclosure. In the solid-state imaging apparatus 200 according to the fifteenth embodiment, the electrode pads 431 and 432 are disposed also in an area other than the pixel array unit 250. For example, a signal line can be drawn out from the pixel array unit 250 to an area outside the pixel array unit 250 for wiring.

As described above, in the fifteenth embodiment of the present disclosure, an electrode pad is disposed in also an area other than the pixel array unit 250.

16. Sixteenth Embodiment

In the above-mentioned first embodiment, the solid-state imaging apparatus 200 has a two-layer stacked structure in which circuits are disposed in the light reception substrate 201 and the circuit substrate 202. However, the solid-state imaging apparatus 200 can also have a three-layer stacked structure. The solid-state imaging apparatus 200 according to the sixteenth embodiment is different from that according to the first embodiment in that it has a three-layer stacked structure.

FIG. 42 is an example of a cross-sectional view of the solid-state imaging apparatus according 200 to a sixteenth embodiment of the present disclosure. In the sixteenth embodiment, a memory substrate 203 is inserted between the light reception substrate 201 and the circuit substrate 202. As illustrated in FIG. 42, the substrates are connected to each other by Cu—Cu bonding and TSV (Through Silicon Via). For example, the circuit substrate 202 and memory substrate 203 are bonded to each other by Cu—Cu bonding. The circuit substrate 202 and the light reception substrate 201 are connected by a TSV 481, and the circuit substrate 202 and memory substrate 203 are connected by a TSV 482.

FIG. 43 is another example of a cross-sectional view of the solid-state imaging apparatus 200 according to the sixteenth embodiment of the present disclosure. As illustrated in FIG. 43, the substrates can be bonded to each other only by Cu—Cu bonding without TSV.

As described above, in the sixteenth embodiment of the present disclosure, a three-layer stacked structure is applied and substrates are bonded to each other by TSV or the like.

17. Application Example to Moving Objects

The technology according to the present disclosure (the present technology) is applicable to various products. For example, the technology according to the present disclosure may be realized as an apparatus mounted on any type of moving objects such as an automobile, an electric car, a hybrid electric vehicle, a motorcycle, a bicycle, personal mobility, an airplane, a drone, a ship, and a robot.

FIG. 44 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other by way of a communication network 12001. In the example depicted in FIG. 44, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 44, an audio speaker 12061, a display section 12062, and an instrument panel 12063 are illustrated as the output device. The display section 12062 may, for example, include at least one of an on-board display and a head-up display.

FIG. 45 is a diagram depicting an example of the installation position of the imaging section 12031.

In FIG. 45, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 45 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver by way of the audio speaker 12061 or the display section 12062, and performs forced deceleration or avoidance steering by way of the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described above. The technology according to the present disclosure is applicable to, for example, the imaging section 12031, of the configurations described above. Specifically, the imaging system 100 shown in FIG. 1 is applicable to the imaging section 12031. By applying the technology according to the present disclosure to the imaging section 12031, noise due to a dark current can be reduced to generate an image that is easier to see. Therefore, it is possible to reduce the fatigue of the driver.

Note that the above-mentioned embodiments each shows an example for embodying the present technology, and the matters in the embodiment and the invention specifying matters in claims have correspondences. Similarly, the invention specifying matters in claims and the matters in the embodiment to which the same names as these have correspondences. However, the present technology is not limited to the embodiments, and can be embodied by making various modifications to the embodiments without departing from the essence of the present technology.

It should be noted that the effects described herein are merely examples and are not limitative, and other effects may be exerted.

It should be noted that the present technology may take the following configurations.

(1) A solid-state imaging device, including:
    a first semiconductor substrate that includes a plurality of photoelectric conversion units and a first wiring layer; and
    a second semiconductor substrate that includes a second wiring layer and a signal processing circuit,
    the first wiring layer including a first electrode pad, a first via to be connected to the first electrode pad, and a second electrode pad,
    the second wiring layer including a third electrode pad, a fourth electrode pad, and a second via to be connected to the third electrode pad,
    the first wiring layer or the second wiring layer including a third via to be connected to one of the second electrode pad and the fourth electrode pad,
    a part of the first electrode pad and a part of the third electrode pad being bonded to each other,
    a part of the second electrode pad and a part of the fourth electrode pad being bonded to each other,
    a pixel signal generated by at least one of the plurality of photoelectric conversion units being transmitted to the signal processing circuit via the first via, the first electrode pad, the third electrode pad, and the second via,
    the second electrode pad or the fourth electrode pad connected to the third via being electrically connected to an arbitrary potential via the third via.

(2) The solid-state imaging device according to (1) above, in which
    the first semiconductor substrate further includes a transfer transistor and a floating diffusion.

(3) The solid-state imaging device according to (2) above, in which
    the first semiconductor substrate further includes a reset transistor and an amplification transistor.

(4) The solid-state imaging device according to any one of (1) to (3) above, in which
    the signal processing circuit includes an analog-digital signal conversion circuit.

(5) The solid-state imaging device according to any one of (1) to (4) above, in which
    the first wiring layer includes the third via to be connected to the second electrode pad, and
    the second wiring layer includes a fourth via to be connected to the fourth electrode pad.

(6) A solid-state imaging apparatus, including:
    a plurality of first circuits provided on a first semiconductor substrate, the first semiconductor substrate being bonded to a second semiconductor substrate on a bonding surface containing an atom that terminates a dangling bond of silicon;
    a second circuit provided on the second semiconductor substrate;
    a first via that connects a part of the plurality of first circuits and a predetermined bonding area on the bonding surface to each other;

a second via that connects the second circuit and the bonding area; and a third via that connects the other first circuits and a dummy area to each other, the dummy area being an area on the bonding surface different from the bonding area.

(7) The solid-state imaging apparatus according to (6) above, in which an electrode pad is disposed on the bonding area, a dummy pad is disposed on the dummy area, the first via connects a part of the plurality of first circuits and the bonding area via the electrode pad, and the third via connects the other first circuits and the dummy area via the dummy pad.

(8) The solid-state imaging apparatus according to (7) above, in which a predetermined number of the first vias are connected to the electrode pad, and the third via includes third vias, the third vias being connected to the dummy pad, the number of the third vias connected to the dummy pad being different from the predetermined number.

(9) The solid-state imaging apparatus according to (7) above, in which a predetermined number of the first vias are connected to the electrode pad, and the third via includes third vias, the third vias being connected to the dummy pad, the number of the third vias connected to the dummy pad being the predetermined number.

(10) The solid-state imaging apparatus according to (7) above, in which the dummy pad includes a first dummy pad to which the third via is not to be connected, and a second dummy pad to which the third vis is to be connected.

(11) The solid-state imaging apparatus according to (7) above, in which the dummy pad includes a first dummy pad and a second dummy pad to which a different number of the third vias are to be connected.

(12) The solid-state imaging apparatus according to any one of (7) to (11) above, in which a cross-sectional area of the third via is different from that of the first via.

(13) The solid-state imaging apparatus according to any one of (7) to (12) above, in which each of the first via and the third via has one of a circular cross-sectional shape and a rectangular cross-sectional shape.

(14) The solid-state imaging apparatus according to any one of (7) to (13) above, in which the third via connects the other first circuits and the dummy area to each other via a predetermined medium that carries the atom and the dummy pad.

(15) The solid-state imaging apparatus according to any one of (7) to (14) above, in which each of the plurality of first circuits is a pixel circuit that generates a predetermined pixel signal, the second circuit processes the pixel signal, and the first semiconductor substrate is a light reception substrate.

(16) The solid-state imaging apparatus according to (15) above, further including a fourth via, the second semiconductor substrate being a circuit substrate, the dummy pad including a light-reception-side dummy pad disposed on the light reception substrate and a circuit-side dummy pad disposed on the circuit substrate, the third via being connected to the light-reception-side dummy pad, and the fourth via being connected to the circuit-side dummy pad.

(17) The solid-state imaging apparatus according to (6) above, in which the second circuit is a pixel circuit that generates a predetermined pixel signal, each of the plurality of first circuits processes the pixel signal, and the first semiconductor substrate is a circuit substrate.

(18) The solid-state imaging apparatus according to (6) above, further including a fourth via to be connected to the third via without going through a dummy pad, the first via and the second via being connected to each other without going through an electrode pad.

(19) The solid-state imaging apparatus according to (6) above, further including:

a silicon nitride film formed on the bonding area and the dummy area;

an electrode pad that penetrates the silicon nitride film being formed in the bonding area; and a dummy pad that penetrates the silicon nitride film being formed in the dummy area.

(20) An imaging system, including:

a plurality of first circuits provided on a first semiconductor substrate, the first semiconductor substrate being bonded to a second semiconductor substrate on a bonding surface containing an atom that terminates a dangling bond of silicon;

a second circuit provided on the second semiconductor substrate;

a first via that connects a part of the plurality of first circuits and a predetermined bonding area on the bonding surface to each other;

a second via that connects the second circuit and the bonding area;

a third via that connects the other first circuits and a dummy area to each other, the dummy area being an area on the bonding surface different from the bonding area; and a signal processing circuit that executes predetermined signal processing on a signal generated by the second circuit.

(21) An image sensor, including:

a first substrate including a plurality of pixels and a plurality of vertical signal lines and a plurality of first wiring layers at one side thereof;

a second substrate including a plurality of second wiring layers at one side thereof, wherein the first and second substrates are secured together between the pluralities of first and second wiring layers;

first pads provided between one of the plurality of first wiring layers and one of the plurality of second wiring layers;

second pads provided between another of the plurality of first wiring layers and another of the plurality of second wiring layers;

first vias connecting the one of the plurality of first wiring layers and the first pad provided on the first substrate;

second vias connecting the one of the plurality of second wiring layers and the first pad provided on the second substrate, wherein the first pad provided on the first substrate and the second pad provided on the second substrate are connected to each other;

third vias connecting the another of the plurality of first wiring layers; and fourth vias connecting the another of the plurality of second wiring layers, wherein at least one of the third vias and the fourth vias connect the second pads and at least one of the another of the plurality of first and second wiring layers together, wherein the first pads provide for electrical connection between the one of the plurality of first wiring layers and the one of the plurality of second wiring layers and the first pads are electrically connected to one of the plurality of vertical signal lines, and wherein the second pads do not electrically connect to the plurality of vertical signal lines.

(22) The image sensor according to (21) above, in which the first substrate further comprises a pixel circuit and the second substrate further comprises a subsequent circuit.

(23) The image sensor according to (22) above, in which pixel signals from the pixel circuit are transferred from the pixel circuit to the subsequent circuit.

(24) The image sensor according to any one of (21) to (22) above, in which the dummy pads are electrically floating.

(25) The image sensor according to any one of (21) to (22) above, in which the dummy pads are connected to a fixed potential.

(26) The image sensor according to any one of (21) to (26) above, in which the first pads are electrode pads and the second pads are dummy pads.

(27) The image sensor according to any one of (21) to (26) above, in which a number of the first and second vias equals a number of the third and fourth vias.

(28) The image sensor according to any one of (21) to (26) above, in which a number of the first and second vias is greater than a number of the third and fourth vias.

(29) The image sensor according to any one of (21) to (26) above, in which a number of the first and second vias is less than a number of the third and fourth vias.

(30) The image sensor according to any one of (21) to (26) above, in which the third vias and the fourth vias connect the second pads and the another of the plurality of first wiring layers and the another of the plurality of second wiring layers together.

(31) The image sensor according to any one of (21) to (26) above, in which the third vias connect the second pads and the another of the plurality of first wiring layers together.

(32) The image sensor according to any one of (21) to (26) above, in which the first and second vias have different sizes than the third and fourth vias.

(33) The image sensor according to any one of (21) to (32) above, in which a cross sectional shape of the first, second, third and fourth vias is either rectangular, circular or elliptical.

(34) The image sensor according to any one of (21) to (26) above, in which a number of the third vias is different than a number of the fourth vias.

(35) An image sensor, including:
a first substrate;
a second substrate provided beneath the first substrate,
wherein the first substrate includes a first bonding area including electrode pads and a second bonding area including dummy pads;
a plurality of first vias extending from the first bonding area of the first substrate and connected to the electrode pads; and
a plurality of second vias extending from the second bonding area of the first substrate and connected to the dummy pads
wherein a number of the plurality of first vias is greater than a number of the plurality of second vias.

(36) The image sensor according to (35) above, in which the electrode pads provide for electrical connection between the first substrate and the second substrate.

(37) The image sensor according to any one of (35) to (36) above, in which the electrode pads are provided within the first bonding area.

(38) The image sensor according to any one of (35) to (37) above, in which the dummy pads are provided within the second bonding area.

(39) The image sensor according to any one of (35) to (38) above, in which the dummy pads are electrically floating.

(40) The image sensor according to any one of (35) to (38) above, in which the dummy pads are connected to a fixed potential.

(41) An image sensor, including:
a first substrate;
a second substrate provided beneath the first substrate,
wherein the first substrate includes a pair of first bonding areas including electrode pads and at least one second bonding area provided between the pair of first bonding areas including dummy pads;
a plurality of first vias extending from the pair of first bonding areas of the first substrate and connecting to the electrode pads; and
a plurality of second vias extending from the at least one second bonding area of the first substrate and connecting to the dummy pads.

(42) The image sensor according to (41) above, in which the at least one second bonding area is provided in a center portion of the first substrate.

(43) The image sensor according to any one of (41) to (42) above, in which another second bonding area is provided above one of the pair of first bonding areas and a further second bonding area is provided below the other of the pair of first bonding areas.

(44) The image sensor according to any one of (41) to (43) above, in which the second substrate includes a plurality of pairs of circuit components.

(45) The image sensor according to (44) above, in which the plurality of pairs of circuit components are arranged such that first and second circuit components in one pair are transposed in another pair of adjacent circuit components.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 imaging system
110 optical unit
120 DSP circuit 130 display unit
140 operation unit
150 bus
160 frame memory
170 storage unit
180 power source unit
200 solid-state imaging apparatus
201 light reception substrate
202 circuit substrate
210 vertical drive circuit
220 timing control circuit
231 north horizontal drive circuit
232 south horizontal drive circuit
241 north column signal processing circuit
242 south column signal processing circuit
250 pixel array unit
260 pixel circuit
261 photoelectric conversion device
262 transfer transistor
263 reset transistor
264 floating diffusion layer
265 amplification transistor
266 selection transistor
270 power supply circuit
280 output unit
311, 312, 311-1, 311-2, 312-1, 312-2 drive line bonding area
313, 316 power line bonding area
314, 315, 314-1, 314-2, 315-1, 315-2 VSL bonding area
321 to 323, 321-1, 321-2, 322-1, 322-2, 323-1, 323-2 dummy area
411, 412 on-chip lens
413, 414 color filter
415, 416 photodiode
417, 418, 455, 456 transistor
420 wiring layer
421, 422, 451, 452 metal wiring
423, 424, 453, 454 via
425 cavity
431, 432 electrode pad
441 to 446 dummy pad
450 wiring layer
461, 462 subsequent circuit
471, 472 SiN (Silicon Nitride) film
12031 imaging section

What is claimed is:

1. An image sensor, comprising:
a first substrate including a plurality of pixels and a plurality of vertical signal lines and a plurality of first wiring layers at one side thereof;
a second substrate including a plurality of second wiring layers at one side thereof,
wherein the first and second substrates are secured together between the pluralities of first and second wiring layers;
first pads provided between one of the plurality of first wiring layers and one of the plurality of second wiring layers;
second pads provided between another of the plurality of first wiring layers and another of the plurality of second wiring layers;
first vias connecting the one of the plurality of first wiring layers and the first pad provided on the first substrate;
second vias connecting the one of the plurality of second wiring layers and the first pad provided on the second substrate,
wherein the first pad provided on the first substrate and the second pad provided on the second substrate are connected to each other;
third vias connecting the another of the plurality of first wiring layers; and
fourth vias connecting the another of the plurality of second wiring layers,
wherein at least one of the third vias and the fourth vias connect the second pads and at least one of the another of the plurality of first and second wiring layers together,
wherein the first pads provide for electrical connection between the one of the plurality of first wiring layers and the one of the plurality of second wiring layers and the first pads are electrically connected to one of the plurality of vertical signal lines, and
wherein the second pads do not electrically connect to the plurality of vertical signal line.

2. The image sensor according to claim 1, wherein the first substrate further comprises a pixel circuit and the second substrate further comprises a subsequent circuit.

3. The image sensor according to claim 2, wherein pixel signals from the pixel circuit are transferred from the pixel circuit to the subsequent circuit.

4. The image sensor according to claim 1, wherein the second pads are electrically floating.

5. The image sensor according to claim 1, wherein the second pads are connected to a fixed potential.

6. The image sensor according to claim 1, wherein the first pads are electrode pads and the second pads are dummy pads.

7. The image sensor according to claim 1, wherein a number of the first and second vias equals a number of the third and fourth vias.

8. The image sensor according to claim 1, wherein a number of the first and second vias is greater than a number of the third and fourth vias.

9. The image sensor according to claim 1, wherein a number of the first and second vias is less than a number of the third and fourth vias.

10. The image sensor according to claim 1, wherein the third vias and the fourth vias connect the second pads and the another of the plurality of first wiring layers and the another of the plurality of second wiring layers together.

11. The image sensor according to claim 1, wherein the third vias connect the second pads and the another of the plurality of first wiring layers together.

12. The image sensor according to claim 1, wherein the first and second vias have different sizes than the third and fourth vias.

13. The image sensor according to claim 1, wherein a cross sectional shape of the first, second, third and fourth vias is either rectangular, circular or elliptical.

14. The image sensor according to claim 1, wherein a number of the third vias is different than a number of the fourth vias.

15. An image sensor, comprising:
a first substrate;
a second substrate provided beneath the first substrate,
wherein the first substrate includes a first bonding area including a plurality of electrode pads and a second bonding area including a plurality of dummy pads;
a plurality of first vias extending from the first bonding area of the first substrate and connecting to each of the plurality of electrode pads; and a plurality of second vias extending from the second bonding area of the first substrate and connecting to each of the plurality of dummy pads, wherein a number of the plurality of first vias is greater than a number of the plurality of second vias for each of the plurality of electrode pads and each of the plurality of dummy pads.

16. The image sensor according to claim 15, wherein the plurality of electrode pads provide for electrical connection between the first substrate and the second substrate.

17. The image sensor according to claim 15, wherein the plurality of electrode pads are provided within the first bonding area.

18. The image sensor according to claim 15, wherein the plurality of dummy pads are provided within the second bonding area.

19. The image sensor according to claim 15, wherein the plurality of dummy pads are electrically floating.

20. The image sensor according to claim 15, wherein the plurality of dummy pads are connected to a fixed potential.

21. An image sensor, comprising:

a first substrate;

a second substrate provided beneath the first substrate, wherein the first substrate includes a pair of first bonding areas including electrode pads and at least one second bonding area provided between the pair of first bonding areas including dummy pads;

a plurality of first vias extending from the pair of first bonding areas of the first substrate and connecting to the electrode pads; and a plurality of second vias extending from the at least one second bonding area of the first substrate and connecting to the dummy pads, wherein the second substrate includes a plurality of pairs of circuit components and wherein the plurality of pairs of circuit components are arranged such that first and second circuit components in one pair are transposed in another pair of adjacent circuit components.

22. The image sensor according to claim 21, wherein the at least one second bonding area is provided in a center portion of the first substrate.

23. The image sensor according to claim 21, further comprising another second bonding area provided above one of the pair of first bonding areas and a further second bonding area provided below the other of the pair of first bonding areas.

* * * * *